US007672164B2

(12) United States Patent
Hasegawa et al.

(10) Patent No.: US 7,672,164 B2
(45) Date of Patent: Mar. 2, 2010

(54) SEMICONDUCTOR INTEGRATED CIRCUIT DEVICE WITH A STACKED GATE INCLUDING A FLOATING GATE AND A CONTROL GATE

(75) Inventors: Takehiro Hasegawa, Yokohama (JP); Akira Umezawa, Tokyo (JP); Koji Sakui, Tokyo (JP); Fumitaka Arai, Yokohama (JP); Ryo Mitani, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 12/027,744

(22) Filed: Feb. 7, 2008

(65) Prior Publication Data

US 2008/0212373 A1    Sep. 4, 2008

Related U.S. Application Data

(62) Division of application No. 11/083,156, filed on Mar. 18, 2005, now Pat. No. 7,332,766.

(30) Foreign Application Priority Data

Mar. 19, 2004    (JP)    ............................. 2004-080811

(51) Int. Cl.
*G11C 16/04*    (2006.01)
(52) U.S. Cl. ............................. 365/185.11; 365/185.17; 365/185.23; 365/185.28; 365/185.29
(58) Field of Classification Search ............ 365/185.11, 365/185.17, 185.23, 185.28, 185.29
See application file for complete search history.

(56) References Cited

U.S. PATENT DOCUMENTS

| 6,512,253 B2 | 1/2003 | Watanabe et al. |
| 6,667,511 B1 | 12/2003 | Fang |
| 6,711,058 B1 * | 3/2004 | Hirano ................... 365/185.11 |

(Continued)

OTHER PUBLICATIONS

Ton Ditewig, et al., "An Embedded 1.2V-Read Flash Memory Module in a 0.18 μm Logic Process", 2001 International Solid-State Circuits Conference, Digest of Technical Papers, ISSCC 2001, Session 2, Non-Volatile Memories, 2.4, Feb. 2001, pp. 34-35 and 425.

(Continued)

*Primary Examiner*—Hoai V Ho
(74) *Attorney, Agent, or Firm*—Oblon, Spivak, McClelland, Maier & Neustadt, L.L.P.

(57)    ABSTRACT

A semiconductor integrated circuit device includes first and second nonvolatile semiconductor memories. The first memory has first and second select transistors and first memory cell transistors. The first memory cell transistor has a first floating gate on a first gate insulating film and a first control gate on a first inter-gate insulating film. The second memory has a third select transistor and a second memory cell transistor. The second memory cell transistor has a second floating gate on a second gate insulating film and a second control gate on a second inter-gate insulating film. The first and second gate insulating films have the same film thickness. The first and second floating gates have the same film thickness. The first and second inter-gate insulating films have the same film thickness. The first and second control gates have the same film thickness.

17 Claims, 54 Drawing Sheets

U.S. PATENT DOCUMENTS

| | | | |
|---|---|---|---|
| 6,914,288 | B2 | 7/2005 | Itou et al. |
| 7,099,200 | B2 | 8/2006 | Sakui |
| 2001/0055223 | A1* | 12/2001 | Iwahashi ............... 365/185.17 |
| 2003/0095448 | A1 | 5/2003 | Ichige et al. |
| 2004/0240273 | A1 | 12/2004 | Sakui |
| 2007/0001212 | A1 | 1/2007 | Lee et al. |

OTHER PUBLICATIONS

Kenichi Imamiya, et al., "A125-mm$^2$ 1-Gb NAND Flash Memory With 10-MByte/s Program Speed", IEEE Journal of Solid-State Circuits, vol. 37, No. 11, Nov. 2002, pp. 1493-1501.

Wei-Hua Liu, et al., "A 2-Transistor Source-select (2TS) Flash EEPROM for 1.8V-Only Applications", Non-Volatile Semiconductor Memory Workshop 4.1, 1997, pp. 1-3.

\* cited by examiner

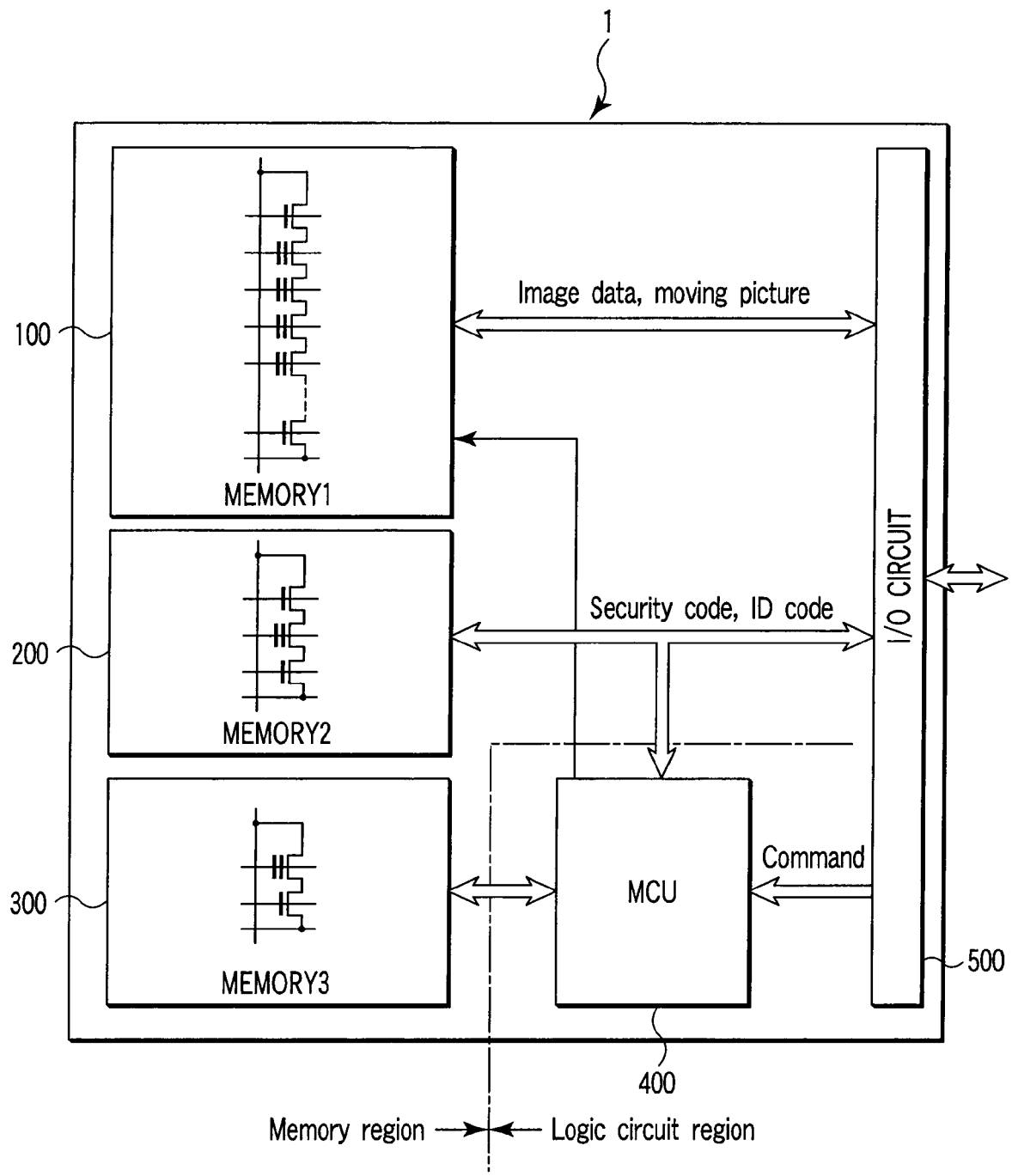
F I G. 1

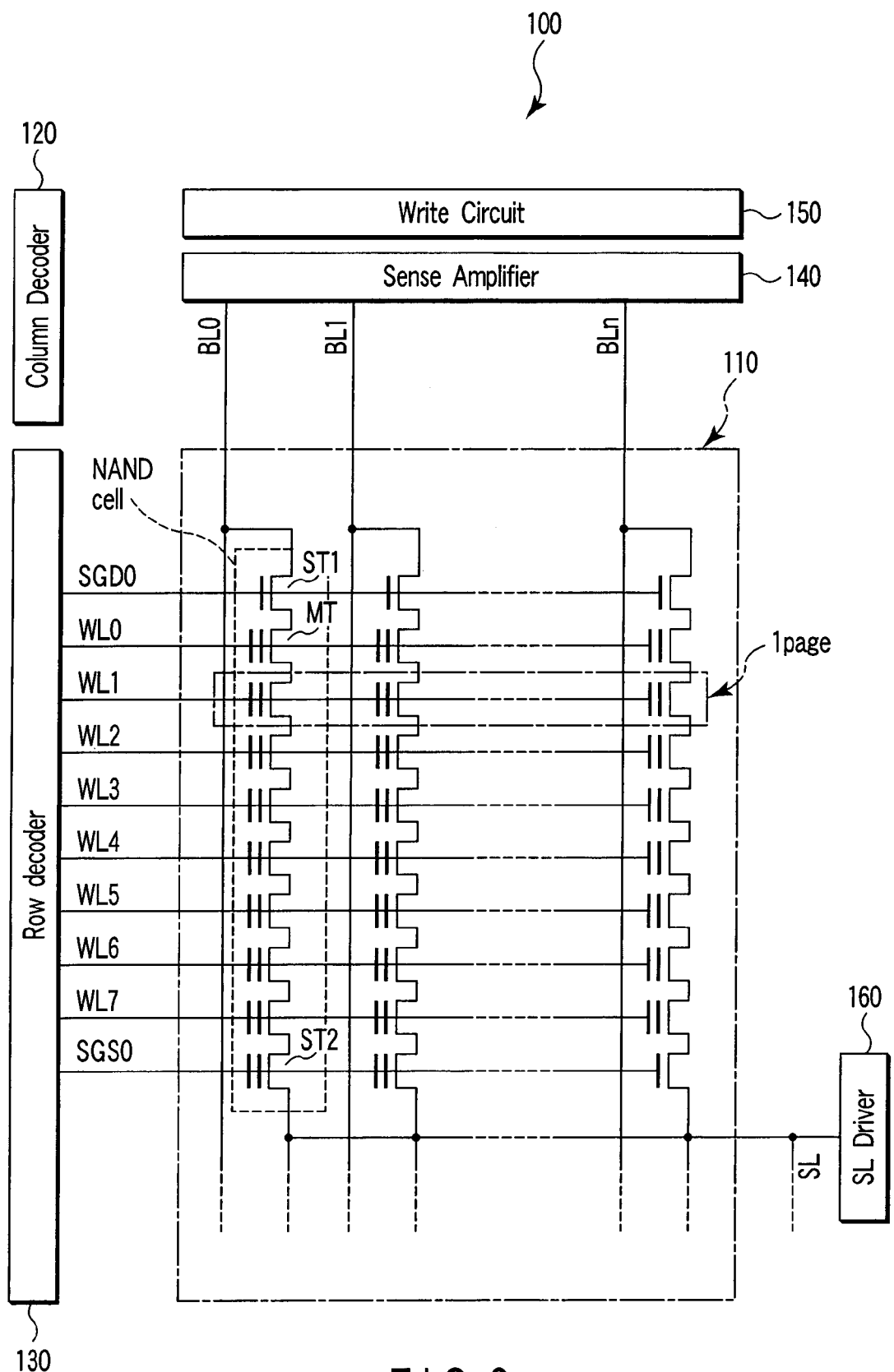
F I G. 2

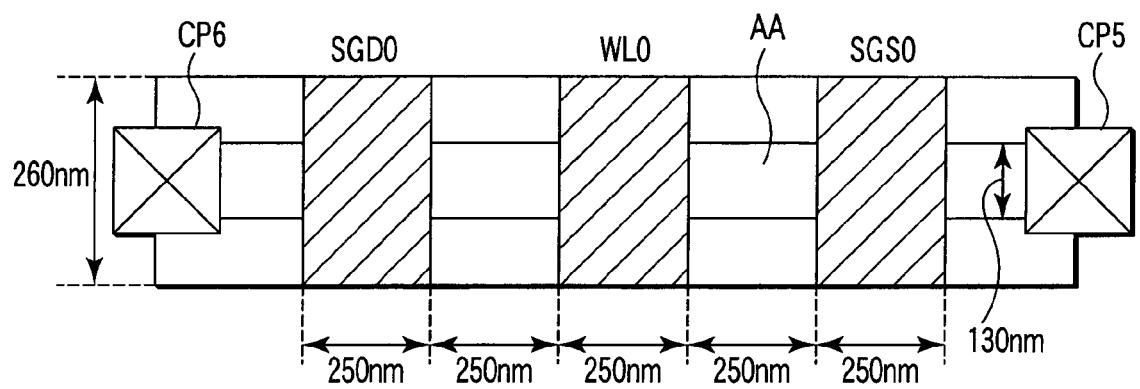
F I G. 12
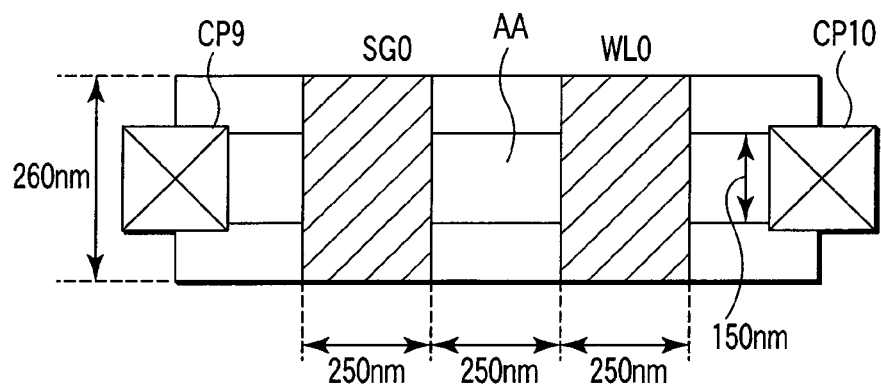
F I G. 13

F I G. 15  WRITE OPERATION

FIG. 16  ERASE OPERATION

FIG. 17   READ OPERATION

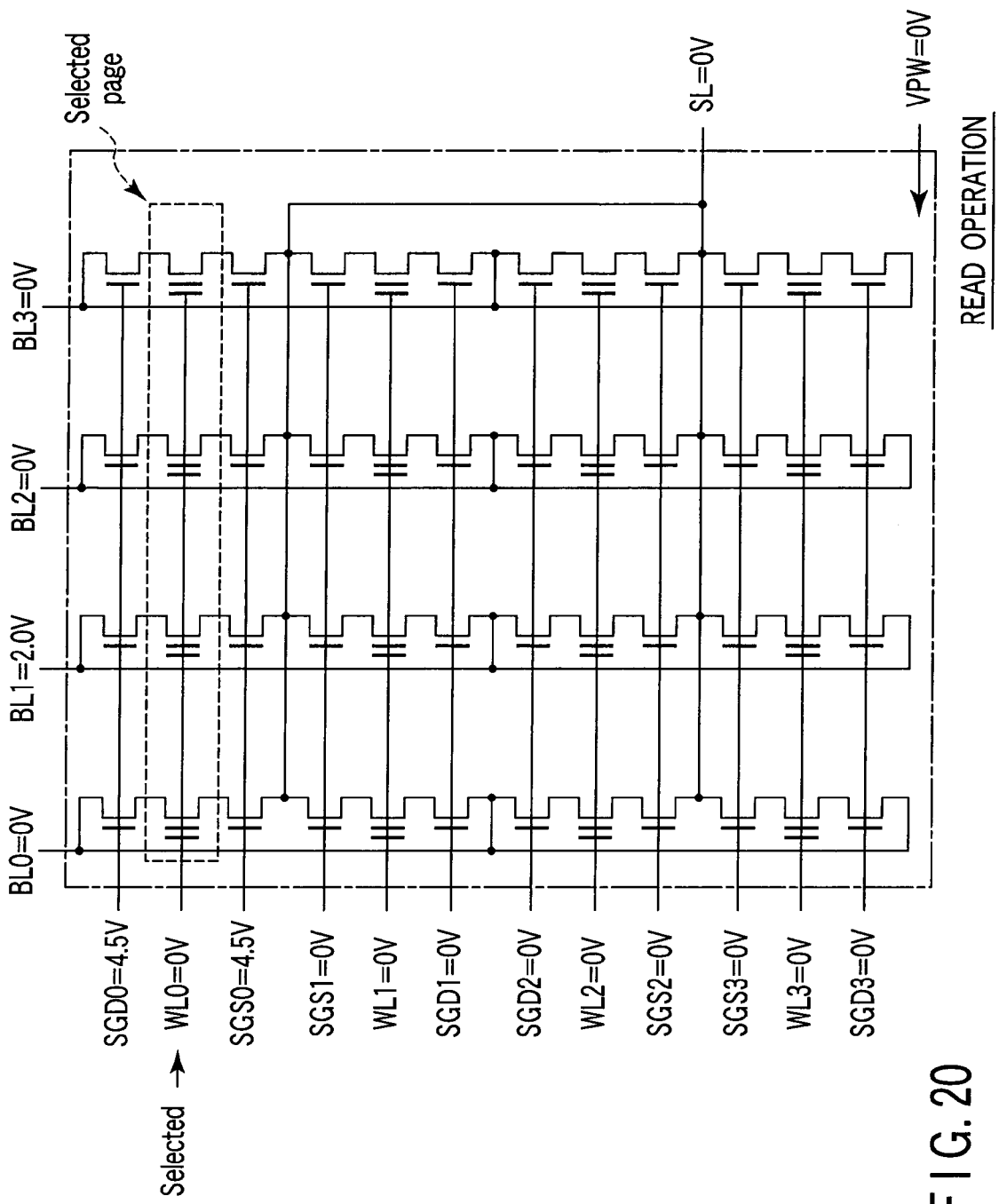
F I G. 20

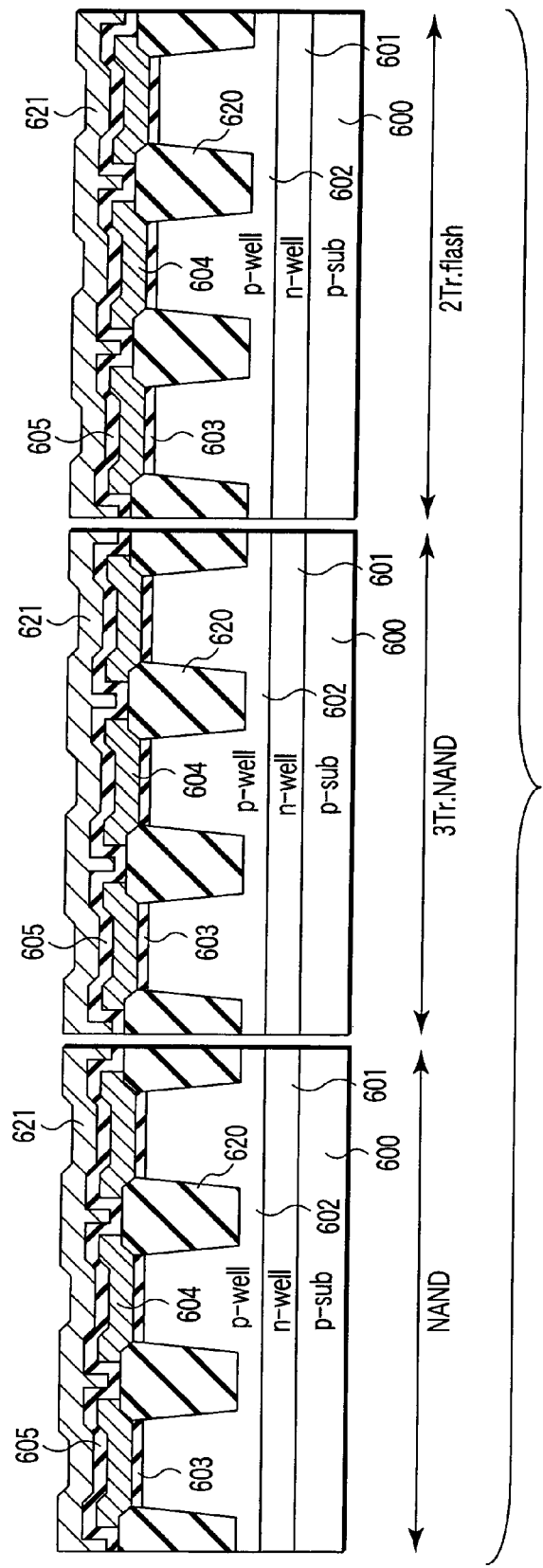
F I G. 29

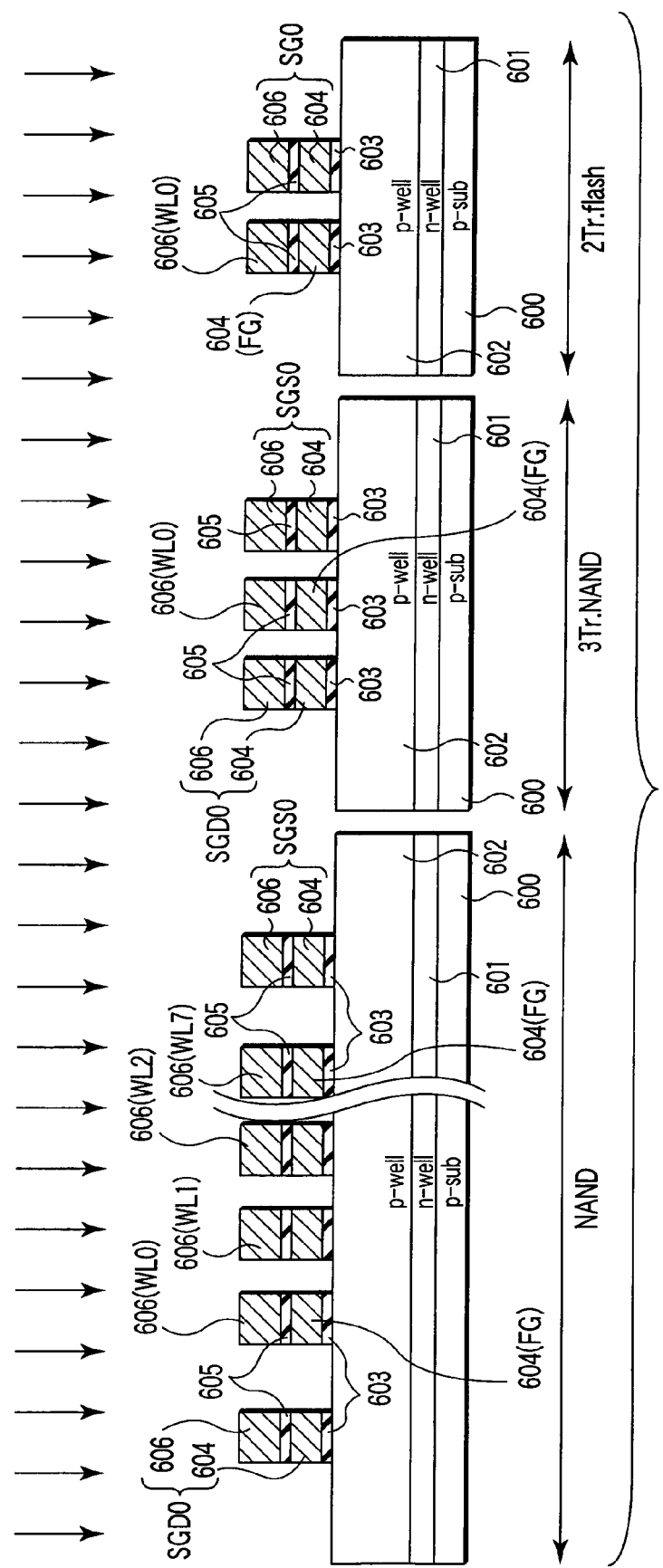
F I G. 32

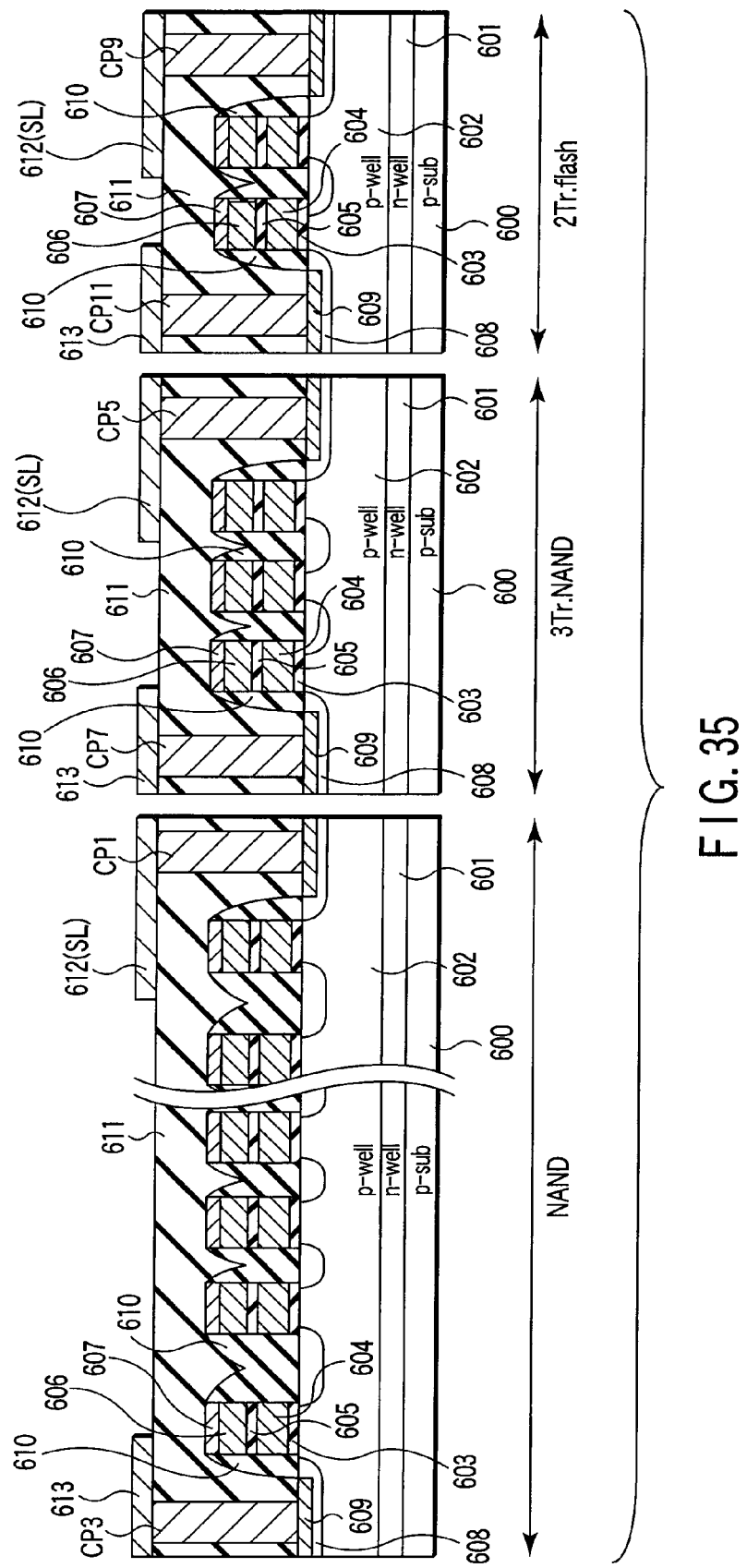
F I G. 35

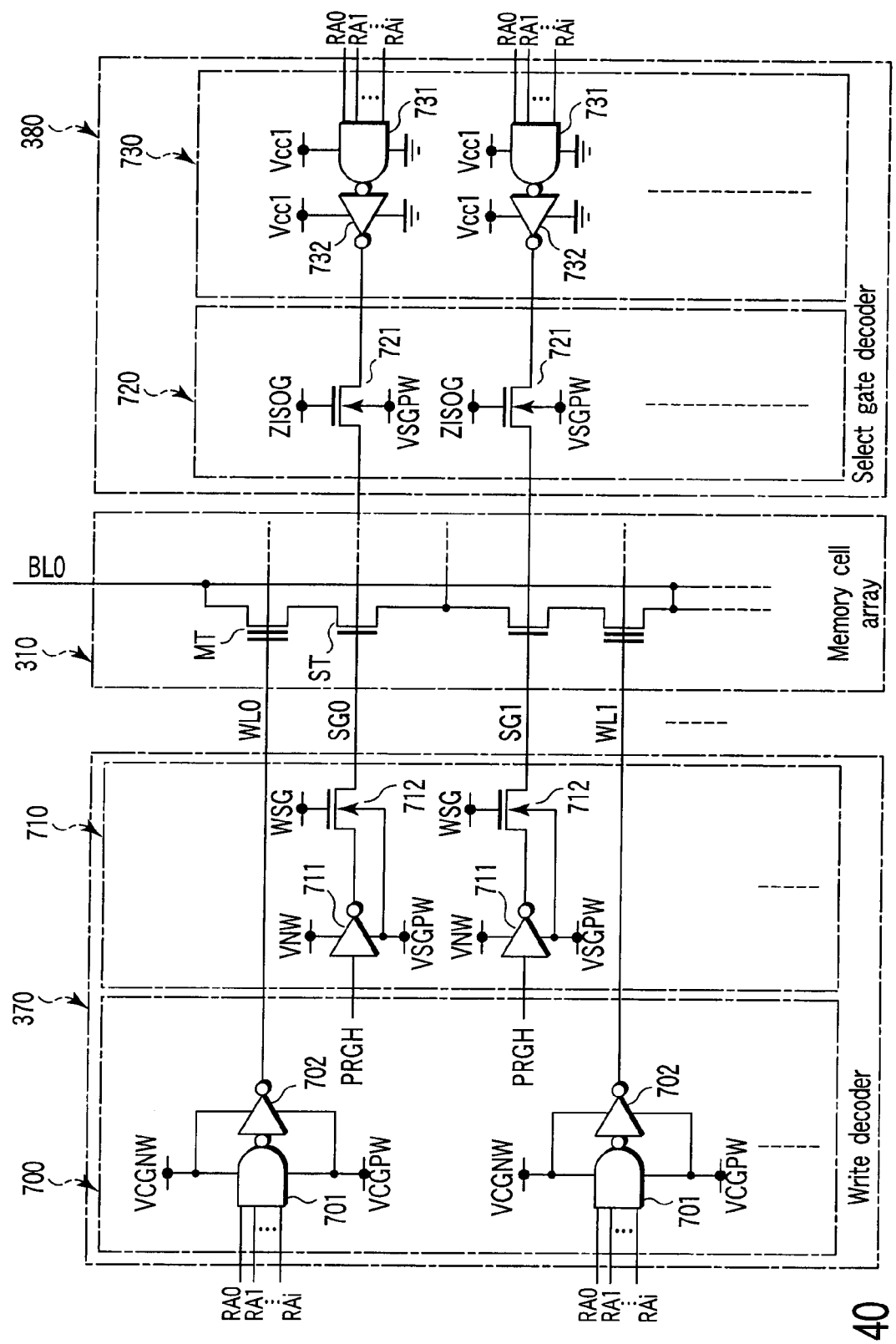
F I G. 40

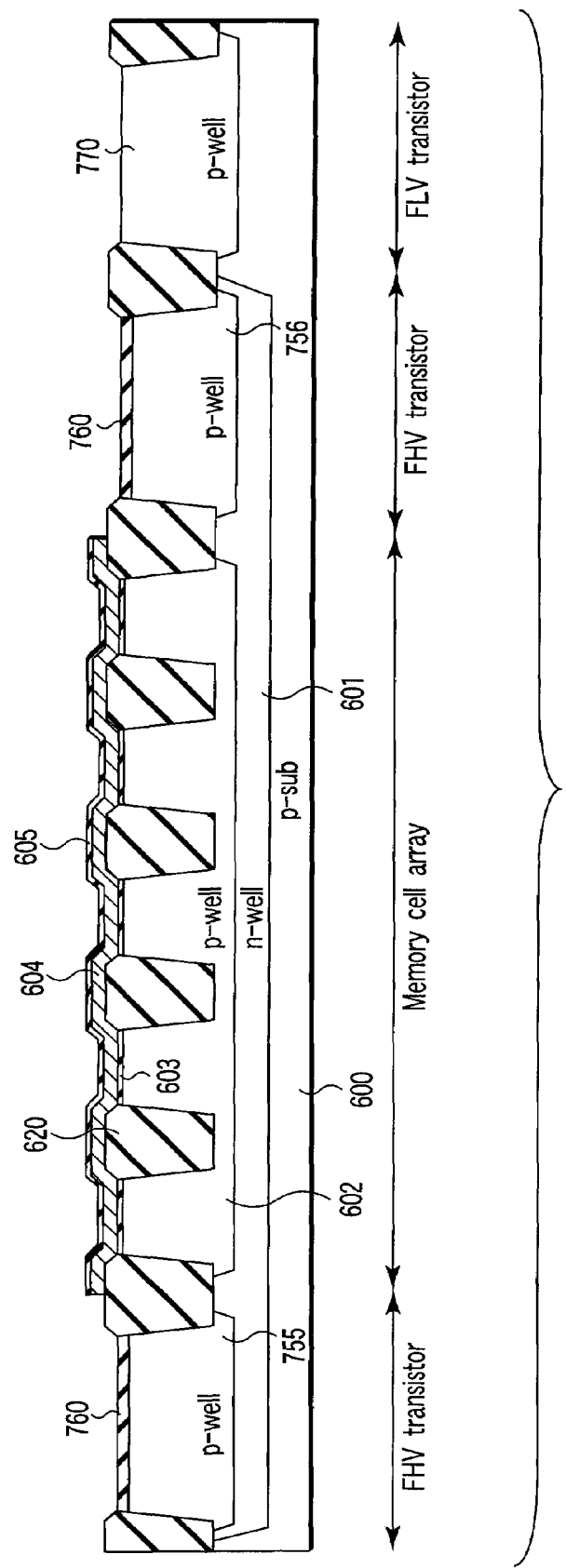
F I G. 44

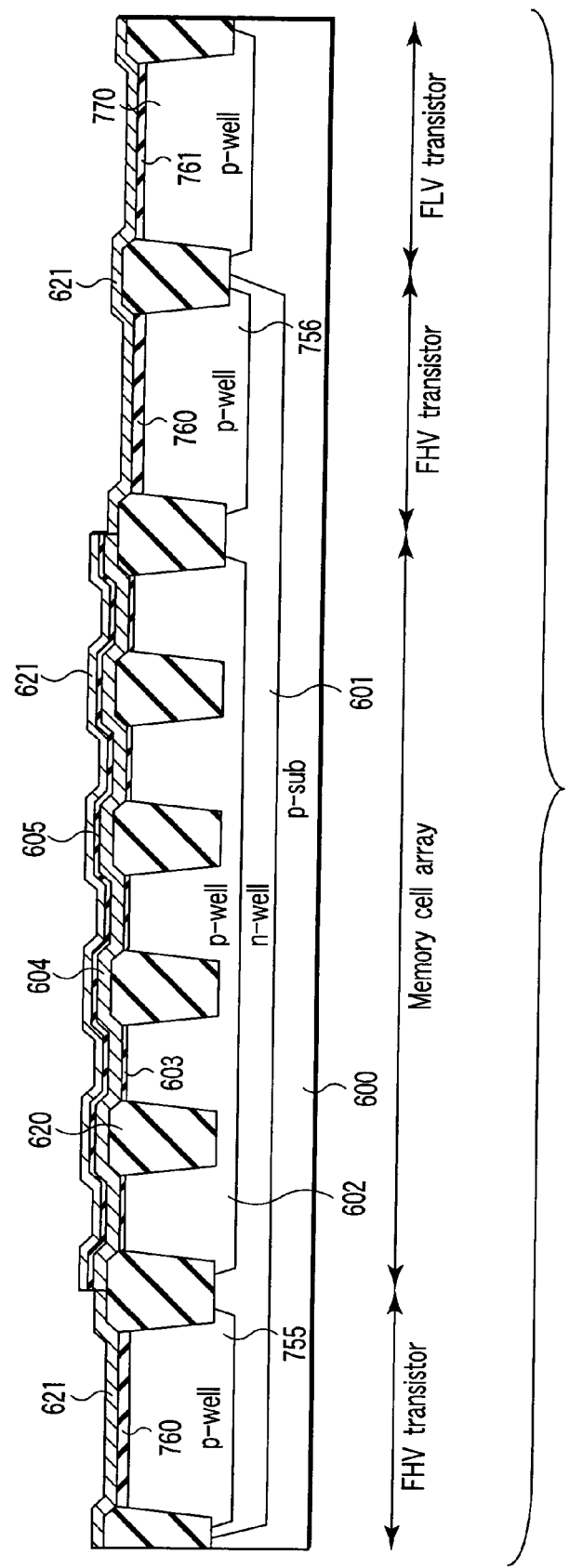
F I G. 46

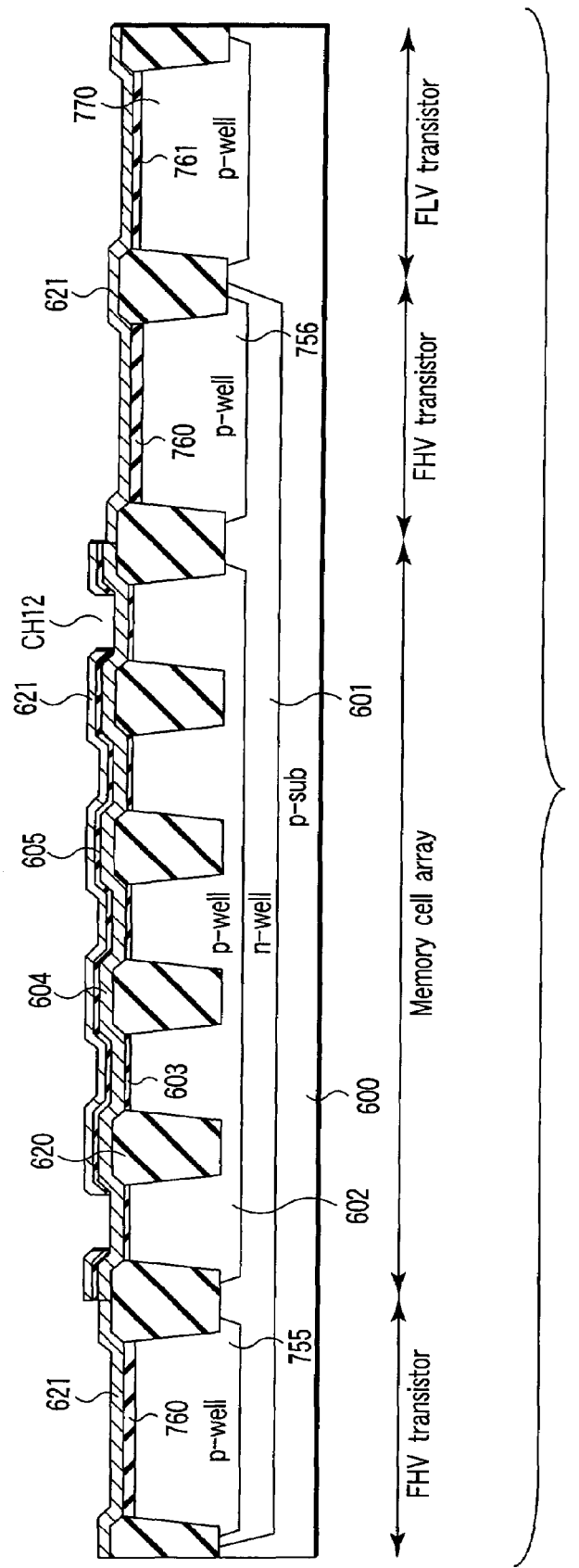
F I G. 47

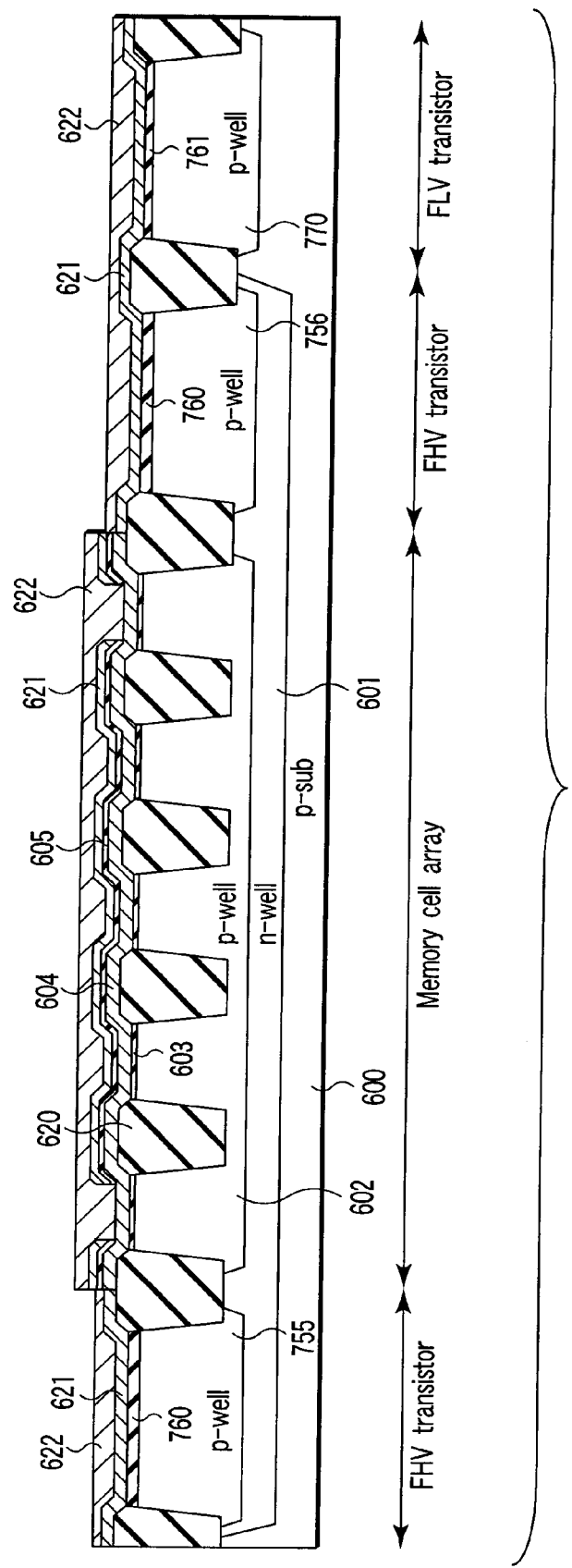
F I G. 48

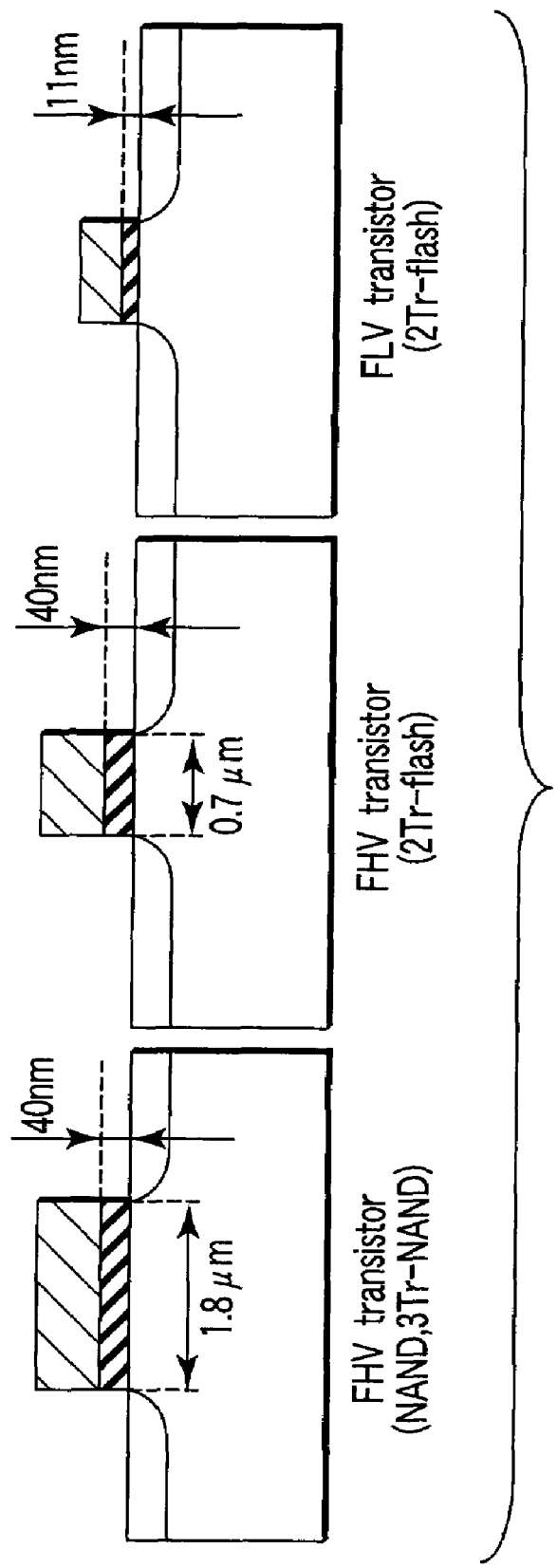
F I G. 50

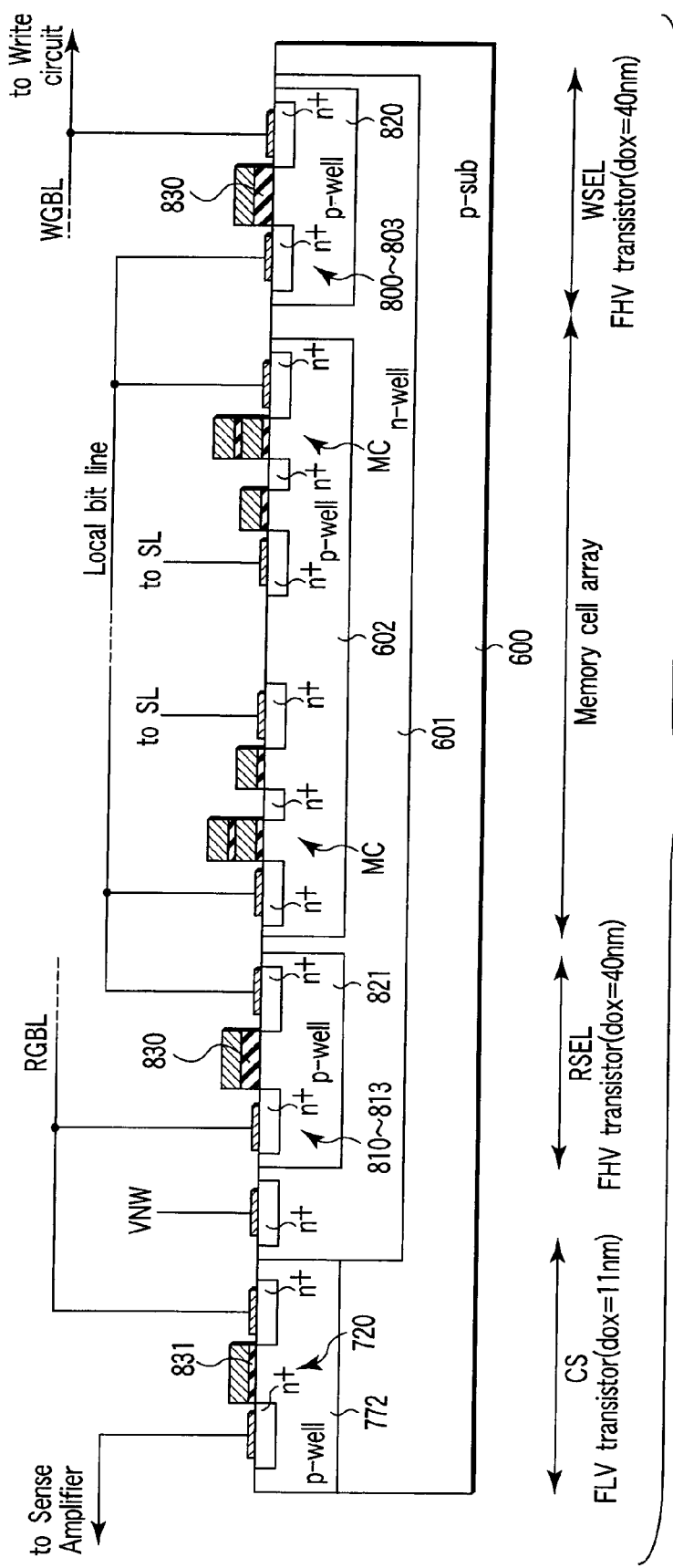
F I G. 52

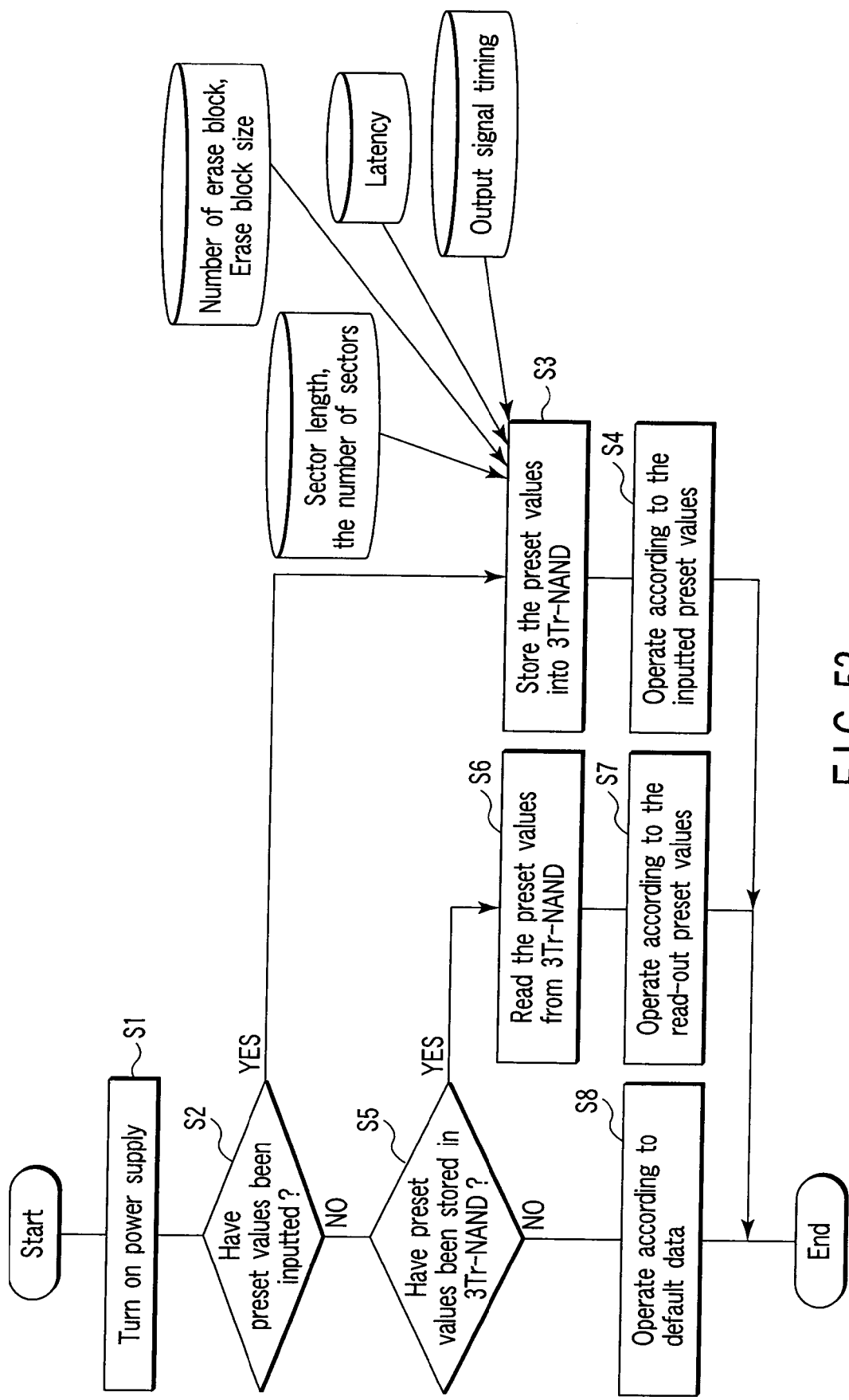
F I G. 53

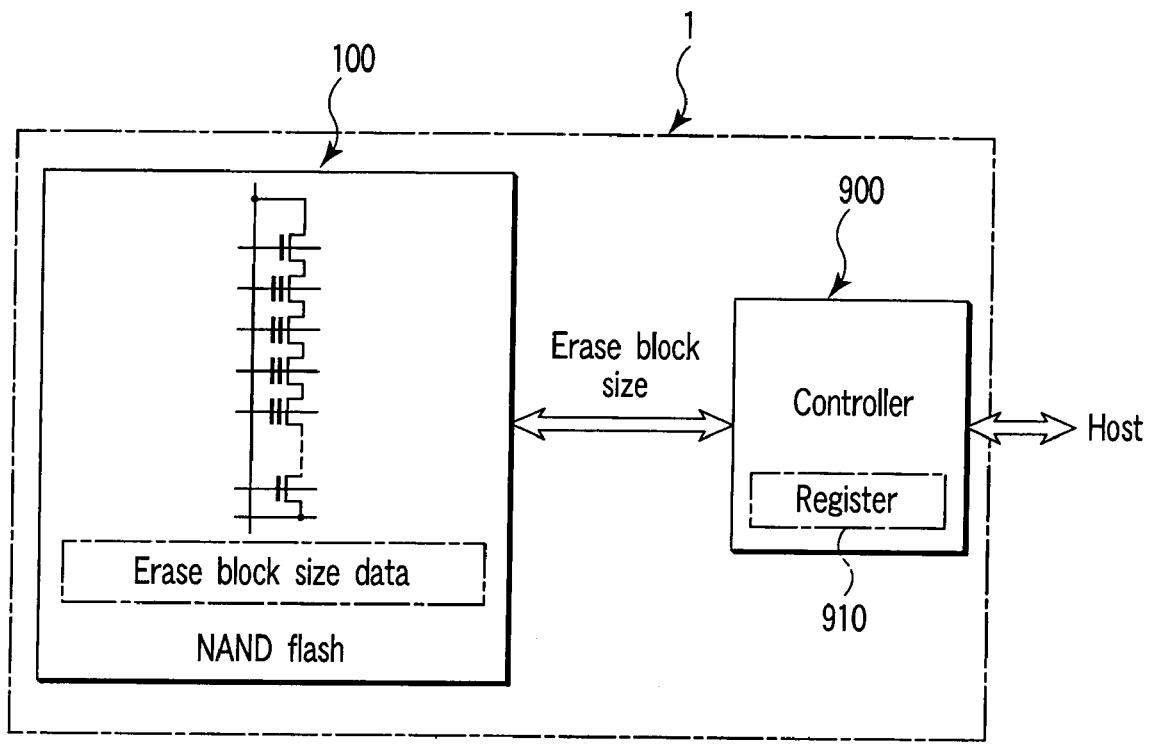
F I G. 54
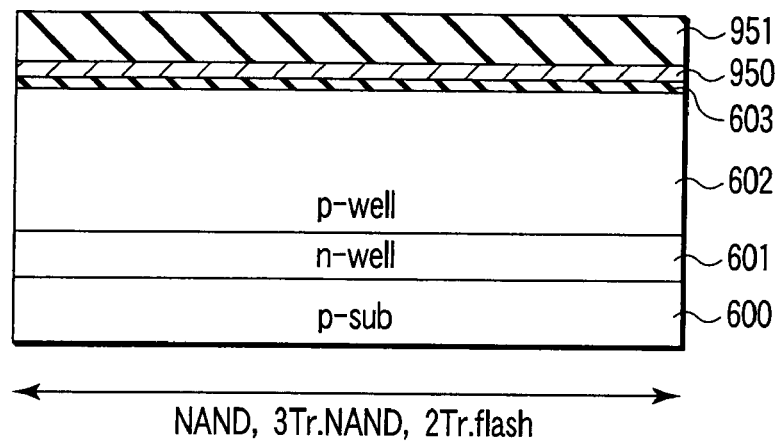
F I G. 55

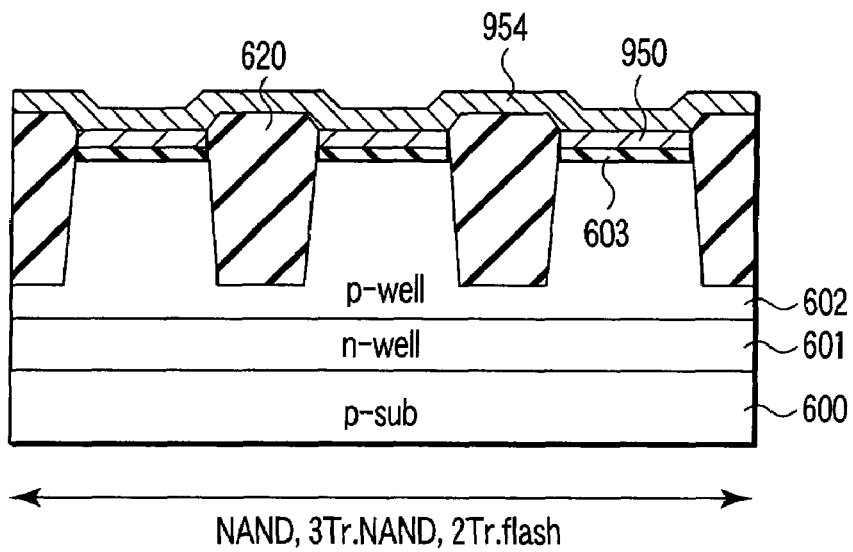
F I G. 59
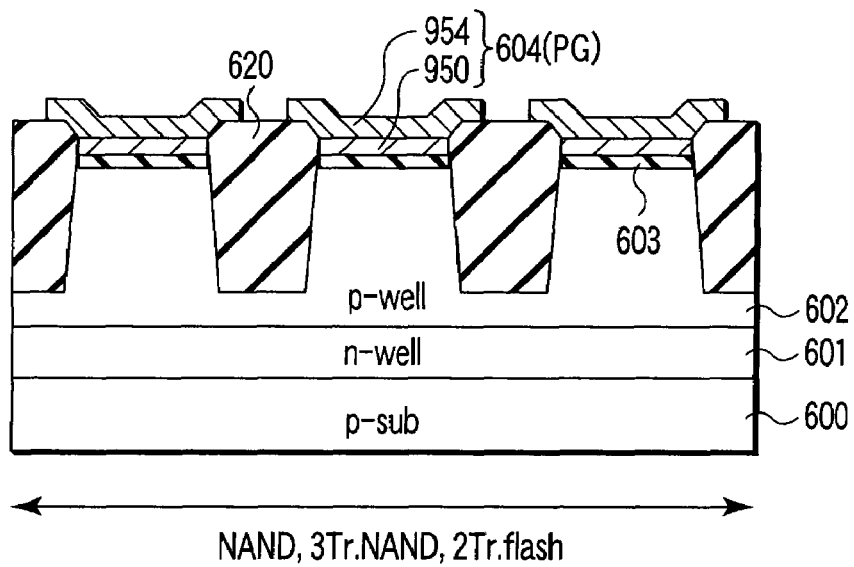
F I G. 60

US 7,672,164 B2

SEMICONDUCTOR INTEGRATED CIRCUIT DEVICE WITH A STACKED GATE INCLUDING A FLOATING GATE AND A CONTROL GATE

CROSS-REFERENCE TO RELATED APPLICATIONS

This application is a division of and claims the benefit of priority from U.S. application Ser. No. 11/083,156, filed Mar. 18, 2005, now U.S. Pat. No. 7,332,766, and claims the benefit of priority from the prior Japanese Patent Application No. 2004-080811, filed Mar. 19, 2004, the entire contents of both which are incorporated herein by reference.

BACKGROUND OF THE INVENTION

1. Field of the Invention

This invention relates to a semiconductor integrated circuit device. More particularly, this invention relates to a semiconductor integrated circuit device which has a nonvolatile semiconductor memory device and a logic circuit formed on a single semiconductor substrate.

2. Description of the Related Art

A NAND flash memory has been known as a data storage memory for use in a digital camera or the like. A NAND flash memory has been described in, for example, Imamiya K., et al., "A 125-mm/sup 2/1-Gb NAND Flash Memory With 10-Mbytes/s Program Speed," IEEE Journal of Solid-State Circuits, Vol. 37, No. 11, November, 2002, pp. 1493-1501. A NAND flash memory uses FN (Fowler-Nordheim) tunneling to write and erase data.

Another known flash memory is a NOR flash memory which writes and erases data by using FN tunneling. A NOR flash memory has been written in, for example, Ditewig T., et al., "An Embedded 1.2-V Read Flash Memory Module in a 0.18-µm Logic Process," Solid-State Circuits Conference, 2001 Digest of Technical Papers ISSCC. 2001 IEEE International 5-7, February, 2001, pp. 34-35, 425. Unlike a flash memory which exchanges electrons using hot electrons, the NOR flash memory described in the reference is such that a memory cell has one memory cell transistor and two select transistors. Hereinafter, this type of flash memory is referred to as a 3Tr-NAND flash memory.

Furthermore, in recent years, a flash memory combining the features of the NOR flash memory and the NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type has memory cells, each including one memory cell transistor and one select transistor. Hereinafter, this type of flash memory is referred to as a 2Tr flash memory.

BRIEF SUMMARY OF THE INVENTION

A semiconductor integrated circuit device according to an aspect of the present invention includes: a first nonvolatile semiconductor memory which includes memory cells arranged in a matrix, each memory cell including a first and a second select transistor and a plurality of first memory cell transistors which have current paths connected in series between the first and second select transistors, each of the first memory cell transistors having a first stacked gate including a first floating gate formed on a semiconductor substrate with a first gate insulating film interposed therebetween and a first control gate formed on the first floating gate with a first inter-gate insulating film interposed therebetween; and a second nonvolatile semiconductor memory which includes memory cells arranged in a matrix, each memory cell including a third select transistor and a second memory cell transistor which has a current path connected to a current path of the third transistor in series, the second memory cell transistors having a second stacked gate including a second floating gate formed on the semiconductor substrate with a second gate insulating film interposed therebetween and a second control gate formed on the second floating gate with a second inter-gate insulating film interposed therebetween, the first and second gate insulating films having the same film thickness, the first and second floating gates having the same film thickness, the first and second inter-gate insulating films having the same film thickness, and the first and second control gates having the same film thickness.

BRIEF DESCRIPTION OF THE SEVERAL VIEWS OF THE DRAWING

FIG. 1 is a block diagram of a system LSI according to a first embodiment of the present invention;

FIG. 2 is a block diagram of a NAND flash memory according to the first embodiment;

FIG. 12 is a plan view of a memory cell of a 3Tr-NAND flash memory according to the first embodiment;

FIG. 13 is a plan view of a memory cell of a 2Tr flash memory according to the first embodiment;

FIG. 20 is a circuit diagram of a memory cell array included in a 3Tr-NAND flash memory according to the first embodiment, showing a read operation;

FIGS. 24 to 35 are sectional views showing a first to a twelfth manufacturing process of a NAND flash memory, a 3Tr-NAND flash memory, and a 2Tr flash memory according to the first embodiment;

FIG. 40 is a circuit diagram of a memory cell array, a write decoder, and a select gate decoder according to the third embodiment;

FIGS. 42 to 49 are sectional views showing a first to an eighth manufacturing process of a 2Tr flash memory according to the third embodiment;

FIG. 50 is a sectional view of a MOS transistor included in a system LSI according to the third embodiment;

FIG. 52 is a sectional view of a 2Tr flash memory according to the fourth embodiment;

FIG. 53 is a flowchart for the operation of a system LSI according to a fifth embodiment of the present invention, immediately after the power supply is turned on;

FIG. 54 is a block diagram of a semiconductor product including a NAND flash memory according to a modification of the fifth embodiment; and FIGS. 55 to 60 are sectional views showing a first to a sixth manufacturing processes of a NAND flash memory, a 3Tr-NAND flash memory, and a 2Tr-NAND flash memory according to modifications of the first to fifth embodiments of the present invention.

DETAILED DESCRIPTION OF THE INVENTION

Figure 3:
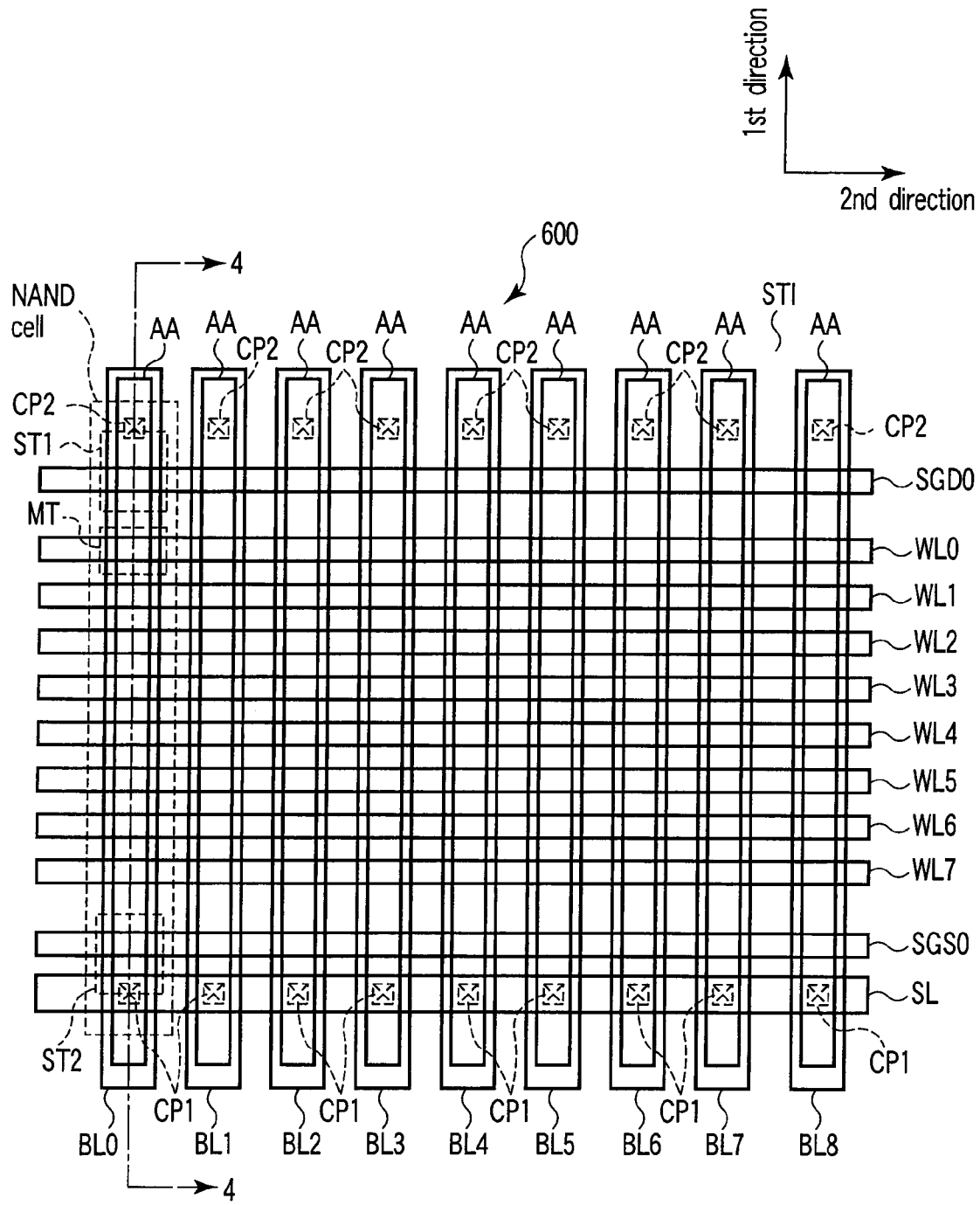
FIG. 3 is a plan view of a memory cell array of a NAND flash memory according to the first embodiment.

A semiconductor integrated circuit device according to a first embodiment of the present invention will be explained by reference to FIG. 1. FIG. 1 is a block diagram of a system LSI according to the first embodiment.

As shown in FIG. 1, a system LSI 1 comprises a NAND flash memory 100, a 3Tr-NAND flash memory 200, a 2Tr flash memory 300, an MCU 400, and an I/O circuit 500 formed on a same semiconductor substrate.

The NAND flash memory 100 is used as a storage memory for storing image data or video data.

The 3Tr-NAND flash memory 200 holds an ID code for accessing the LSI 1 or a security code.

The 2Tr flash memory 300 holds program data for the MCU 400 to operate.

The MCU 400 does processing on the basis of the program read from the 2Tr flash memory 300, in response to various commands externally inputted. At this time, the MCU 400 accesses the 2Tr flash memory 300 directly without intervention of an SRAM (Static Random Access Memory) or the like. The processing done by the MCU 400 includes the compression or decompression of the data inputted to the NAND flash memory 100 and control of an external device. In addition, the MCU 400 reads specific data from the 3Tr-NAND flash memory 200, when the data held in the NAND flash memory is accessed from the outside. Then, the MCU 400 checks the read-out data against the externally inputted ID code or security data. If they coincide with each other, the MCU 400 permits access to the NAND flash memory 100. When access to the NAND flash memory 100 is permitted, the data in the NAND flash memory 100 is accessed from the outside (host). Specifically, the MCU 400 triggers the NAND flash memory 100 in response to the command received from the outside, thereby reading (writing) the data.

The I/O circuit 500 controls the receiving/transmitting of signals between the LSI 1 and the outside.

Next, the configuration of three semiconductor memories 100, 200, 300 included in the LSI 1 will be explained in detail below.

<NAND Flash Memory>

The configuration of the NAND flash memory 100 will be explained by reference to FIG. 2. FIG. 2 is a block diagram of a NAND flash memory.

As shown in FIG. 2, the NAND flash memory 100 comprises a memory cell array 110, a column decoder 120, a row decoder 130, a sense amplifier 140, a write circuit 150, and a source line driver 160.

The memory cell array 110 has a plurality of NAND cells arranged in a matrix. Each of the NAND cells includes eight memory cell transistors MTs and select transistors ST1, ST2. A memory cell transistor MT has a stacked-gate structure that includes a floating gate formed on a semiconductor substrate with a gate insulating film interposed therebetween and a control gate formed above the floating gate with an inter-gate insulating film interposed therebetween. The number of memory cell transistors MTs is not limited to 8 and may be 16 or 32. The number is illustrative and not restrictive. The adjoining ones of the memory cell transistors MTs share their source and drain. They are arranged in such a manner that their current paths are connected in series between the select transistors ST1, ST2. The drain region at one end of the series connection of the memory cell transistors MTs is connected to the source region of the select transistor ST1. The source region at the other end is connected to the drain region of the select transistor ST2.

The control gates of the memory cell transistors MTs in a same row are connected commonly to any one of word lines WL0 to WLm. The gates of the select transistors ST1, ST2 in the same row are connected commonly to select gate lines SGD, SGS, respectively. The drain of the select transistor ST1 in a same column is connected commonly to any one of bit lines BL0 to BLn. The sources of the select transistors ST2 are connected commonly to a source line SL and then connected to a source line driver 15. Both of the select transistors ST1, ST2 are not necessarily needed. Only one of them may be used, provided that it can select a NAND cell.

The column decoder 120 decodes a column address signal, thereby obtaining a column address decode signal. Then, on the basis of the column address decode signal, the column decoder 120 selects any of the bit lines BL0 to BLn.

The row decoder 130 decodes a row address signal, thereby obtaining a row address decode signal. Then, the row decoder 130 selects any one of the word lines WL0 to WLm and the select gate lines SG0 to SGm.

The sense amplifier 140 amplifies the data read from the memory cell MC selected by the row decoder 130 and column decoder 120.

The write circuit 150 latches writing data.

The source line driver 160 applies a voltage to the source line SL.

FIG. 3 is a plan view of a part of the memory cell array 110 included in the NAND flash memory 100.

As shown in FIG. 3, in the semiconductor substrate 600, a plurality of strip-shaped element regions AAs extending in a first direction are formed in a second direction. Strip-shaped word lines WL0 to WLm, which extend in the second direction, are formed so as to cross the plurality of element regions AAs. In addition, strip-shaped select gate lines SGD, SGS, which extend in the second direction, are formed so as to sandwich eight word lines between them. Memory cell transistors MTs are formed in the regions where the word lines WL0 to WLm cross the element regions AAs. Select transistors ST1, ST2 are formed in the regions where the select gate lines SGD, SGS cross the element regions AAs. Furthermore floating gates (not shown) isolated on a memory cell transistor MT basis are formed in the regions where the word lines WL0 to WLm cross the element regions AAs.

A strip-shaped source line SL extending in the second direction is formed on the source region of each of the select transistors ST2. The source line SL is connected to the source regions of the select transistors ST2 via contact plugs CP1. The source line SL is connected to a source line driver 160.

Strip-shaped bit lines BL0 to BLn extending in the first direction are formed on the element regions AAs. The bit line BL0 to BLn are connected to the drain regions of the select transistors ST1 via contact plugs CP2.

Figure 4:
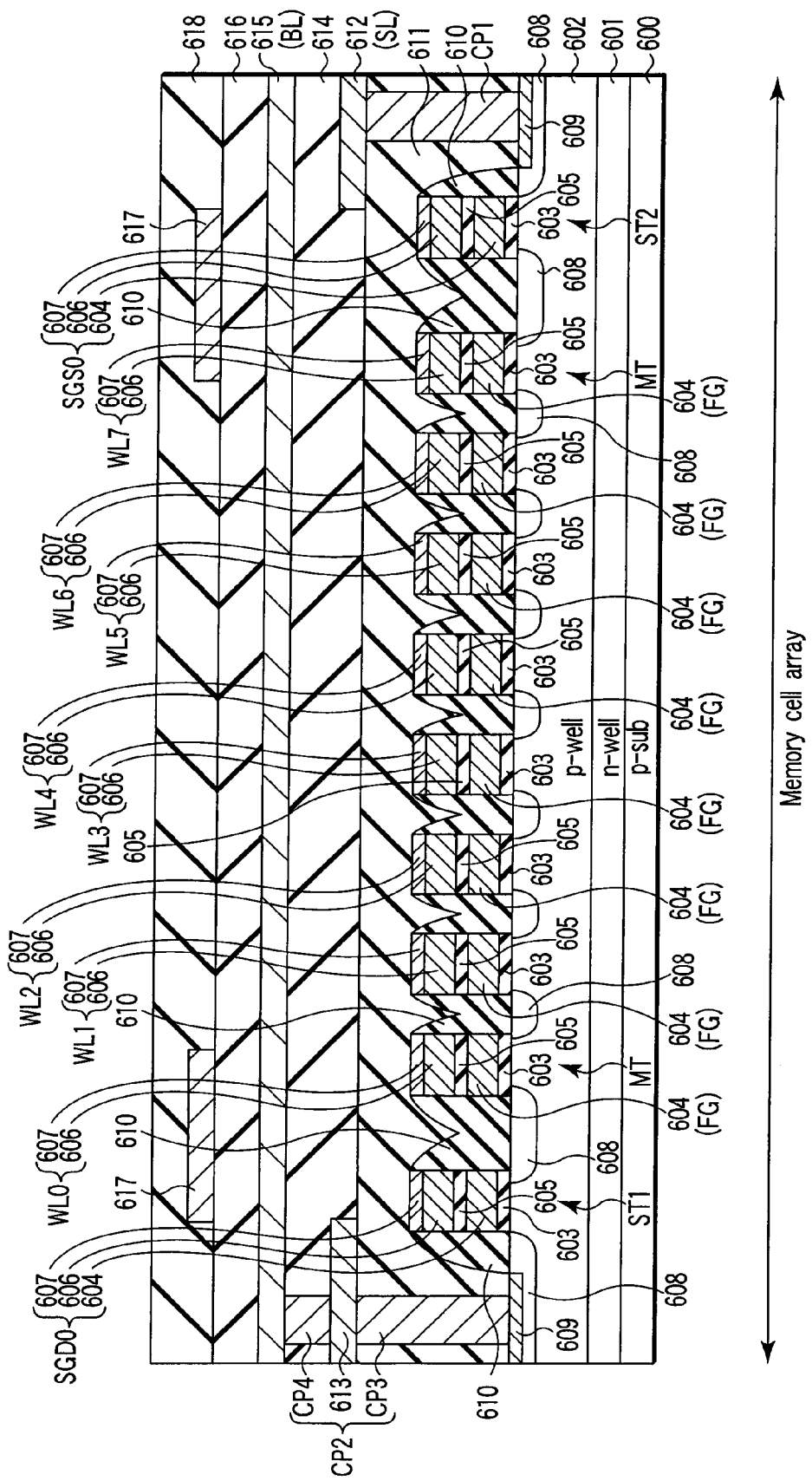
FIG. 4 is a sectional view taken along line 4-4 of FIG. 3.

FIG. 4 is a sectional view taken along line 4-4 of FIG. 3.

As shown in FIG. 4, an n-well region 601 is formed in the surface of the element region AA of the p-type semiconductor (silicon) substrate 600. A p-well region 602 is formed in the surface of the n-well region 601. A gate insulating film 603 is formed on the p-well region 602. The gate electrodes of memory cell transistors MTs and select transistors ST1, ST2 are formed on the gate insulating film 603. Each of the gate electrodes of the memory cell transistors MT and select transistors ST1, ST2 includes a polysilicon layer 604 formed on the gate insulating film 603, an inter-gate insulating film 605 formed on the polysilicon layer 604, a polysilicon layer 606 formed on the inter-gate insulating film 605, and a silicide layer 607 formed on the polysilicon layer 606. The inter-gate insulating film 605 is formed of, for example, a silicon oxide film, or an ON film, an NO film, or an ONO film which has a stacked structure of a silicon oxide film and a silicon nitride film. In the memory cell transistor MT, the polysilicon layers 604, which are separated from one another between element regions AAs adjoining in the word line direction, function as floating gates (FG). In addition, the polysilicon layer 606 and silicide layer 607 function as control gates (word lines WLs). The polysilicon layers 606 are connected to one another between element regions AAs adjoining in the word line direction. In the select transistors ST1, ST2, a part of the inter-gate insulating film 605 is removed in a shunt region (not shown) and the polysilicon layers 604 is connected electrically to the shunt wiring of the select gate. The polysilicon layer 606 and the silicide layer 607 don't need to be connected electrically to the polysilicon layer 604. Then, the polysilicon layers 604 functions as select gate lines SGD, SGS. In the select transistors ST1, ST2, the polysilicon layer 604 and polysilicon layer 606 are not separated between element regions AAs adjoining in the word line direction and are connected to each other.

Impurity diffused layers 608 functioning as source or drain region are formed in the surface of the semiconductor substrate 600 located between adjoining gate electrodes. Each impurity diffused layer 608 is shared by adjoining transistors. Specifically, an impurity diffused layer 608 between two adjoining select transistors ST1 functions as a drain region for the two select transistors ST1. An impurity diffused layer 608 between two adjoining select transistors ST2 functions as a source region for the two select transistors ST2. An impurity diffused layer 608 between two adjoining memory cell transistors MTs functions as a source or drain region for the two memory cell transistors MT. Moreover, an impurity diffused layer 608 between a memory cell transistor MT and a select transistor ST1 adjacent to each other functions as the drain region of the memory cell transistor MT and the source region of the select transistor ST1. On the other hand, an impurity diffused layer 608 between a memory cell transistor MT and a select transistor ST2 functions as the source region of the memory cell transistor MT and the drain region of the select transistor ST2. In the surface of the drain region 608 of the select transistor ST1 and in the surface of the source region 35 of the select transistor ST2, a silicide layer 609 is formed. No silicide layer is formed in the source and drain regions 608 of the memory cell transistor MT, in the source region 608 of the select transistor ST1, and in the drain region 608 of the select transistor ST2. A sidewall insulating film 610 is formed on the side of the gate electrode (stacked gate) of each of the memory cell transistor MT and select transistors ST1, ST2. The sidewall insulating film 610 is formed on the side facing the source region of the stacked gate and on the side facing the drain region. The region between the stacked gates of the memory cell transistor MT and select transistors ST1, ST2 is filled with the sidewall insulating film 610. The top of the source and drain regions of the memory cell transistor MT, the top of the source region of the select transistor ST1, and the top of the drain region of the select transistor ST2 are covered with the sidewall insulating film 610. Thus, no silicide layer is formed on the source and drain regions of the memory cell transistor MT, the source region of the select transistor ST1 and the drain region of the select transistor ST2.

On the semiconductor substrate 600, an interlayer insulating film 611 is formed so as to cover the memory cell transistors MTs and select transistors ST1, ST2. In the interlayer insulating film 611, a contact plug CP1 is formed which reaches the silicide layer 609 formed in the source region 608 of the select transistor ST2. A metal wiring layer 612 to be connected to the contact plug CP1 is formed on the interlayer insulating film 611. The metal wiring layer 612 functions as a source line SL. In the interlayer insulating film 611, a contact plug CP3 is formed which reaches the silicide layer 609 formed in the drain region 608 of the select transistor ST1. A metal wiring layer 613 to be connected to the contact plug CP3 is formed on the interlayer insulating film 611.

On the interlayer insulating film 611, an interlayer insulating film 614 is formed so as to cover the metal wiring layers 612, 613. A contact plug CP4 reaching the metal wiring layer 613 is formed in the interlayer insulating film 614. A metal wiring layer 615 connected commonly to a plurality of contact plugs CP4 is formed on the interlayer insulating film 614. The metal wiring layer 615 functions as a bit line BL. The contact plugs CP3, CP4, and metal wiring layer 613 correspond to the contact plugs CP2 in FIG. 3.

On the interlayer insulating film 614, an interlayer insulating film 616 is formed so as to cover the metal wiring layer 615. A metal wiring layer 617 is formed on the interlayer insulating film 616. The metal wiring layer 617, which is connected to the polysilicon layers 604 of the select transistors ST1, ST2 in a region (not shown), functions as the shunt wiring lines of the select gate lines SGD, SGS. On the interlayer insulating film 616, an interlayer insulating film 618 is formed so as to cover the metal wiring layer 617.

<3Tr-NAND Flash Memory>

Figure 5:
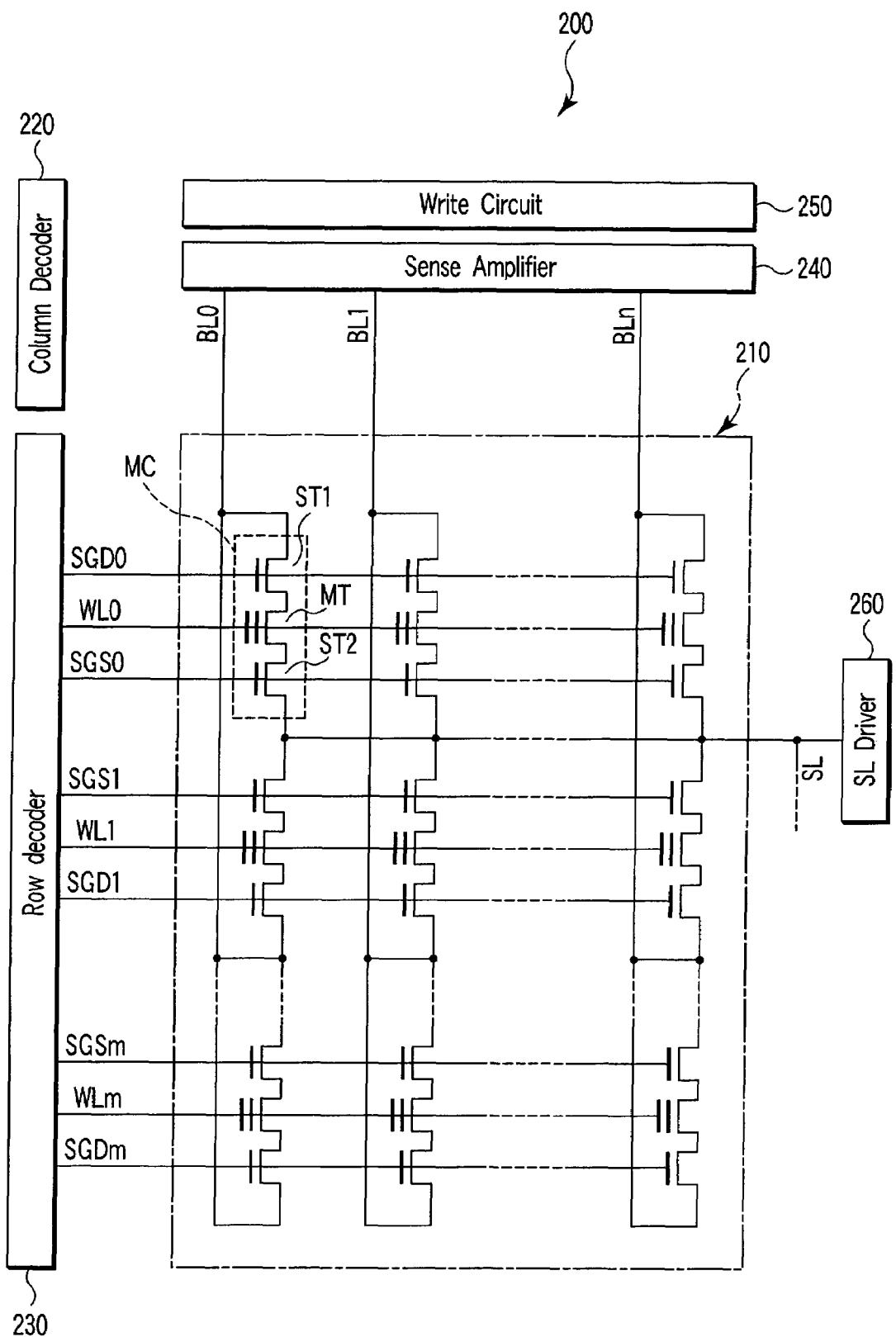
FIG. 5 is a block diagram of a 3Tr-NAND flash memory according to the first embodiment.

Next, the configuration of the 3Tr-NAND flash memory 200 will be explained by reference to FIG. 5. FIG. 5 is a block diagram of the 3Tr-NAND flash memory 200.

As shown in FIG. 5, the 3Tr-NAND flash memory 200 includes a memory cell array 210, a column decoder 220, a row decoder 230, a sense amplifier 240, a write circuit 250, and a source line driver 260.

The memory cell array 210 has a plurality of ((m+1)×(n+1)) memory cells MCs (m and n are natural numbers) arranged in a matrix. Each of the memory cells MCs includes a memory cell transistor MT and select transistors ST1, ST2, which have their current paths connected in series with one another. The current path of the memory cell transistor MT is connected between the current paths of the select transistors ST1, ST2. That is, the memory cell MC is equivalent to a NAND cell where the number of memory cell transistors MT is reduced to one in the NAND flash memory 100. The memory cell transistor MT has a stacked gate structure that includes a floating gate formed on a semiconductor substrate with a gate insulating film interposed therebetween and a control gate formed above the floating gate with an inter-gate insulating film interposed therebetween. The source region of the select transistor ST1 is connected to the drain region of the memory cell transistor MT. The source region of the memory cell transistor MT is connected to the drain region of the select transistor ST2. Memory cells MCs adjoining each other in the column direction share the drain region of the select transistor ST1 or the source region of the select transistor ST2.

The control gates of the memory cell transistors MTs of the memory cells MCs in a same row are connected commonly to any one of word lines WL0 to WLm. The gates of the select transistors ST1 of the memory cells in a same row are connected commonly to any one of select gate lines SGD0 to SGDm. The gates of the select transistors ST2 in a same row are connected commonly to any one of select gate lines SGS0 to SGSm. The drain regions of the select transistors ST1 of the memory cells MCs in a same column are connected commonly to any one of bit lines BL0 to BLn. The sources of the select transistors ST2 of the memory cells MCs are connected commonly to a source line SL and then connected to the source line driver 260.

The column decoder 220 decodes a column address signal, thereby producing a column address decode signal. On the basis of the column address decode signal, the column decoder 220 selects any of bit lines BL0 to BLn.

The row decoder 230 decodes a row address signal, thereby producing a row address decode signal. Then, the row decoder 230 selects any one of word lines WL0 to WLm and select gate lines SG0 to SGm.

The sense amplifier 240 amplifies the data read from the memory cell MC selected by the row decoder 230 and column decoder 220.

The write circuit 250 latches writing data.

The source line driver 260 supplies a voltage to the source line SL.

Figure 6:
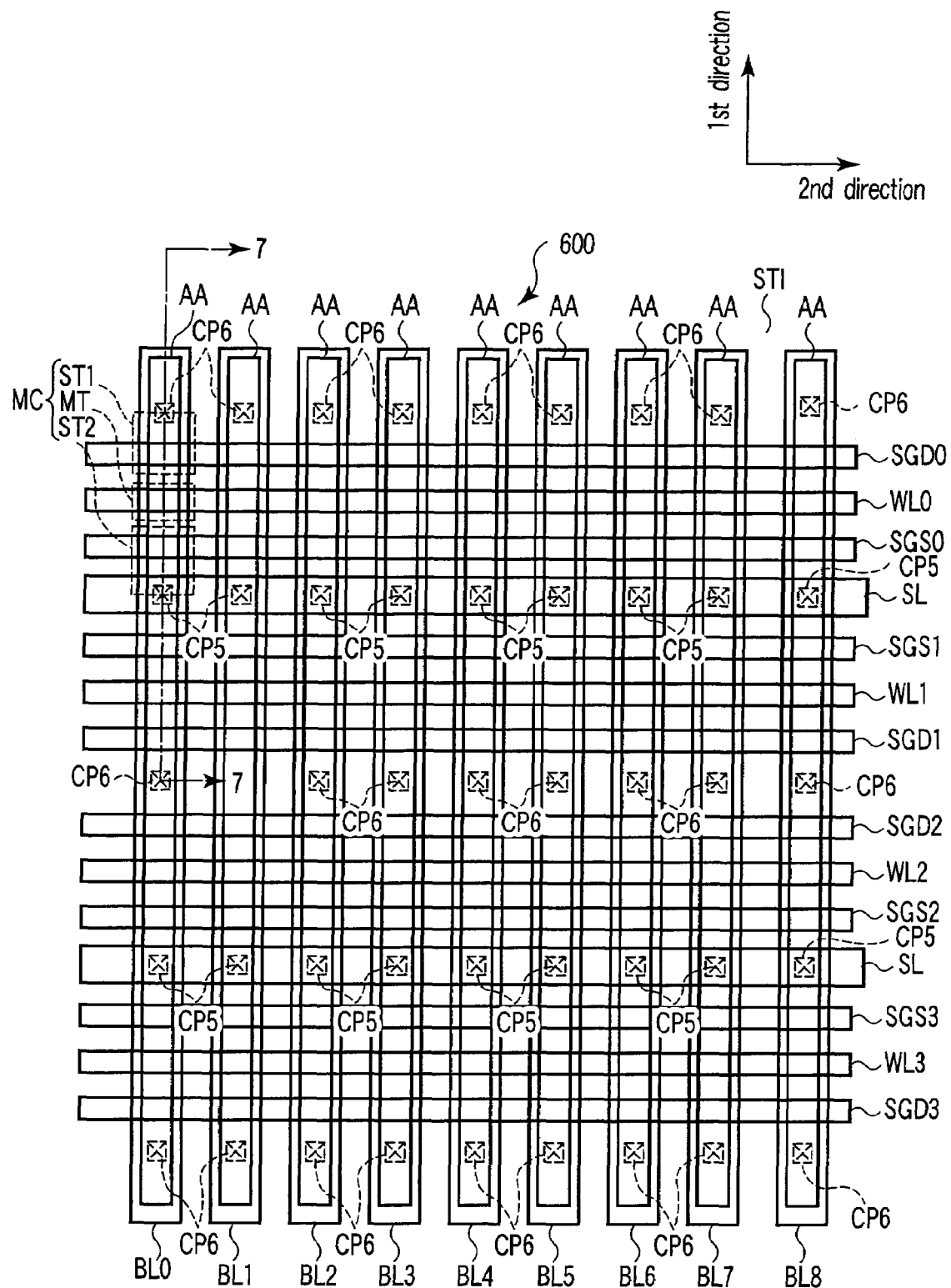
FIG. 6 is a plan view of a memory cell array of a 3Tr-NAND flash memory according to the first embodiment.

FIG. 6 is a plan view of a part of the memory cell array 210 included in the 3Tr-NAND flash memory 200.

As shown in FIG. 6, in the semiconductor substrate 600, a plurality of strip-like element regions AAs extending in a first direction are formed in a second direction. Strip-shaped word lines WL0 to WLm and select gate lines SGD0 to SGDm, SGS0 to SGSm, which extend in the second direction, are formed so as to cross the plurality of element regions AAs. That is, one of the word lines WL0 to WLm is sandwiched between any one of the select gate lines SGD0 to SGDm and any one of the select gate lines SGS0 to SGSm. Memory cell transistors MTs are formed in the regions where the word lines WL0 to WLm cross the element regions AAs. Select transistors ST1 are formed in the regions where the select gate lines SGD0 to SGDm cross the element regions AAs. Select transistors ST2 are formed in the regions where the select gate lines SGS0 to SGSm cross the element regions AAs. Furthermore, floating gates (not shown) isolated on a memory cell transistor MT basis are formed in the regions where the word lines WL0 to WLm cross the element regions AAs.

On the source region of each of the select transistors ST2, a strip-like source line SL extending in the second direction is formed. The source line SL is connected to the source regions of the select transistors ST2 via contact plugs CP5. The individual source lines SLs are connected to one another in a region (not shown). The common connection is further connected to a source line driver 260.

Strip-shaped bit lines BL0 to BLn extending in the first direction are formed on the element regions AAs. The bit line BL0 to BLn are connected to the drain regions of the select transistors ST1 via contact plugs CP6.

Figure 7:
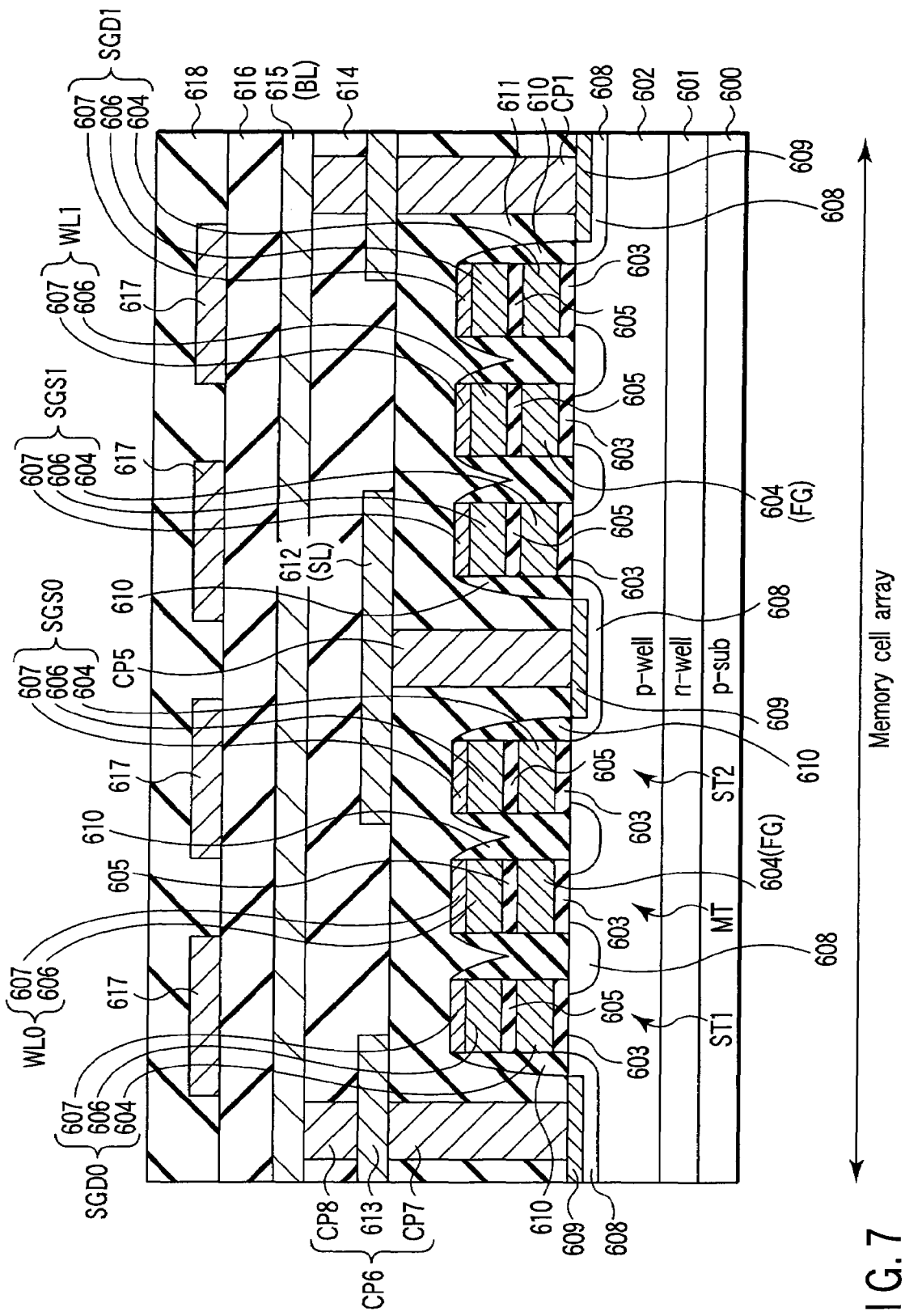
FIG. 7 is a sectional view taken along line 7-7 of FIG. 6.

FIG. 7 is a sectional view taken along line 7-7 of FIG. 6.

As shown in FIG. 7, an n-well region 601 is formed in the surface of the element region AA of the p-type semiconductor (silicon) substrate 600. A p-well region 602 is formed in the surface of the n-well region 601. On the p-well region 602, a gate insulating film 603 is formed. The gate electrodes of memory cell transistors MTs and select transistors ST1, ST2 are formed on the gate insulating film 603. Each of the gate electrodes of the memory cell transistors MT and select transistors ST1, ST2 includes a polysilicon layer 604 formed on the gate insulating film 603, an inter-gate insulating film 605 formed on the polysilicon layer 604, a polysilicon layer 606 formed on the inter-gate insulating film 605, and a silicide layer 607 formed on the polysilicon layer 606. The inter-gate insulating film 605 is formed of, for example, an ON film, an NO film, or an ONO film. In the memory cell transistor MT, the polysilicon layers 604, which are separated from one another between element regions AAs adjoining in the word line direction, function as floating gates (FG). In addition, the polysilicon layer 606 and silicide layer 607 function as control gates (word lines WLs). The polysilicon layers 606 are connected to one another between element regions AAs adjoining in the word line direction. In the select transistors ST1, ST2, a part of the inter-gate insulating film 605 is removed in a shunt region (not shown). The polysilicon layer 604 is connected electrically to the shunt wiring of the select gate. The polysilicon layer 606 and the silicide layer 607 don't need to be connected to the polysilicon layer 604. The polysilicon layer 604 functions as the select gate lines SGS, SGD. In the select transistors ST1, ST2, the polysilicon layer 604 and polysilicon layer 606 are not separated between element regions AAs adjoining in the word line direction and are connected to each other. That is, the floating gates are not separated on a cell basis differently from the memory cell transistor MT, but are all connected to one another.

Impurity diffused layers 608 functioning as source and drain regions are formed in the surface of the semiconductor substrate 600 located between adjoining gate electrodes. Each impurity diffused layer 608 is shared by adjoining transistors. Specifically, an impurity diffused layer 608 between two adjoining select transistors ST1 functions as a drain region for the two select transistors ST1. An impurity diffused layer 608 between two adjoining select transistors ST2 functions as a source region for the two select transistors ST2. An impurity diffused layer 608 between a memory cell transistor MT and a select transistor ST1 adjacent to each other functions as the drain region of the memory cell transistor MT and the source region of the select transistor ST1. Moreover, an impurity diffused layer 608 between a memory cell transistor MT and a select transistor ST2 adjacent to each other functions as the source region of the memory cell transistor MT and the drain region of the select transistor ST2. A silicide layer 609 is formed in the surface of the drain region of the select transistor ST1 and at the surface of the source region 35 of the select transistor ST2. No silicide layer is formed in the source and drain regions 608 of the memory cell transistor MT, in the source region 608 of the select transistor ST1, and in the drain region 608 of the select transistor ST2. A sidewall insulating film 610 is formed on the side of the gate electrode (stacked gate) of each of the memory cell transistor MT and select transistors. The sidewall insulating film 610 is formed on the side facing the source region 608 of the stacked gate and on the side facing its drain region 608. The region between the stacked gates of the memory cell transistor MT and select transistors STs is filled with the sidewall insulating film 610. The top of the source and drain regions of the memory cell transistor MT, the top of the source region of the select transistor ST1, and the top of the drain region of the select transistor ST2 are covered with the sidewall insulating film 610. Thus, no silicide layer is formed on the source and drain regions of the memory cell transistor MT, the source region of the select transistor ST1 and the drain region of the select transistor ST2.

On the semiconductor substrate 600, an interlayer insulating film 611 is formed so as to cover the memory cell transistors MTs and select transistors ST1, ST2. In the interlayer insulating film 611, a contact plug CP5 is formed which reaches the silicide layer 609 formed in the source region 608 of the select transistor ST2. A metal wiring layer 612 to be connected to the contact plug CP5 is formed on the interlayer insulating film 611. The metal wiring layer 612 functions as a source line SL. In the interlayer insulating film 611, a contact plug CP7 is formed which reaches the silicide layer 609 formed in the drain region 608 of the select transistor ST1. A metal wiring layer 613 to be connected to the contact plug CP7 is formed on the interlayer insulating film 611.

On the interlayer insulating film 611, an interlayer insulating film 614 is formed so as to cover the metal wiring layers 612, 613. A contact plug CP8 reaching the metal wiring layer 613 is formed in the interlayer insulating film 614. A metal wiring layer 615 connected equally to a plurality of contact plugs CP8 is formed on the interlayer insulating film 614. The metal wiring layer 615 functions as a bit line BL. The contact plugs CP7, CP8, and metal wiring layer 613 correspond to the contact plugs CP6 in FIG. 6.

On the interlayer insulating film 614, an interlayer insulating film 616 is formed so as to cover the metal wiring layer 615. A metal wiring layer 617 is formed on the interlayer insulating film 616. The metal wiring layer 617, which is connected to the polysilicon layers 604 of the select transistors ST1, ST2 in a region (not shown), functions as the shunt wiring lines of the select gate lines SGD, SGS. On the interlayer insulating film 616, an interlayer insulating film 618 is formed so as to cover the metal wiring layer 617.

<2Tr Flash Memory>

Figure 8:
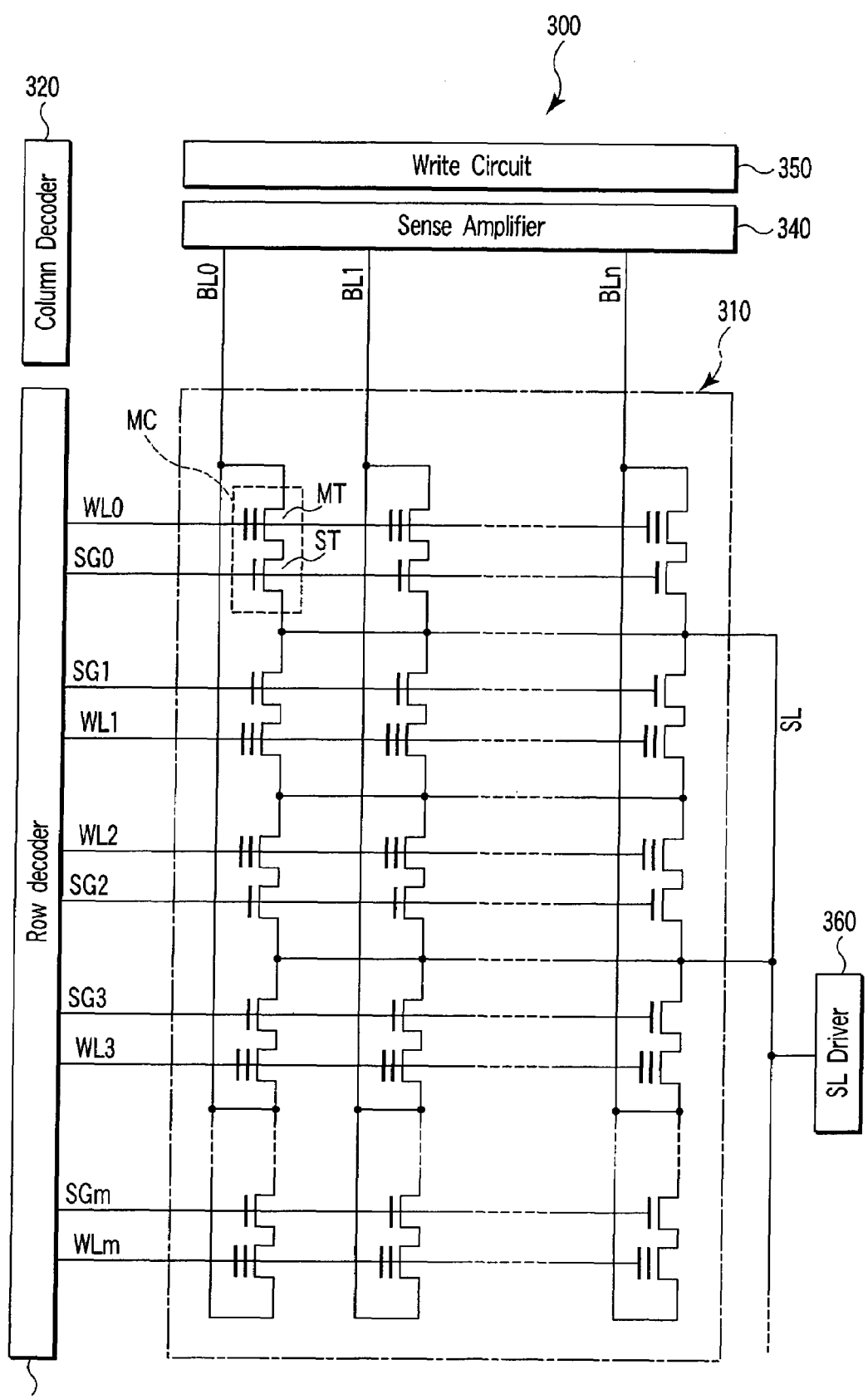
FIG. 8 is a block diagram of a 2Tr flash memory according to the first embodiment.

Next, the configuration of the 3Tr flash memory 300 will be explained by reference to FIG. 8. FIG. 8 is a block diagram of the 2Tr flash memory 300.

As shown in FIG. 8, the 2Tr flash memory 300 includes a memory cell array 310, a column decoder 320, a row decoder 330, a sense amplifier 340, a write circuit 350, and a source line driver 370.

The memory cell array 310 has a plurality of $((m+1)\times(n+1))$ memory cells MCs (m and n are natural numbers) arranged in a matrix. Each of the memory cells MCs includes a memory cell transistor MT and a select transistor ST, which have their current paths connected in series with one another. The memory cell transistor MT has a stacked gate structure that includes a floating gate formed on a semiconductor substrate with a gate insulating film between the gate and the substrate and a control gate formed on the floating gate with an inter-gate insulating film between the control gate and the floating gate. The source region of the memory cell transistor MT is connected to the drain region of the select transistor ST. Memory cells MCs adjoining each other in the column direction share the source region of the select transistor ST or the drain region of the memory cell transistor MT.

The control gates of the memory cell transistors MTs of the memory cells MCs in a same row are connected commonly to any one of word lines WL0 to WLm. The gates of the select transistors STs of the memory cells in a same row are connected commonly to any one of select gate lines SG0 to SGm. The drains of the memory cell transistors MTs of the memory cells MCs in a same column are connected commonly to any one of bit lines BL0 to BLn. The sources of the select transistors ST of the memory cells MCs are connected commonly to a source line SL and then connected to the source line driver 360.

The column decoder 320 decodes a column address signal, thereby producing a column address decode signal. On the basis of the column address decode signal, the column decoder 320 selects any one of bit lines BL0 to BLn.

The row decoder 330 decodes a row address signal, thereby producing a row address decode signal. Then, the row decoder 330 selects any one of word lines WL0 to WLm and select gate lines SG0 to SGm.

The sense amplifier 340 amplifies the data read from the memory cell MC selected by the row decoder 230 and column decoder 320.

The write circuit 350 latches writing data.

The source line driver 360 supplies a voltage to the source line SL.

Figure 9:
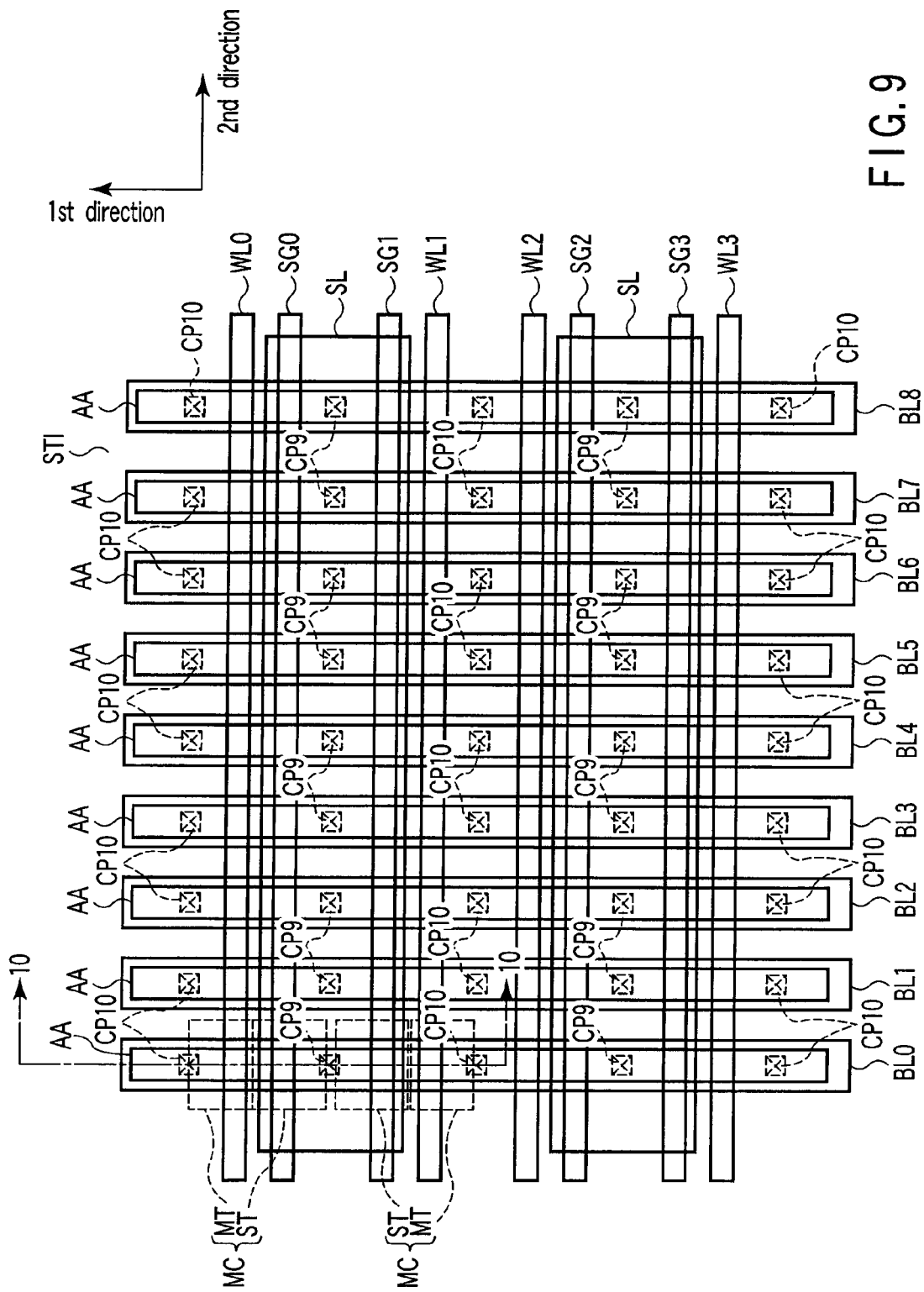
FIG. 9 is a plan view of a memory cell array of a 2Tr flash memory according to the first embodiment.

FIG. 9 is a plan view of a part of the memory cell array 310 included in the 2Tr flash memory 300.

As shown in FIG. 9, in the semiconductor substrate 600, a plurality of strip-shaped element regions AAs extending in a first direction are formed in a second direction. Strip-shaped word lines WL0 to WLm and select gate lines SG0 to SGm, which extend in the second direction, are formed so as to cross the plurality of element regions AAs. Memory cell transistors MTs are formed in the regions where the word lines WL0 to WLm cross the element regions AAs. Select transistors STs are formed in the regions where the select gate lines SG0 to SGm cross the element regions AAs. Furthermore, floating gates (not shown) isolated on a memory cell transistor MT basis are formed in the regions where the word lines WL0 to WLm cross the element regions AAs.

Between adjacent select gate lines SGs (i.e., between SG0 and SG1, between SG2 and SG3, . . . ), a strip-like source line SL extending in the second direction is formed. The source line SL is connected to the source regions of the select transistors ST via contact plugs CP9. The individual source lines SLs are connected to one another in a region (not shown). The common connection is further connected to a source line driver 360.

Strip-shaped bit lines BL0 to BLn extending in the first direction are formed on the element regions AAs. The bit line BL0 to BLn are connected to the drain regions of the memory cell transistors MTs via contact plugs CP10.

Figure 10:
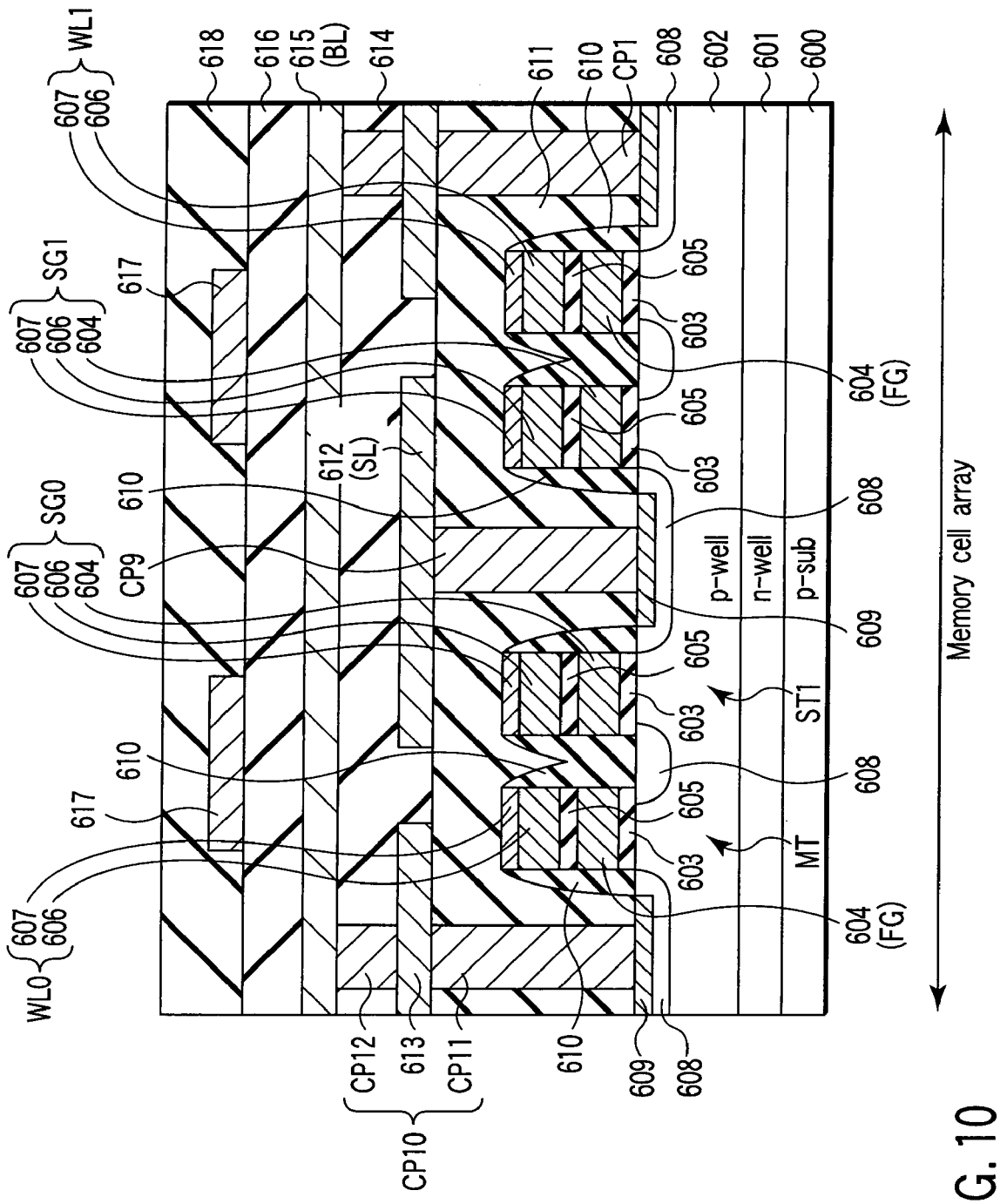
FIG. 10 is a sectional view taken along line 10-10 of FIG. 9.

FIG. 10 is a sectional view taken along line 10-10 of FIG. 9.

As shown in FIG. 10, an n-well region 601 is formed in the surface of the element region AA of the p-type semiconductor (silicon) substrate 600. A p-well region 602 is formed in the surface of the n-well region 601. A gate insulating film 603 is formed on the p-well region 602. The gate electrodes of memory cell transistors MTs and select transistors STs are formed on the gate insulating film 603. Each of the gate electrodes of the memory cell transistors MT and select transistors STs includes a polysilicon layer 604 formed on the gate insulating film 603, an inter-gate insulating film 605 formed on the polysilicon layer 604, a polysilicon layer 606 formed on the inter-gate insulating film 605, and a silicide layer 607 formed on the polysilicon layer 606. The inter-gate insulating film 605 is formed of, for example, an ON film, an NO film, or an ONO film. In the memory cell transistor MT, the polysilicon layers 604, which are separated from one another between element regions AAs adjoining in the word line direction, function as floating gates (FG). In addition, the polysilicon layer 606 and silicide layer 607 function as control gates (word lines WLs). The polysilicon layers 606 are connected to one another between element regions AAs adjoining in the word line direction. In the select transistor ST, a part of the inter-gate insulating film 605 is removed in a shunt region (not shown). The polysilicon layer 604 is connected electrically to the shunt wiring of the select gate. The polysilicon layer 606 and the silicide layer 607 don't need to be connected to the polysilicon layer 604. The polysilicon layer 604 functions as the select gate lines SGs. In the select transistor ST, the polysilicon layer 604 and polysilicon layer 606 are not separated between element regions AAs adjoining in the word line direction and are connected to each other. That is, the floating gates are not separated on a cell basis differently from the memory cell transistor MT, but are all connected to one another.

A memory cell MC including a memory cell transistor MT and a select transistor ST is formed so as to have the following relationship. Adjoining memory cells MC, MC have their select transistors STs or memory cell transistors MTs adjacent to each other. The adjoining select transistors or memory cell transistors share an impurity diffused layer 608. Therefore, two adjoining memory cells MC, MC, when their select transistors STs adjoin each other, are arranged symmetrically with the impurity diffused layer 608 shared by the two select transistors STs in the center. Conversely, when the memory transistors MTs adjoin each other, they are arranged symmetrically with the impurity diffused layer 608 shared by the two memory cell transistors MT, MT in the center.

Impurity diffused layers 608 functioning as source and drain regions are formed in the surface of the semiconductor substrate 600 located between adjoining gate electrodes. Each impurity diffused layer 608 is shared by adjoining transistors. Specifically, an impurity diffused layer 608 between two adjoining select transistors STs functions as a source region for the two select transistors STs. An impurity diffused layer 608 between two adjoining memory cell transistors MTs functions as the drain region for the two memory cell transistors MTs. Moreover, an impurity diffused layer 608 between a memory cell transistor MT and a select transistor ST adjacent to each other functions as the source region of the memory cell transistor MT and the drain region of the select transistor ST. A silicide layer 609 is formed in the surface of the drain region 608 of the memory cell transistor MT and at the surface of the source region 608 of the select transistor ST. No silicide layer is formed in the source region 608 of the memory cell transistor MT, and in the drain region 608 of the select transistor ST. A sidewall insulating film 610 is formed on the side of the gate electrode (stacked gate) of each of the memory cell transistor MT and select transistor ST. The sidewall insulating film 610 is formed on the side facing the source region 608 of the stacked gate and on the side facing its drain region 608. The region between the stacked gates of the memory cell transistor MT and select transistor ST is filled with the sidewall insulating film 610. The top of the source region of the memory cell transistor MT and the top of the drain region of the select transistor ST are covered with the sidewall insulating film 610. Thus, no silicide layer is formed on the source region of the memory cell transistor MT and the drain region of the select transistor ST.

On the semiconductor substrate 600, an interlayer insulating film 611 is formed so as to cover the memory cell transistors MTs and select transistors STs. In the interlayer insulating film 611, a contact plug CP9 is formed which reaches the silicide layer 609 formed in the impurity diffused layer (source region) 608 shared by two select transistors STs. A metal wiring layer 612 to be connected to the contact plug CP9 is formed on the interlayer insulating film 611. The metal wiring layer 612 functions as a source line SL. In the interlayer insulating film 611, a contact plug CP11 is formed which reaches the silicide layer 609 formed in the impurity diffused layer (drain region) 608 shared by two memory cell transistors MT, MT. On the interlayer insulating film 611, a metal wiring layer 613 to be connected to the contact plug CP11 is formed.

On the interlayer insulating film 611, an interlayer insulating film 614 is formed so as to cover the metal wiring layers 612, 613. A contact plug CP12 reaching the metal wiring layer 613 is formed in the interlayer insulating film 614. A metal wiring layer 615 connected equally to a plurality of contact plugs CP12 is formed on the interlayer insulating film 614. The metal wiring layer 615 functions as a bit line BL. The contact plugs CP11, CP12, and metal wiring layer 613 correspond to the contact plugs CP10 in FIG. 9.

On the interlayer insulating film 614, an interlayer insulating film 616 is formed so as to cover the metal wiring layer 615. A metal wiring layer 617 is formed on the interlayer insulating film 616. The metal wiring layer 617, which is connected to the polysilicon layers 604 of the select transistors STs in a region (not shown), functions as the shunt wiring lines of the select gate lines SGs. On the interlayer insulating film 616, an interlayer insulating film 618 is formed so as to cover the metal wiring layer 617.

Figure 11:
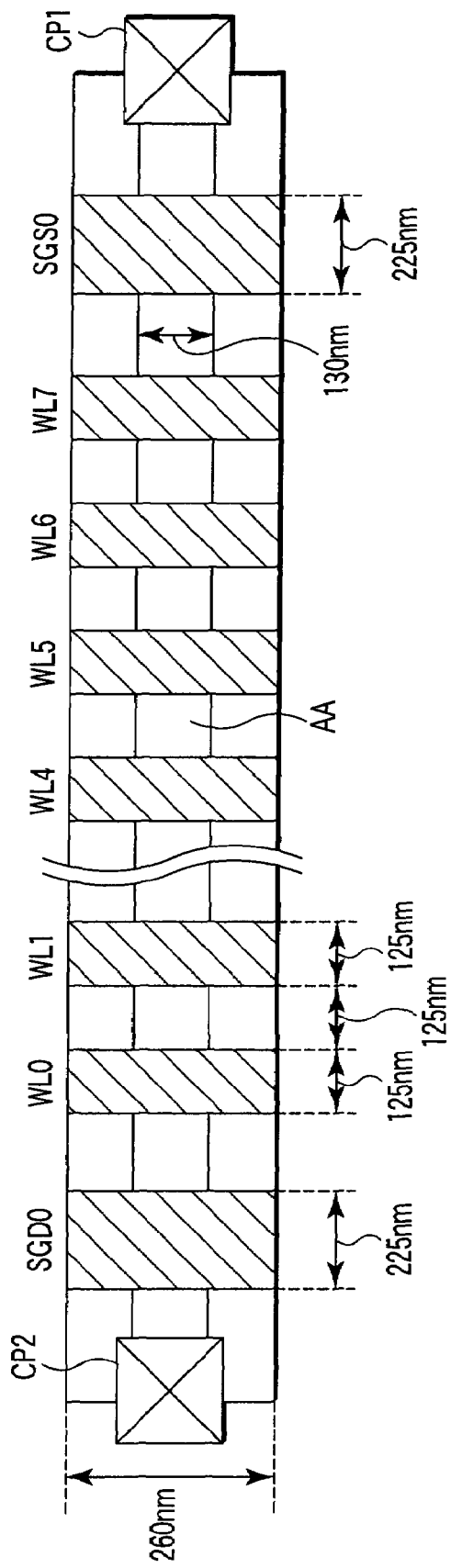
FIG. 11 is a plan view of a NAND cell of a NAND flash memory according to the first embodiment.

Next, the dimensions of the NAND flash memory 100, 3Tr-NAND flash memory 200, and 2Tr flash memory 300 configured as descried above will be explained. FIG. 11 is a plan view of a NAND cell. FIG. 12 is a plan view of a memory cell included in the 3Tr-NAND flash memory 200. FIG. 13 is a plan view of a memory cell included in the 2Tr-NAND flash memory.

As shown in FIG. 11, a width per NAND cell in the row direction is, for example, 260 nm. The width of an element region AA (or the channel width of each MOS transistor included in a NAND cell) is about 130 nm. The gate length of the select gate lines SGS0 to SGSm, SGD0 to SGDm is, for example, 225 nm. The gate length of the word lines WL0 to WLm is 125 nm. The distance between adjacent word lines is also 125 mm.

As shown in FIG. 12, a width per memory cell MC in the row direction included in the 3Tr-NAND flash memory 200 is, for example, 260 mm. The width of an element region AA (or the channel width of each MOS transistor included in a memory cell) is about 130 nm. The gate length of the word lines WL0 to WLm and the gate length of the select gate lines SGS0 to SGSm, SGD0 to SGDm are, for example, 250 mm. The distance between a word line WL and select lines SGS, SGD is also 250 nm.

As shown in FIG. 13, a width per memory cell MC in the row direction included in the 2Tr flash memory 300 is, for example, 260 nm. The width of an element region AA (or the channel width of each MOS transistor included in a memory cell) is about 150 nm. The gate length of the select gate lines SGS0 to SGSm is, for example, 250 nm. The gate length of the word lines WL0 to WLm and the distance between a word line WL and a select gate line SG are 250 nm.

That is, the widths of the cells included in the three flash memories 100, 200, 300 are the same. However, the channel width of the memory cells included in the 2Tr flash memory 300 is designed to be greater than the channel width of the memory cells included in the other flash memories 100, 200. In addition, the word line width of the 3Tr-NAND flash memory 200 and that of the 2Tr flash memory 300 are made greater than that of the NAND flash memory 100.

Figure 14:
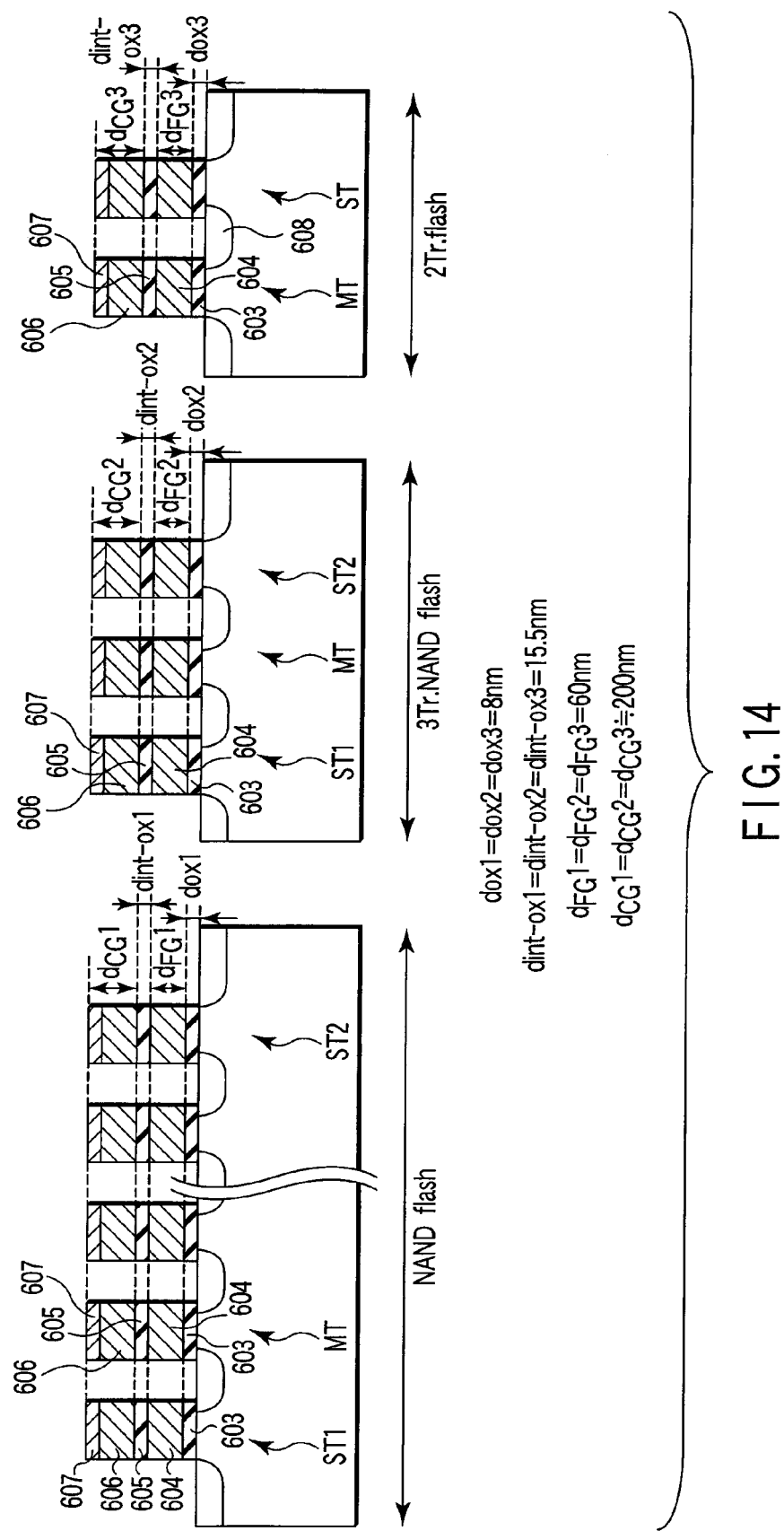
FIG. 14 is a sectional view of a NAND flash memory, a 3Tr-NAND flash memory, and a 2Tr flash memory according to the first embodiment.

FIG. 14 is a sectional view of a NAND cell, a memory cell included in the 3Tr-NAND flash memory 200, and a memory cell included in the 2Tr flash memory.

As shown in FIG. 14, the film thicknesses dox1, dox2, dox3 of the gate insulating films 603 of the flash memories 100, 200, 300 are the same. The respective gate insulating films are formed to a thickness of, for example, 8 nm. In addition, the film thicknesses dFG1, dFG2, dFG3 of the polysilicon film 604 are the same. The respective polysilicon films are formed to a thickness of, for example, 60 nm. Furthermore, the film thicknesses dint-ox1, dint-ox2, dint-ox3 of the inter-gate insulating films 605 are the same. The respective inter-gate insulating films are formed to a thickness of, for example, 15.5 nm. In addition, the film thicknesses dCG1, dCG2, dCG3 of the polysilicon film 606 and silicide film 607 are the same. The respective polysilicon films and silicide films are formed to a thickness of, for example, 200 mm.

Next, the operation of the NAND flash memory 100, 3Tr-NAND flash memory, and 2Tr flash memory will be explained below.

<Operation of NAND Flash Memory>

The operation of the NAND flash memory 100 will be explained below. Hereinafter, a state where no electron is injected into the floating gate and the threshold voltage is negative is defined as a state where "1" data has been written and a state where electrons are injected into the floating gate and the threshold voltage is positive is defined as a state where "0" data has been written.

<<Write Operation>>

Figure 15:
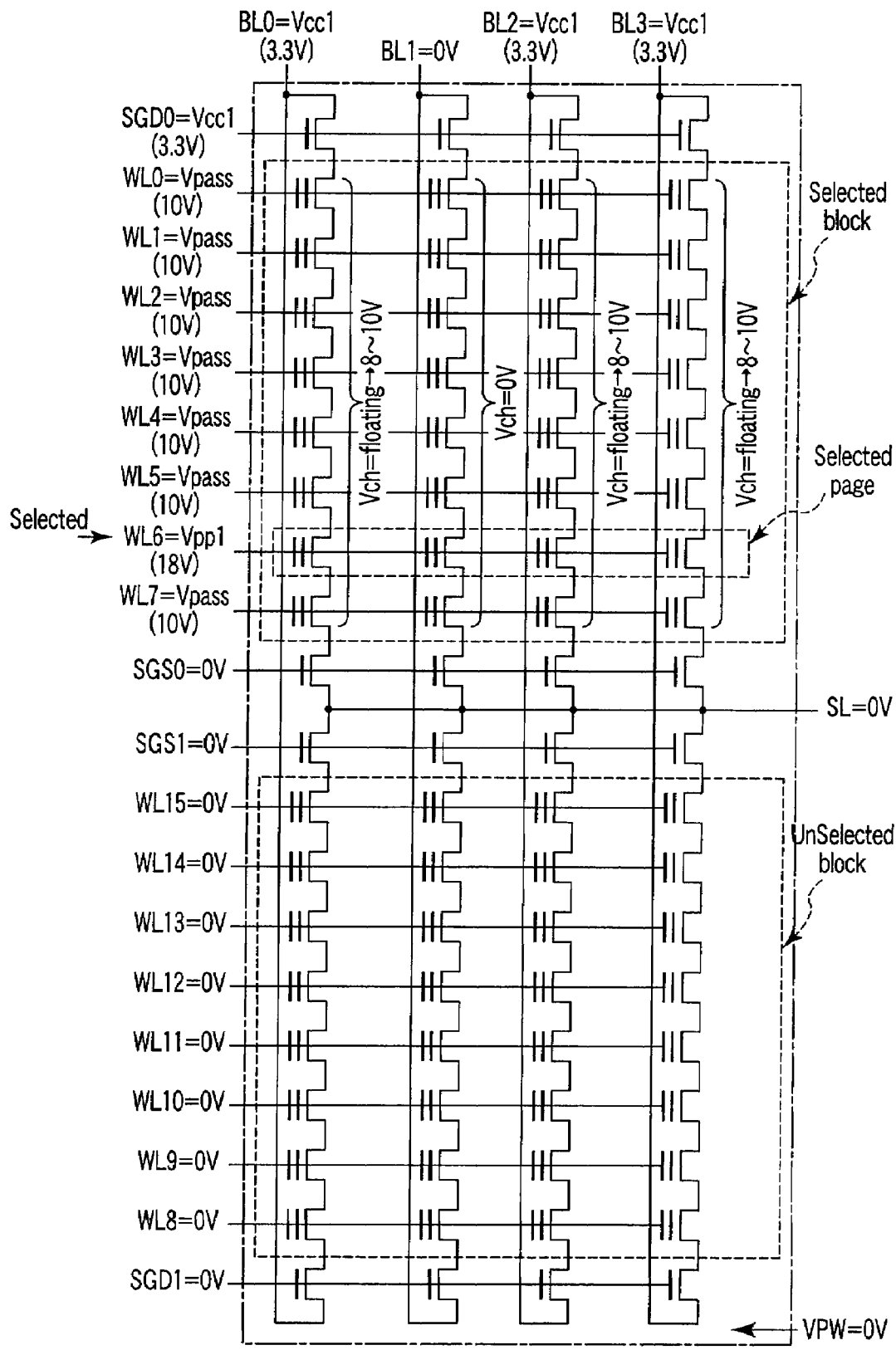
FIG. 15 is a circuit diagram of a memory cell array included in a NAND flash memory according to the first embodiment, showing a write operation.

A write operation will be explained by reference to FIG. 2 and FIG. 15. FIG. 15 is a circuit diagram of the memory cell array 110 of the NAND flash memory 100. For simplification, FIG. 15 shows a case where the number of NAND cells is (2×4). Data is written simultaneously into all of the memory cell transistors connected to any one of the word lines. Either "0" data or "1" data is written, depending on whether electrons are injected into the floating gate of the memory cell transistor MT. Electrons are injected into the floating gate by Fowler-Nordheim (FN) tunneling. In FIG. 15, it is assumed that data is written into the memory cell transistors MTs connected to word line WL6. Of the memory cell transistors MTs, "0" data is written into the memory cell transistor MT connected to bit line BL1 and "1" data is written into the memory cell transistors MTs connected to bit lines BL0, BL2, BL3.

First, in FIG. 2, writing data ("1" or "0") is inputted from an I/O terminal (not shown). Then, the write circuit 150 latches the writing data on a bit line basis. If "1" data is inputted, the write circuit 150 applies Vcc1 (e.g., 3.3V) to the bit line. Conversely, if "0" data is inputted, the write circuit 150 applies 0V to the bit line. That is, as shown in FIG. 15, the write circuit 150 applies Vcc1 to bit lines BL0, BL1, BL3 and 0V to bit line BL1.

Then, the row decoder 130 selects a block including the memory cell transistor into which the data is to be written. A "block" is defined as a set of NAND cells which share select gate lines SGD, SGS. Then, the row decoder 130 selects the select gate line SGD connected to the selected block, applies Vcc1 to the selected select gate line SGD, makes unselected all of the select gate lines SGDs connected to the unselected blocks and all the select gate lines SGSs, and applies 0V to the unselected select gate lines SGDs, SGSs. That is, as shown in FIG. 15, the block connected to the word lines WL0 to WL7 is selected, Vcc1 is applied to the selected select gate line SGD0, and 0V is applied to the unselected select gate lines SGS0, SGD1, SGS1.

As a result, of the select transistors ST1 connected to the selected select gate line SGD, the one connected to the bit line BL to which Vcc1 is applied is in the cut-off state. On the other hand, the select transistor ST1 connected to the bit line BL to which 0V is applied is in the on state.

Furthermore, the row decoder 130 selects any one of the word lines WLs and applies Vpp1 (e.g., 18V) to the selected word line WL and Vpass (e.g., 10V) to the other unselected word lines WLs, in the selected block. In addition, the row decoder 130 applies 0V to all of the word lines WLs in the unselected blocks. As a result, a channel region is formed in each of the memory cell transistors included in the selected block. Since the select transistor ST1 connected to the selected select gate line SGD and the bit line to which Vcc1 is applied is in the cut-off state, the channel potential of the memory cell transistor MT in the NAND cell including the select transistor ST1 is in the floating state. Then, coupling with the word line WL, the channel potential rises to a write inhibit voltage. On the other hand, since the select transistor ST1 connected to the selected select gate line SGD and the bit line to which 0V is applied is in the on state, the channel potential of the memory cell transistor MT in the NAND cell including the select transistor ST1 is at 0V.

Specifically, as shown in FIG. 15, the row decoder 130 not only selects the word line WL6 and applies Vpp1 to the selected word line WL6 but also applies Vpass to the unselected word lines WL0 to WL5, WL7 connected to the NAND cells including the word line WL6. Therefore, a channel region is formed in each of the memory cell transistors MTs connected to the word lines WL0 to WL7. Then, since 0V is applied to the bit line BL1, the channel potential Vch of the memory cell transistors MTs in the NAND cell including the select transistor ST1 connected to the bit line BL1 is 0V. On the other hand, since Vcc1 is applied to the bit lines BL0, BL2, BL3, the channel potential Vch of the memory cell transistors MTs in the NAND cell including the select transistors ST1 connected to the bit line BL0, BL2, BL3 rises to a write inhibit voltage (8 to 10V) as a result of coupling with the word lines WL0 to WL7. Moreover, the row decoder 130 applies 0V to the remaining unselected word lines WL8 to WL15.

In addition, the row decoder 130 applies 0V to the substrate (p-channel region 602) in which NAND cells are formed.

As a result, in the memory cell transistor MT in the NAND cell including the select transistor ST1 cut off, since the potential difference between the gate and channel is insufficient, no electron is injected into the floating gate. That is, the threshold value of the memory cell connected to the bit line applied with Vcc1 and the selected word line WL (or the memory cell into which "1" data is to be written) remains negative. In the example of FIG. 15, no electron is injected into the floating gates of the memory cell transistors MTs connected to the bit lines BL0, BL2, BL3 and the word lines WL0 to WL7. In other words, "1" data is written into the memory cell transistors MTs connected to the bit lines BL0, BL2, BL3 and the selected word line WL6.

On the other hand, in the NAND cell including the select transistor ST1 connected to the selected select gate line SGD and to the bit line BL applied with 0V, since the potential difference between the gate and channel is insufficient in the memory cell transistors MTs connected to the unselected word lines WL, no electron is injected to the floating gates. That is, no data is written. On the other hand, in the memory cell transistor MT connected to the selected word line WL, since the potential difference between the gate and channel is 18V, electrons are injected into the floating gate by FN tunneling. As a result, the threshold value of the memory cell transistor MT changes to positive. That is, "0" data is written. In the example of FIG. 15, Vpp1 is applied to the word line WL6, with the result that the potential difference between the channel potential Vch of the memory cell transistor MT connected to the bit line BL1 and word line WL6 and the gate is 18V. Therefore, electrons are injected into the floating gate of the memory cell transistor MT connected to the bit line BL1 and word line WL6. The threshold value of the memory cell transistor MT into which electrons have been injected changes to positive, which means that "0" data has been written.

As described above, the data is written into one page of memory cell transistors simultaneously.

<<Erase Operation>>

Figure 16:
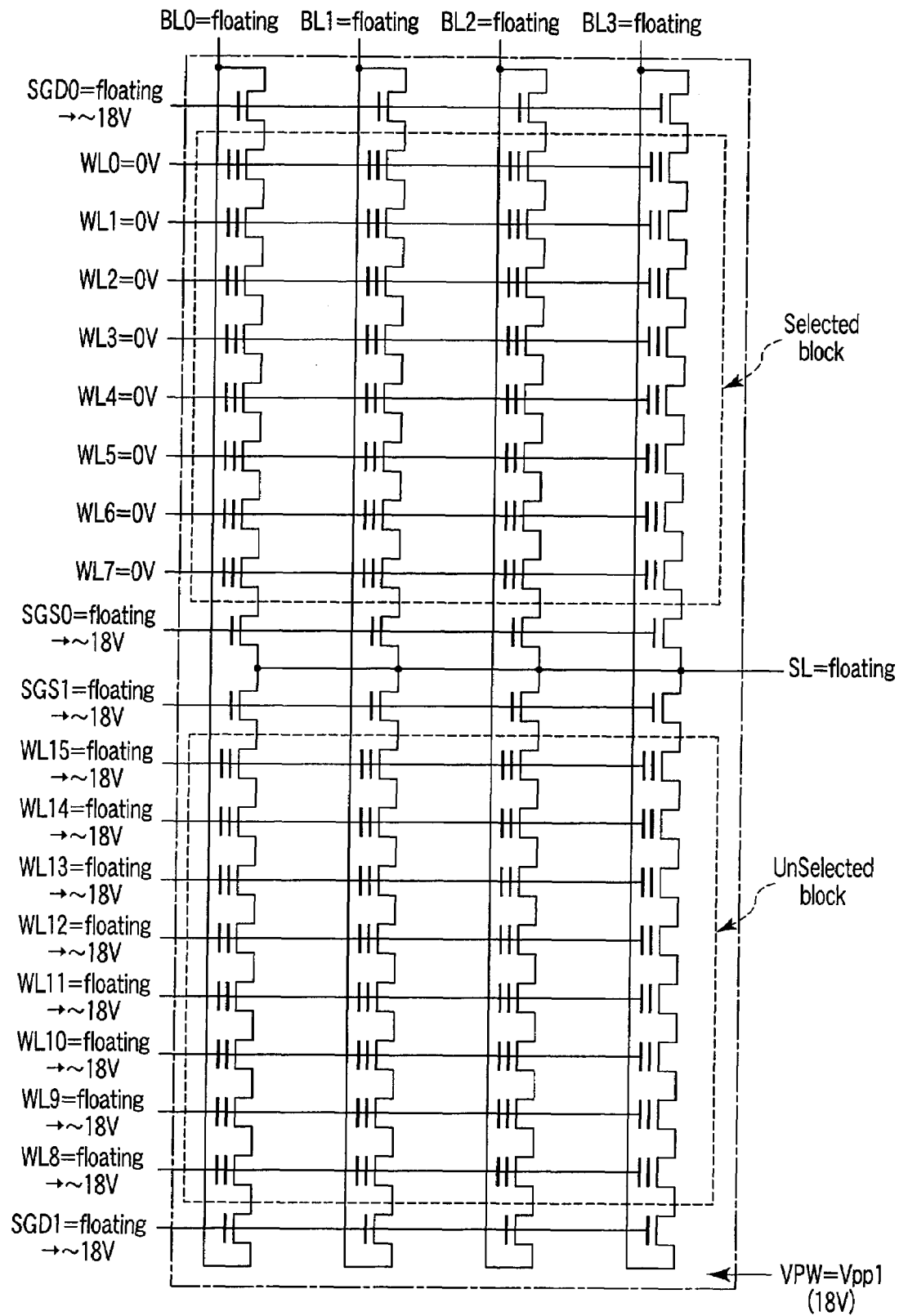
FIG. 16 is a circuit diagram of a memory cell array included in a NAND flash memory according to the first embodiment, showing an erase operation.

An erase operation will be explained by reference to FIG. 2 and FIG. 16. FIG. 16 is a circuit diagram of the memory cell array 110 of the NAND flash memory 100. For simplification, FIG. 16 shows a case where the number of NAND cells is (2×4). Data is erased in blocks simultaneously. An erase operation is carried out by pulling electrons out of the floating gate by FN tunneling. FIG. 16 shows a case where the data is erased in the block connected to the select gate lines SGD0, SGS0.

Before erasing is done, all of the bit lines BLs are brought into the floating state. In addition, the row decoder 130 brings all of the select gate lines SGD, SGS into the floating state. Then, the row decoder 130 not only selects any one of the blocks and applies 0V to all of the word lines WLs included in the selected block but also brings all of the word lines WLs included in the unselected blocks into the floating state. In addition, the row decoder 130 applies Vpp1 (18V) to the semiconductor substrate (p-well region 602) in which NAND cells are formed. That is, as shown in FIG. 16, 0V is applied to all of the word lines WL0 to WL7 included in the selected block and all of the word lines WL8 to WL15 included in the unselected blocks are brought into the floating state. Moreover, all of the select gate lines SGD0, SGS0, SGD1, SGS1 are brought into the floating state.

Then, in the selected block, the potential difference between all of the memory cell transistors MTs and the semiconductor substrate is 18V, causing electrons in the floating gate to be pulled out into the semiconductor substrate. As a result, the data is erased from all of the memory cell transistors MTs in the selected block, with the result that the threshold value of the memory cell transistors MTs becomes negative. That is, as shown in FIG. 16, electrons are pulled out of the floating gates of all the memory cell transistors connected to the word lines WL0 to WL7, thereby erasing the data.

In the unselected blocks, the potential of the word lines WLs rises to about 18V because of coupling with the semiconductor substrate. As a result, electrons are not pulled out of the floating gate, with the result that the data is not erased. That is, as shown in FIG. 16, the potentials of the word lines WL8 to WL15 rise by coupling. As a result, the data is not erased from all of the memory cell transistors connected to the word lines WL8 to WL15.

In addition, the potentials of the select gate lines SGS0, SGD0, SGS1, SGD1 also rise to about 18V by coupling, which prevents stress from being applied to the gate oxide films of the select transistors STs.

As described above, the data is erased simultaneously from the selected block.

<<Read Operation>>

Figure 17:
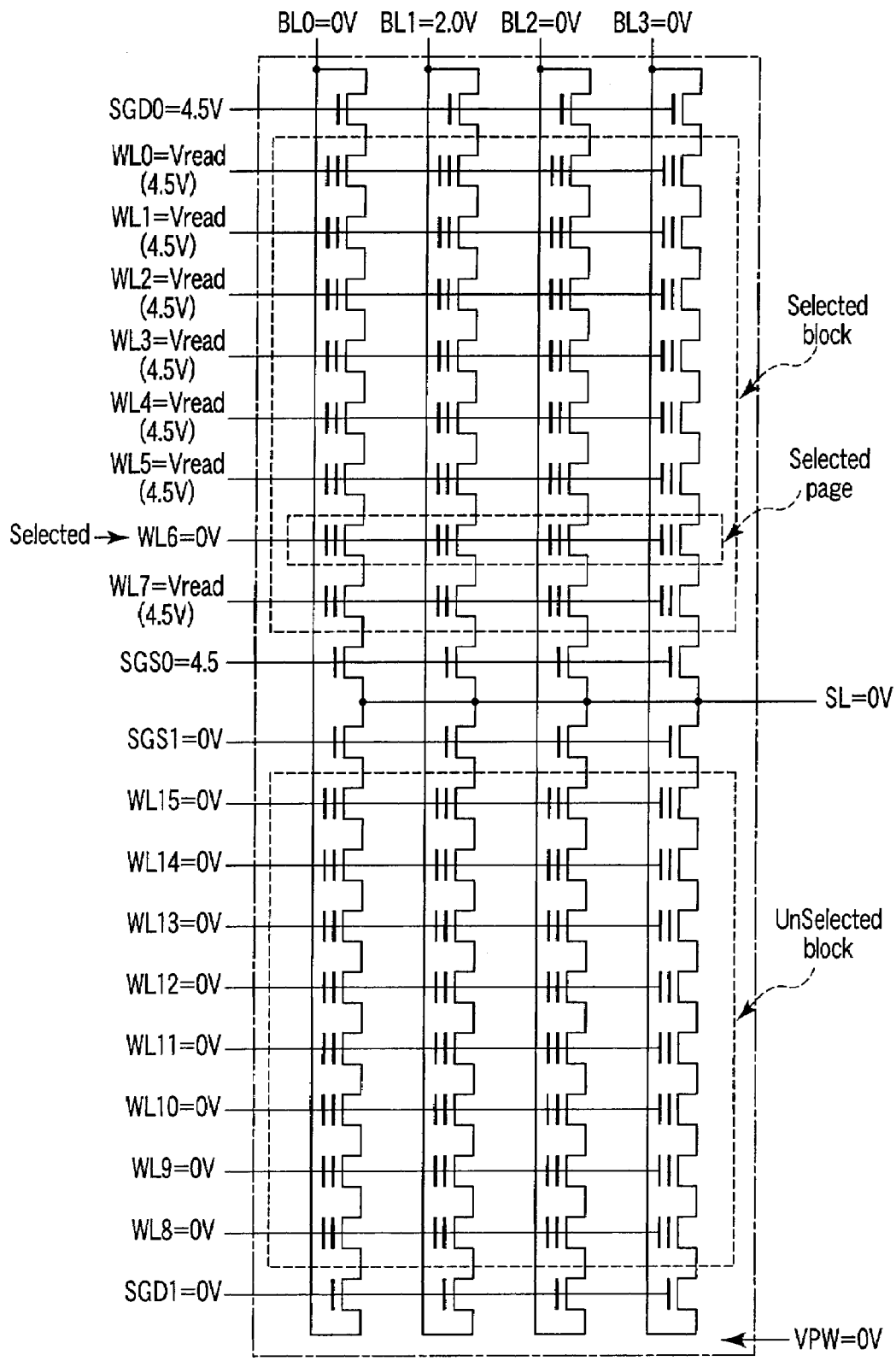
FIG. 17 is a circuit diagram of a memory cell array included in a NAND flash memory according to the first embodiment, showing a read operation.

A read operation will be explained by reference to FIG. 2 and FIG. 17. FIG. 17 is a circuit diagram of the memory cell array 110 of the NAND flash memory 100. For simplification, FIG. 17 shows a case where the number of NAND cells is (2×4). FIG. 17 shows a case where the data is read from the memory cell transistor MT connected to the bit line BL1 and word line WL6.

First, the row decoder 130 selects a block including a memory cell transistor from which the data is to be read. Then, the row decoder 130 selects the select gate lines SGD, SGS connected to the selected block and applies, for example, 4.5V to the selected select gate lines SGD, SGS. In addition, the row decoder 130 makes unselected the select gate lines SGD, SGS connected to the unselect blocks and applies 0V to the unselected select gate lines SGD, SGS. As a result, the select transistors ST1, ST2 connected to the selected select gate lines SGD, SGS are brought into the on state. Then, the row decoder 130 selects any one of the word lines WLs in the selected block. The row decoder 130 then applies 0V to the selected word line WL and Vread (e.g., 4.5V) to the unselected word lines in the selected block. 0V is applied to all of the word lines WLs in the unselected blocks. That is, as shown in FIG. 17, 4.5V is applied to the selected select gate lines SGD0, SGS0 connected to the selected block and 0V is applied to the other unselected select gate lines SGD1, SGS1. As a result, the select transistors ST1, ST2 connected to the selected select gate lines SGD0, SGS0 are brought into the on state. In addition, 0V is applied to the selected word line WL6, Vread is applied to the unselected word lines WL0 to WL5, WL7 in the selected block, and 0V is applied to all of the word lines WL8 to WL15 in the unselected blocks.

Then, all of the memory cell transistors MTs connected to the unselected word lines in the selected block are brought into the on state, regardless of whether the data written in them is "0" or "1." Since the memory cell transistor MT connected to the selected word line has a negative threshold value if the data written in it is "1," the transistor MT is in the on state. If the data written in it is "0," the transistor MT is in the off state, since the threshold value is positive.

In this state, for example, 2.0V is applied to the selected bit line BL. Then, if the data written in the memory cell transistor MT connected to the selected word line WL and selected bit line BL is "1," current flows from the bit line to the source line. On the other hand, if the data written in the memory cell transistor M is "0," no current flows. In the example of FIG. 17, 2.0V is applied to the selected bit line BL1. Then, if the data written in the memory cell transistor MT connected to the selected word line WL7 and selected bit line BL1 is "1," current flows from the bit line BL1 to the source line SL. On the other hand, if the data written in the memory cell transistor M is "0," no current flows.

As described above, the bit line potential varying with the current from the bit line to the source line is amplified by the sense amplifier 140, thereby reading the data. While the data has been read from one bit line in the example of FIG. 17, a potential may be applied to a plurality of bit lines, thereby reading the data from a plurality of memory cell transistors simultaneously.

<Operation of 3Tr-NAND Flash Memory>

Next, the operation of the 3Tr-NAND flash memory 200 will be explained below. The operation of the 3Tr-NAND flash memory is basically the same as that of the NAND flash memory 100. The following is a detailed explanation of the operation of the 3Tr-NAND flash memory.

<<Write Operation>>

Figure 18:
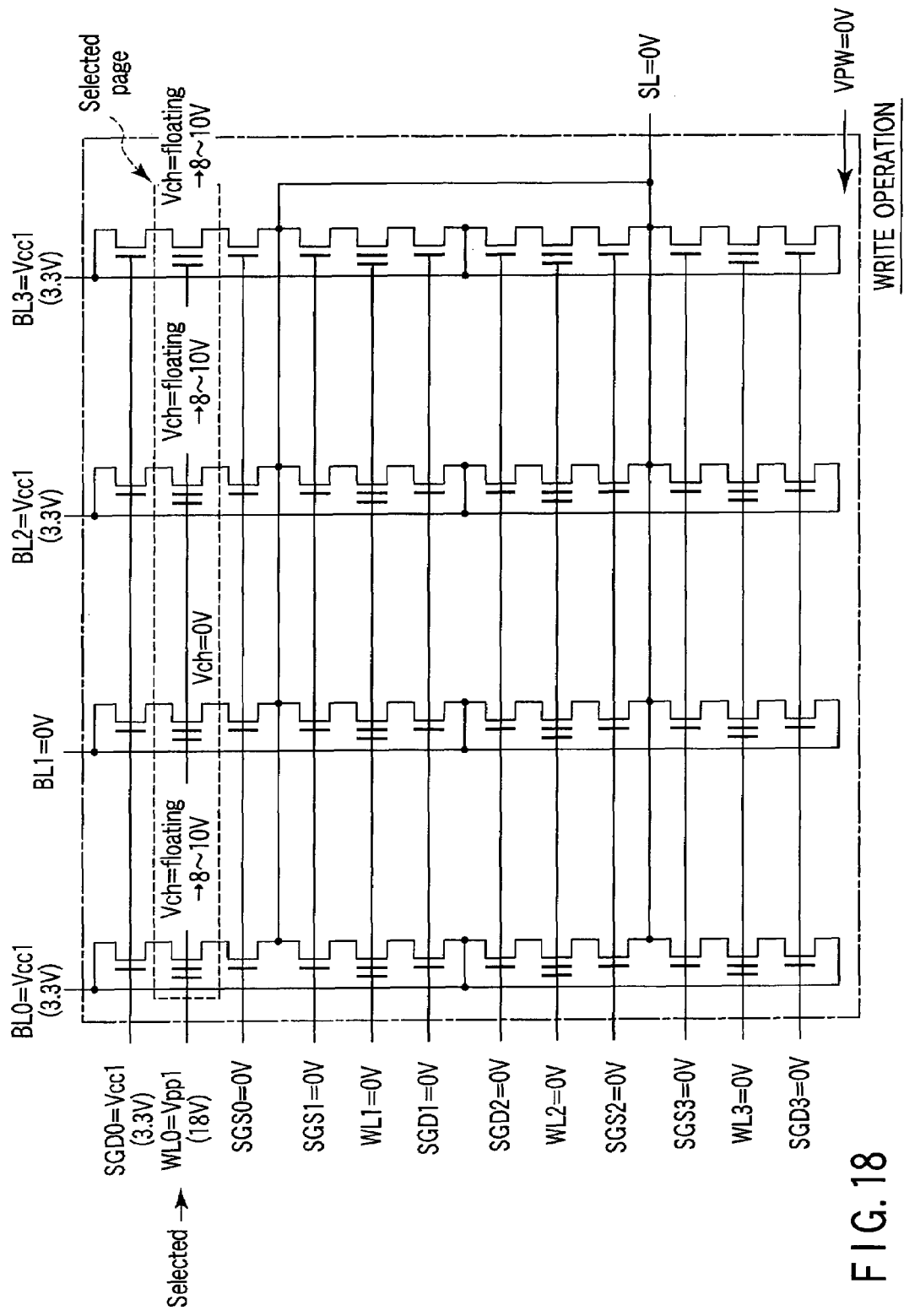
FIG. 18 is a circuit diagram of a memory cell array included in a 3Tr-NAND flash memory according to the first embodiment, showing a write operation.

A write operation will be explained by reference to FIG. 5 and FIG. 18. FIG. 18 is a circuit diagram of the memory cell array 210 of the 3Tr-NAND flash memory 200. For simplification, FIG. 18 shows a case where the number of memory cells is (4×4). Data is written simultaneously into all of the memory cell transistors connected to any one of the word lines. Either "0" data or "1" data is written, depending on whether electrons are injected into the floating gate of the memory cell transistor MT. Electrons are injected into the floating gate by FN tunneling. In FIG. 18, it is assumed that data is written into the memory cell transistors MTs connected to word line WL0. Of the memory cell transistors MTs, "0" data is written into the memory cell transistor MT connected to bit line BL1 and "1" data is written into the memory cell transistors MTs connected to bit lines BL0, BL2, BL3.

First, in FIG. 5, writing data ("1" or "0") is inputted from an I/O terminal (not shown). Then, the write circuit 250 latches the writing data on a bit line basis. If "1" data is inputted, the write circuit 250 applies Vcc1 (e.g., 3.3V) to the bit line. Conversely, if "0" data is inputted, the write circuit 250 applies 0V to the bit line. That is, as shown in FIG. 18, the write circuit 250 applies Vcc1 to bit lines BL0, BL2, BL3 and 0V to bit line BL1.

Then, the row decoder 230 selects any one of the select gate lines SGDs and applies Vcc1 to the selected select gate line SGD and 0V to the unselected select gate lines SGDs and all of the select gate lines SGSs. That is, as shown in FIG. 18, the row decoder 230 selects the select gate line SGD0 and applies Vcc1 to the select gate line SGD0 and 0V to the other select gate lines SGD1, SGS0, SGS1.

As a result, of the select transistors ST1 connected to the selected select gate line SGD, the select transistor ST1 connected to the bit line BL to which Vcc1 is applied is in the cut-off state. On the other hand, the select transistor ST1 connected to the bit line BL to which 0V is applied is in the on state.

Furthermore, the row decoder 230 selects any one of the word lines WLs and applies Vpp1 to the selected word line WL. In addition, the row decoder 230 applies 0V to all of the unselected word lines WLs. The selected word line WL is a word line connected to the memory cell MC including the selected select gate line SGD. As a result, a channel region is formed in the memory cell transistors MTs connected to the selected word line WL. Since the select transistor ST1 connected to the selected select gate line SGD and the bit line to which Vcc1 is applied is in the cut-off state, the channel potential of the memory cell transistor MT connected to the select transistor ST1 is in the floating state. Then, coupling with the word line WL, the channel potential rises to a write inhibit voltage. On the other hand, since the select transistor ST2 connected to the selected select gate line SGD and the bit line to which 0V is applied is in the on state, the channel potential of the memory cell transistor MT connected to the select transistor ST1 is at 0V.

Specifically, as shown in FIG. 18, the row decoder 230 not only selects the word line WL0 and applies Vpp1 to the selected word line WL0 but also applies 0V to the unselected word lines WL1 to WL3. Therefore, a channel region is formed in the memory cell transistors MTs connected to the word line WL0. Then, since 0V is applied to the bit line BL1, the channel potential Vch of the memory cell transistors MTs in the memory cell including the select transistor ST1 connected to the bit line BL1 is 0V. On the other hand, since Vcc1 is applied to the bit lines BL0, BL2, BL3, the channel potential Vch of the memory cell transistors MTs in the memory cell including the select transistors ST1 connected to the bit line BL0, BL2, BL3 rises to a write inhibit voltage (8 to 10V) as a result of coupling with the word line WL0. Moreover, the row decoder 230 applies 0V to the remaining unselected word lines WL1 to WL3.

In addition, the row decoder 230 applies 0V to the substrate (p-channel region 602) in which memory cells are formed.

As a result, in the memory cell transistor MT in the memory cell including the select transistor ST1 cut off, since the potential difference between the gate and channel is insufficient, no electron is injected into the floating gate. That is, the threshold value of the memory cell connected to the bit line applied with Vcc1 and the selected word line WL (or the memory cell into which "1" data is to be written) remains negative. In the example of FIG. 18, no electron is injected into the floating gate of the memory cell transistors MTs connected to the bit lines BL0, BL2, BL3 and the word line WL0. In other words, "1" data is written into the memory cell transistors MTs connected to the bit lines BL0, BL2, BL3 and the selected word line WL0.

On the other hand, in the memory cell transistor MT connected to the selected select gate line SGD and to the bit line BL applied with 0V, since the potential difference between the gate and channel is 18V, electrons are injected into the floating gate by FN tunneling. As a result, the threshold value of the memory cell transistor MT changes to positive. That is, "0" data is written. In the example of FIG. 18, Vpp1 is applied to the word line WL0, with the result that the channel potential Vch of the memory cell transistor MT connected to the bit line BL1 and word line WL0 is 18V. Therefore, electrons are injected into the floating gate of the memory cell transistor MT connected to the bit line BL1 and word line WL0. The threshold value of the memory cell transistor MT into which electrons have been injected changes to positive, which means that "0" data has been written.

As described above, the data is written into one page of memory cell transistors simultaneously.

<<Erase Operation>>

Figure 19:
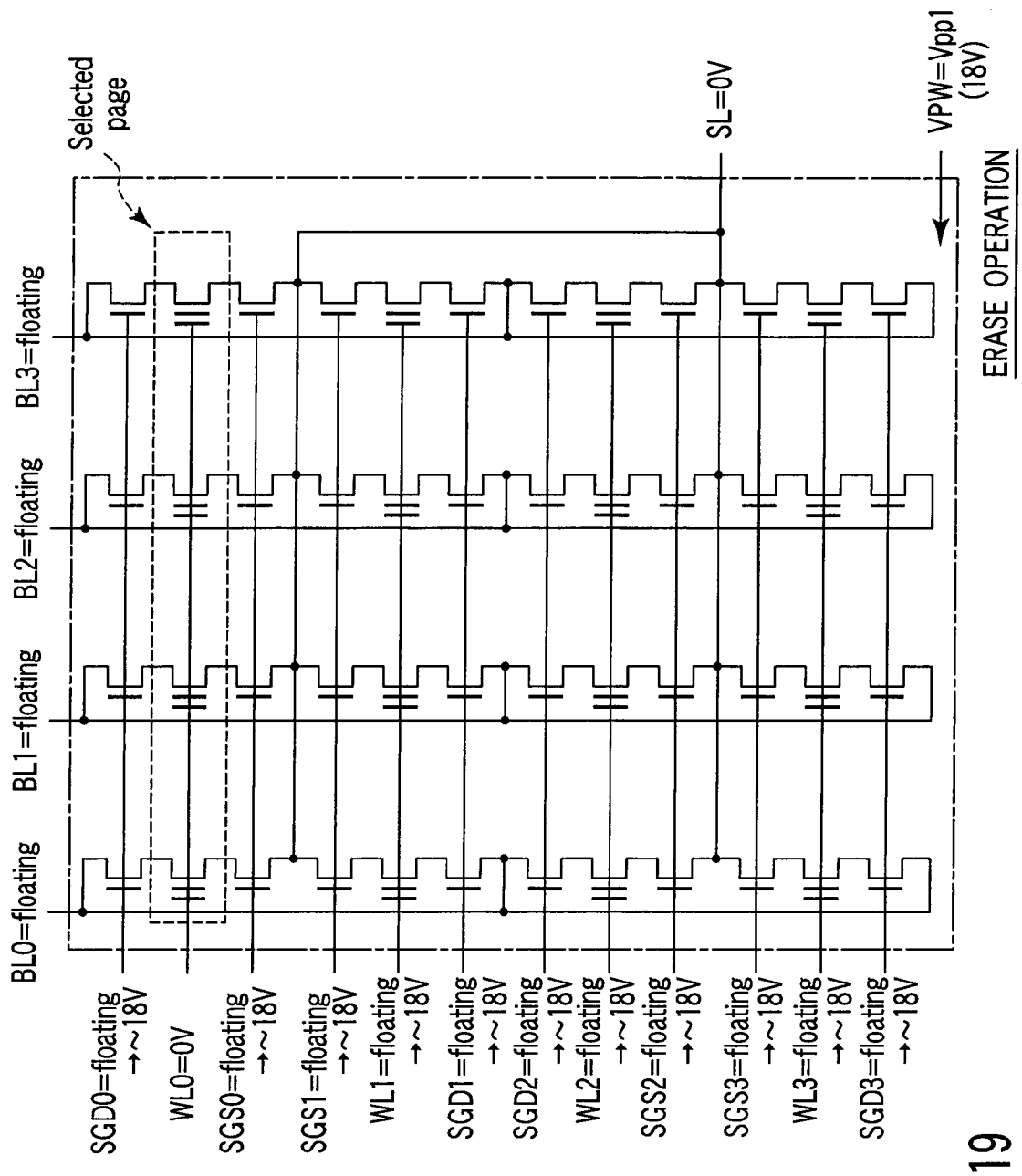
FIG. 19 is a circuit diagram of a memory cell array included in a 3Tr-NAND flash memory according to the first embodiment, showing an erase operation.

An erase operation will be explained by reference to FIG. 5 and FIG. 19. FIG. 19 is a circuit diagram of the memory cell array 210 of the 3Tr-NAND flash memory 200. For simplification, FIG. 19 shows a case where the number of memory cells is (4×4). Data is erased in pages simultaneously. An erase operation is carried out by pulling electrons out of the floating gate by FN tunneling. FIG. 19 shows a case where the data is erased in the memory cell transistors connected to the word line WL0.

Before erasing is done, all of the bit lines BLs are brought into the floating state. In addition, the row decoder 230 brings all of the select gate lines SGDs, SGSs into the floating state.

Then, the row decoder 230 not only selects any one of the word lines and applies 0V to the selected word line WL but also brings the unselected word lines WLs into the floating state. In addition, the row decoder 230 applies Vpp1 (18V) to the semiconductor substrate (p-well region 602) in which memory cells are formed. That is, as shown in FIG. 19, 0V is applied to the selected word line WL0 and the unselected word lines WL1 to WL3 are brought into the floating state. Moreover, all of the select gate lines SGD0 to SGD3, SGS to SGS3 are brought into the floating state.

Then, the potential difference between all of the memory cell transistor MT connected to the selected word line WL and the semiconductor substrate is 18V, causing the electrons in the floating gate to be pulled out into the semiconductor substrate. As a result, the data is erased from the memory cell transistors MTs connected to the selected word line, with the result that the threshold value of the memory cell transistors MTs becomes negative. That is, as shown in FIG. 19, electrons are pulled out of the floating gates of all the memory cell transistors MTs connected to the word line WL0 into the semiconductor substrate, thereby erasing the data.

In the memory cell transistors MTs connected to the unselected word lines, the potential of the word lines WLs rises to about 18V because of coupling with the semiconductor substrate. As a result, electrons are not pulled out of the floating gate, with the result that the data is not erased. That is, as shown in FIG. 19, the potentials of the word lines WL1 to WL3 rise by coupling. As a result, the data is not erased from all of the memory cell transistors MTs connected to the word lines WL1 to WL3. In addition, the potentials of the select gate lines also rise to about 18V by coupling, which prevents voltage stress from being applied to the gate insulating film of the select transistor ST.

As described above, the data is erased simultaneously from the selected page. In the example of FIG. 19, while the data has been erased from (one page of) the memory cell transistors connected to one word line, the data may be erased simultaneously from the memory cell transistors connected to a plurality of word lines. In this case, the row decoder 230 applies 0V to a plurality of word lines.

<<Read Operation>>

A read operation will be explained by reference to FIG. 5 and FIG. 20. FIG. 20 is a circuit diagram of the memory cell array 210 of the 3Tr-NAND flash memory 200. For simplification, FIG. 20 shows a case where the number of memory cells is (4×4). FIG. 20 shows a case where the data is read from the memory cell transistor MT connected to the bit line BL1 and word line WL0.

First, the row decoder 230 selects select gate lines SGD, SGS to which a memory cell to be read from is connected and applies, for example, 4.5V to the selected select gate lines SGD, SGS. In addition, the row decoder 230 makes unselect the other select gate lines SGDs, SGSs and applies 0V to the unselected select gate lines SGDs, SGSs. As a result, the select transistors ST1, ST2 connected to the selected select gate lines SGD, SGS are brought into the on state. Then, the row decoder 230 applies 0V to all of the word lines WLs. That is, as shown in FIG. 20, 4.5V is applied to the selected select gate lines SGD0, SGS0 and 0V is applied to the unselected select gate lines SGD1 to SGD3, SGS1 to SGS3. As a result, the select transistors ST1, ST2 connected to the selected select gate lines SGD0, SGS0 are brought into the on state. In addition, 0V is applied to all of the word lines WL0 to WL3.

Since the memory cell transistor MT has a negative threshold value if the data written in it is "1," the transistor MT is in the on state. Since the memory cell transistor MT has a positive threshold value if the data written in it is "0," the transistor MT is in the off state.

In this state, for example, 2.0V is applied to the selected bit line BL. Then, if the data written in the memory cell transistor MT connected to the selected select gate lines SGD, SGS is "1," current flows from the bit line to the source line. On the other hand, if the data written in the memory cell transistor MT is "0," no current flows. In the example of FIG. 20, 2.0V is applied to the selected bit line BL1. Then, if the data written in the memory cell transistor MT connected to the word line WL0 and selected bit line BL1 is "1," current flows from the bit line BL1 to the source line SL. On the other hand, if the data written in the memory cell transistor MT is "0," no current flows.

As described above, the bit line potential varying with the current flowing from the bit line to the source line is amplified by the sense amplifier 240, thereby reading the data. While the data has been read from one bit line in the example of FIG. 20, a potential may be applied to a plurality of bit lines, thereby reading the data from a plurality of memory cell transistors simultaneously.

<Operation of 2Tr Flash Memory>

Next, the operation of the 2Tr flash memory 300 will be explained. Unlike the NAND flash memory 100 and 3Tr-NAND flash memory, the 2Tr flash memory uses not only a positive voltage but also a negative voltage.

<<Write Operation>>

Figure 21:
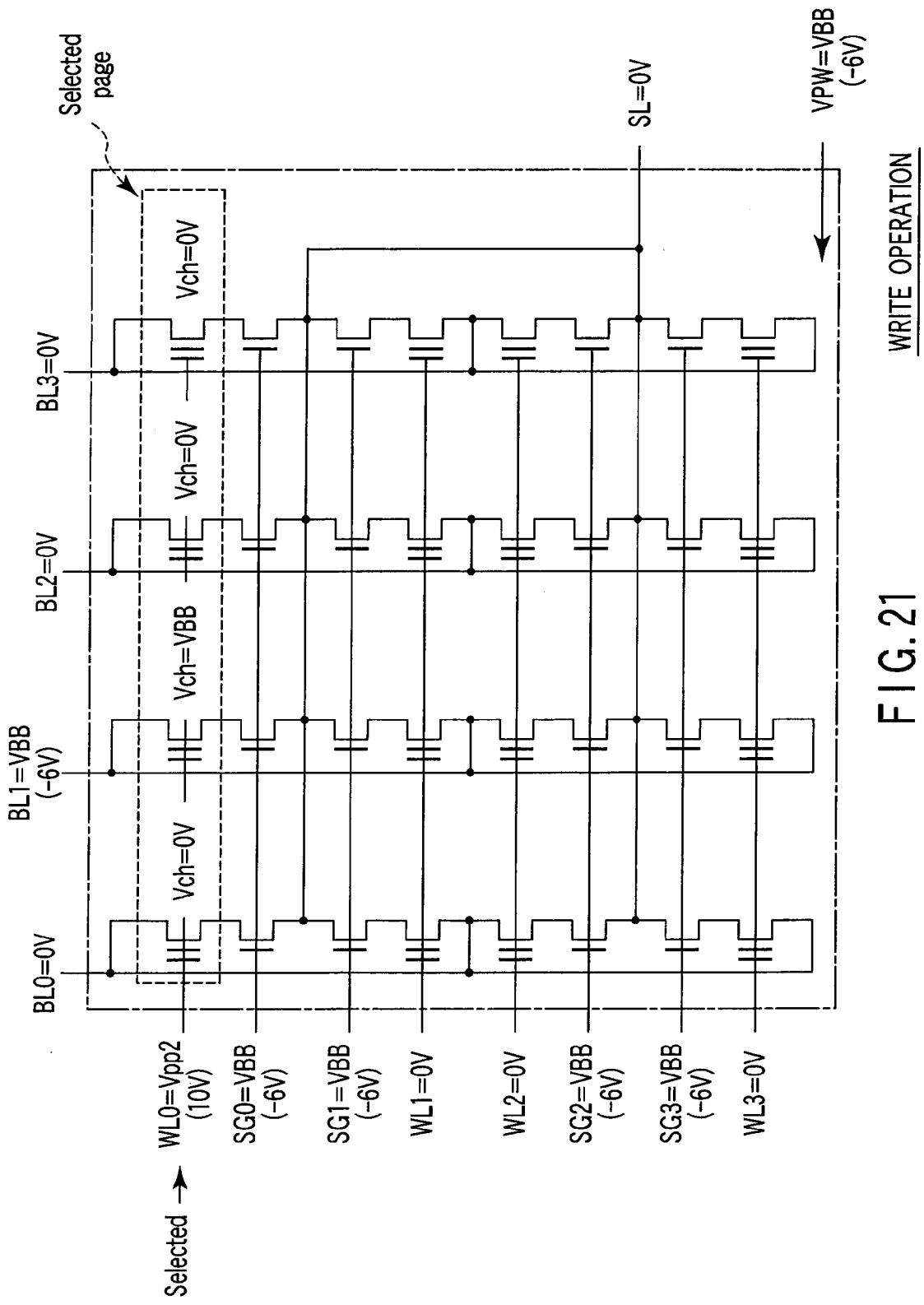
FIG. 21 is a circuit diagram of a memory cell array included in a 2Tr flash memory according to the first embodiment, showing a write operation.

A write operation will be explained by reference to FIG. 8 and FIG. 21. FIG. 21 is a circuit diagram of the memory cell array 310 of the 2Tr flash memory 300. For simplification, FIG. 21 shows a case where the number of memory cells is (4×4). Data is written simultaneously into all of the memory cells connected to any one of the word lines. Either "0" data or "1" data is written, depending on whether electrons are injected into the floating gate of the memory cell transistor MT. Electrons are injected into the floating gate by FN tunneling. In FIG. 21, it is assumed that data is written into the memory cell transistors MTs connected to word line WL0. Of the memory cell transistors MTs, "0" data is written into the memory cell transistor MT connected to bit line BL1 and "1" data is written into the memory cell transistors MTs connected to bit lines BL0, BL2, BL3.

First, in FIG. 8, writing data ("1" or "0") is inputted from an I/O terminal (not shown). Then, the write circuit 350 latches the writing data on a bit line basis. If "1" data is inputted, the write circuit 350 applies 0V to the bit line. Conversely, if "0" data is inputted, the write circuit 350 applies VBB (e.g., −6V) to the bit line. As shown in FIG. 21, VBB is applied to the bit line BL1 and 0V is applied to the bit lines BL0, BL2, BL3.

Then, the row decoder 330 selects any one of the word lines WL0 to WLm and applies Vpp2 (e.g., 10V) to the selected word line. In addition, the row decoder 330 applies VBB to the select gate lines SG0 to SGm and to the memory cell substrate (p-well region 602). Therefore, all of the select transistors STs are in the off state. As a result, the select transistors STs are separated electrically from the source lines SLs. In the example of FIG. 21, the row decoder 330 applies Vpp2 to the selected word line WL0, 0V to the unselected word lines WL1 to WL3, and VBB to all of the select gate lines SG0 to SG3.

As a result, the potential corresponding to "1" data or "0" data is applied to the drain regions of the memory cell transistors MTs via the bit lines BL0 to BLn. Then, Vpp2 is applied to the selected word line WL, 0V is applied to the drain region of a memory cell transistor MT into which "1" data is to be written, and VBB is applied to the drain region of a memory cell transistor MT into which "0" data is to be written. Therefore, in the memory cell transistor MT into which "1" data is to be written, the potential difference (10V) between the gate and drain is insufficient, no electron is injected to the floating gate, with the result that the memory cell transistor MT holds the negative threshold. On the other hand, in the memory cell transistor MT into which "0" data is to be written, the potential difference (16V) between the gate and drain is large, electrons are injected to the floating gate by FN tunneling, with the result that the threshold of the memory cell transistor MT changes to positive. As described above, the data is written into one page of memory cells MCs simultaneously. In the example of FIG. 21, "0" data is written into the memory cell transistor MT connected to the word line WL0 and bit line BL1 (electrons are injected into the floating gate) and "1" data is written into the memory cell transistors MTs connected to the word line WL0 and bit lines BL0, BL2, BL3 (no electron is injected into the floating gate). While in FIG. 21, the potential of the source line SL is fixed to 0V, it may be floating. For example, when the select transistor ST is cut off insufficiently, it is desirable that the source line should be made floating.

<<Erase Operation>>

Figure 22:
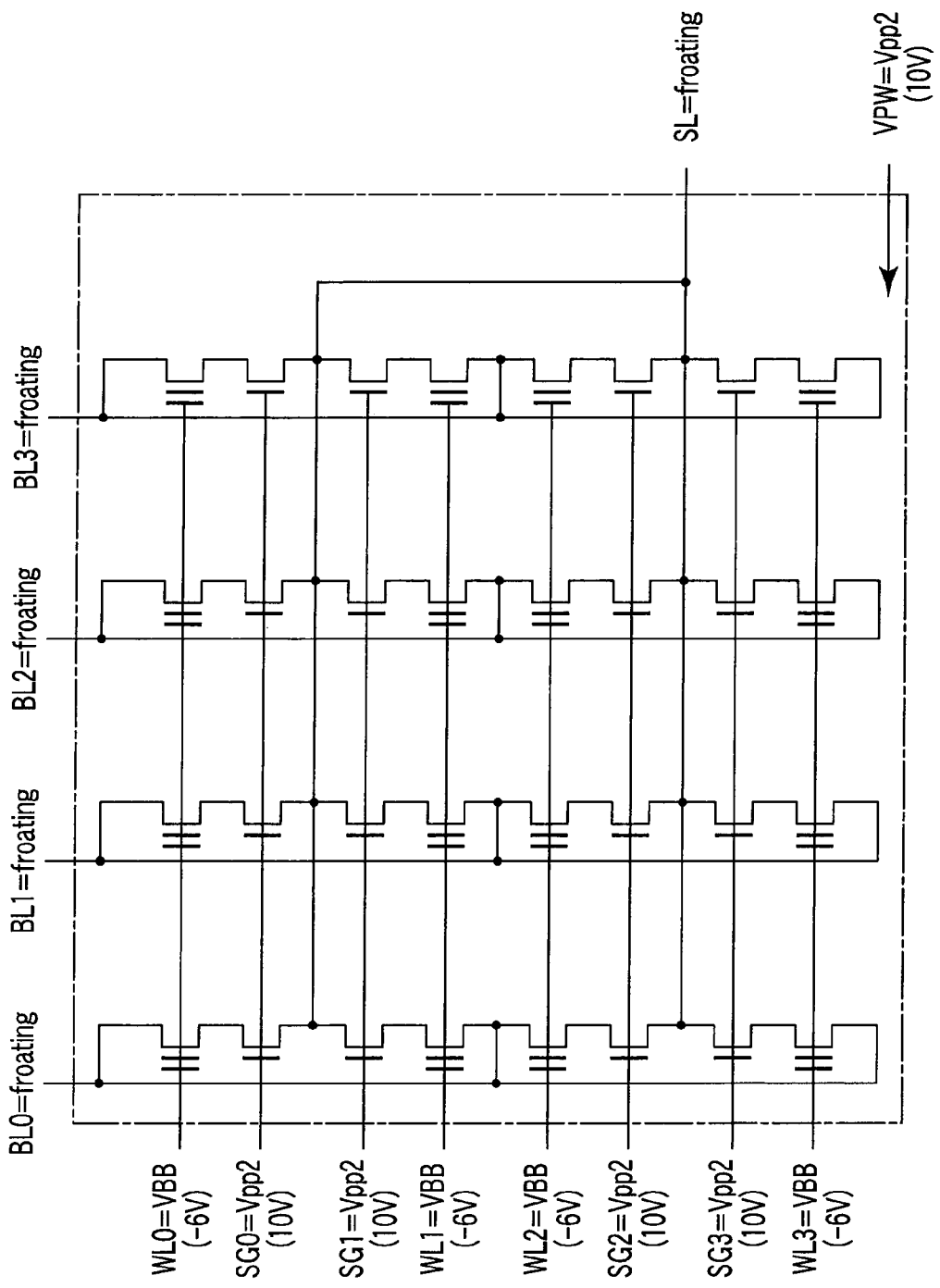
FIG. 22 is a circuit diagram of a memory cell array included in a 2Tr flash memory according to the first embodiment, showing an erase operation.

An erase operation will be explained by reference to FIG. 8 and FIG. 22. FIG. 22 is a circuit diagram of the memory cell array 310 of the 2Tr flash memory 300. For simplification, FIG. 22 shows a case where the number of memory cells is (4×4). Data is erased simultaneously from all the memory cells sharing a well region.

In FIG. 8, the bit lines BL0 to BLn are brought into the floating state. The row decoder 330 sets the potentials of all the word lines WL0 to WLm to VBB and the potential VPW of the semiconductor substrate (p-well region 602) to Vpp (10V). As a result, the electrons are pulled out of the floating gates of the memory cell transistors of the memory cells MCs by FN tunneling. Consequently, the threshold voltages of all the memory cells MCs become negative, thereby erasing the data. In the example of FIG. 22, the row decoder 330 applies VBB to all the word lines WL0 to WL3 and Vpp2 to all the select gate lines SG0 to SG3 and to the p-well region 602. As a result, the electrons are pulled out of the floating gates of all the memory cell transistors MTs at the intersections of the bit lines BL0 to BL3 and the word lines WL0 to WL3.

<<Read Operation>>

Figure 23:
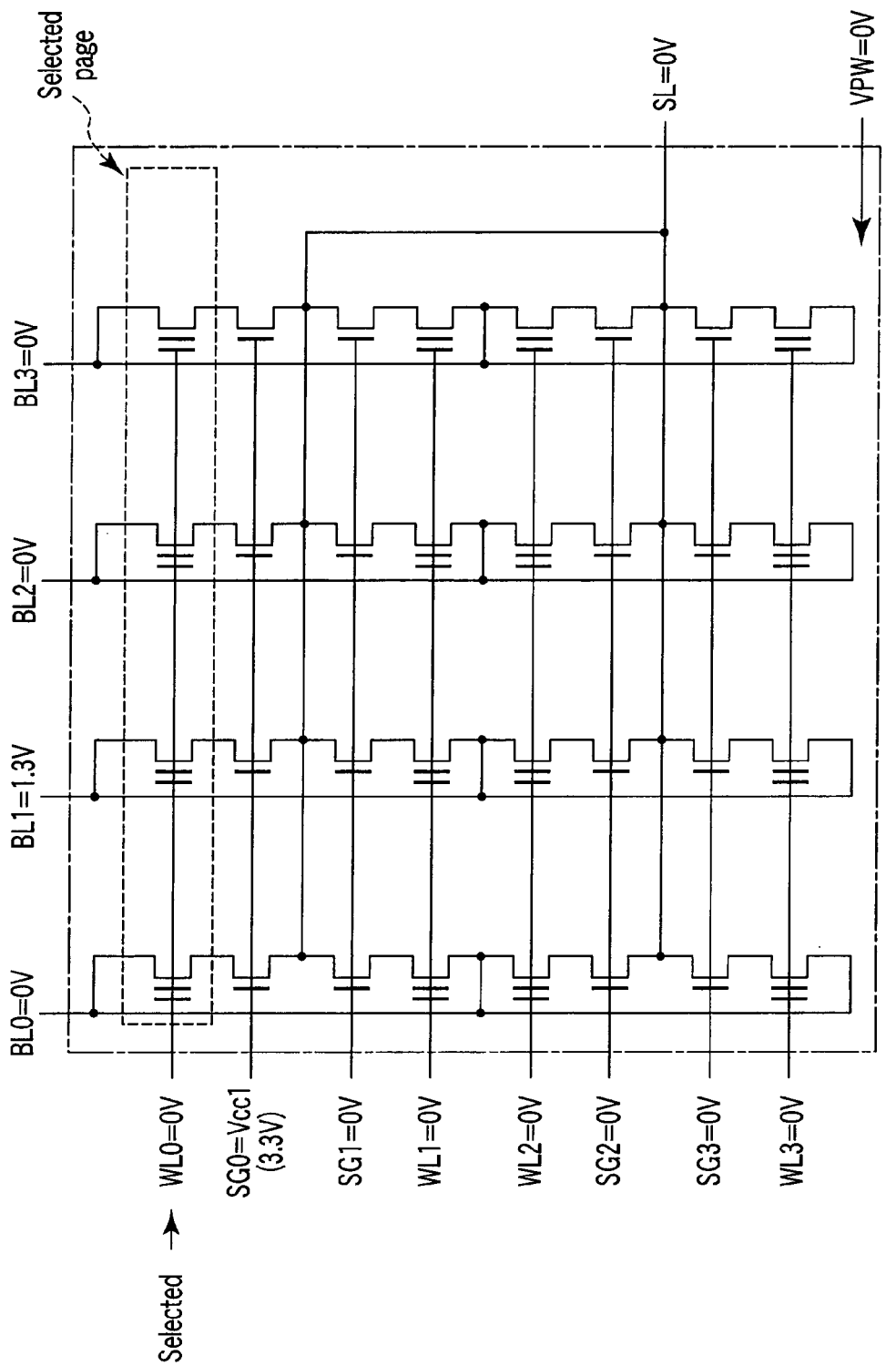
FIG. 23 is a circuit diagram of a memory cell array included in a 2Tr flash memory according to the first embodiment, showing a read operation.

A read operation will be explained by reference to FIG. 8 and FIG. 23. FIG. 23 is a circuit diagram of the memory cell array 310 of the 2Tr flash memory 300. For simplification, FIG. 23 shows a case where the number of memory cells is (4×4). FIG. 23 shows a case where the data is read from the memory cell transistor MT connected to the bit line BL1 and word line WL0.

In FIG. 8, the row decoder 330 selects any one of the select gate lines SG0 to SGm. A high level (Vcc1, for example, 3.3V) is applied to the selected select gate line. All of the unselected select gate lines are at a low level (e.g., 0V). As a result, the select transistor ST connected to the selected select gate line is in the on state and the select transistors ST connected to the unselected select gate lines are in the off state. Therefore, the select transistor ST in the selected memory cell is connected to the source line SL electrically. In addition, the row decoder 330 sets all of the word lines WL0 to WLm at the low level (0V). The source line driver 16 sets the potential of the source line SL at 0V. In the example of FIG. 23, the row decoder 330 applies Vcc1 to the select gate line SG0 and 0V to the other select gate lines SG1 to SG3 and all of the word lines WL0 to WL3.

Then, for example, a voltage of about 1.3V is applied to any one of the bit lines BL0 to BLn. Since the threshold voltage of the memory cell transistor MT of the memory cell MC in which "1" data has been written is negative, the memory cell transistor MT is in the on state. Thus, in the memory cell MC connected to the selected select gate line, current flows from the bit line to the source line SL via the current paths of the memory cell transistor MT and the select transistor ST. On the other hand, since the threshold voltage of the memory cell transistor MT of the memory cell MC in which "0" data has been written is positive, the memory cell transistor MT is in the off state. Thus, no current flows from the bit line to the source line. As a result, the potentials of the bit lines BL0 to BLn vary. The variations are amplified by the sense amplifier 340, thereby carrying out a read operation. As described above, the data is read from one page of memory cells MCs.

In the example of FIG. 23, 1.3V is applied to the bit line BL1. Thus, if the memory cell transistor MT connected to the bit line BL1 and the word line WL0 holds "0" data, current flows from the bit line to the source line. If the memory cell transistor MT holds "1" data, no current flows.

In FIG. 23, while the data has been read from the single bit line BL1, the data may be read from a plurality of bit lines simultaneously. In this case, 1.3V is applied to the plurality of bit lines.

Next, a method of manufacturing an LSI 1 with the above configuration will be explained, particularly centering on the memory cell array of each of the flash memories 100, 200, 300. FIGS. 24 to 35 are sectional views to help explain the processes of manufacturing flash memories 100, 200, 300 included in the system LSI 1 of the first embodiment. FIGS. 24 to 31 are sectional views taken along the word line and FIGS. 32 to 35 are sectional views taken along the bit line.

Figure 24:
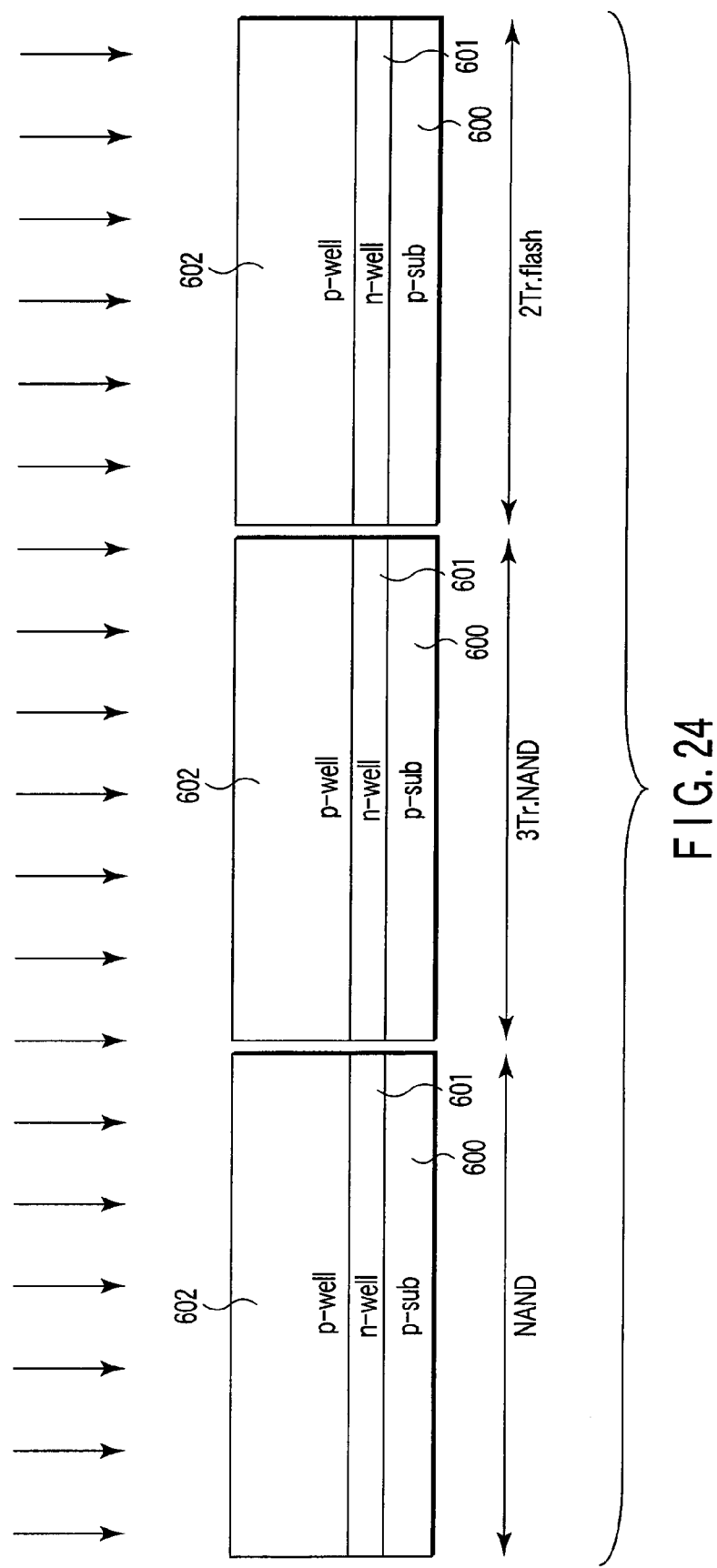

First, n-type impurities, such as arsenic or phosphorus, are ion-implanted into the surface region of the silicon substrate 600. Then, p-type impurities, such as gallium or boron, are ion-implanted into the surface region of the silicon substrate 600, followed by a high-temperature heat treatment, which activates the introduced impurities. As a result, an n-well region 601 is formed in the surface of the silicon substrate 600 and a p-well region 602 is formed in the surface of the n-well region 601 as shown in FIG. 24. The n-well region 601 and p-well region are formed in the flash memories 100, 200, 300 simultaneously. Therefore, the impurity concentration and depth of the n-well region 601 and p-well region 602 are the same in the three flash memories 100, 200, 300.

Figure 25:
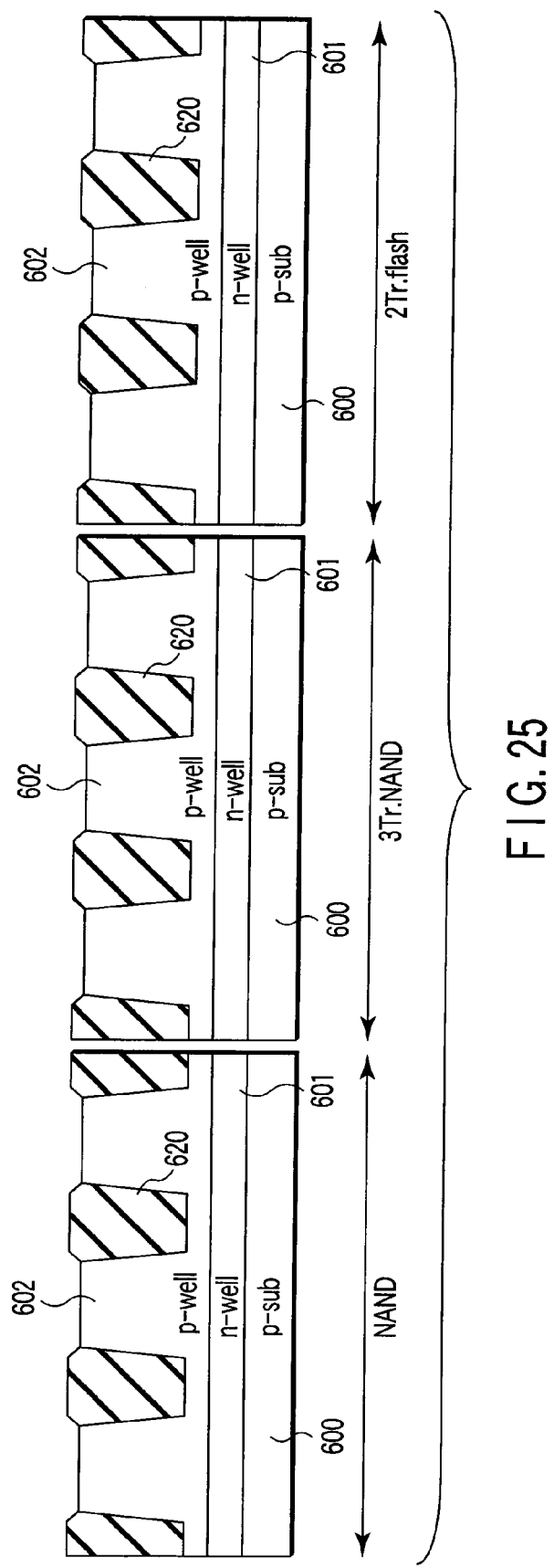

Next, as shown in FIG. 25, in the p-well region 602, element isolating regions 620 are formed by STI (Shallow Trench Isolation) techniques. That is, striped shallow trenches are made in the p-well region 602. The trenches are filled with an insulating film, such as a silicon oxide film. The element isolating regions 620 can be made in the flash memories 100, 200, 300 simultaneously. As a result, striped element regions AAs surrounded by the element isolating regions 620 are formed. The width of the element region AA is 130 nm in the NAND flash memory 100 and 3Tr-NAND flash memory 200, and 150 nm in the 2Tr flash memory 300. The width of the element isolating region 620 is 130 nm in the NAND flash memory 100 and 3Tr-NAND flash memory 200 and 110 nm in the 2Tr flash memory.

Figure 26:
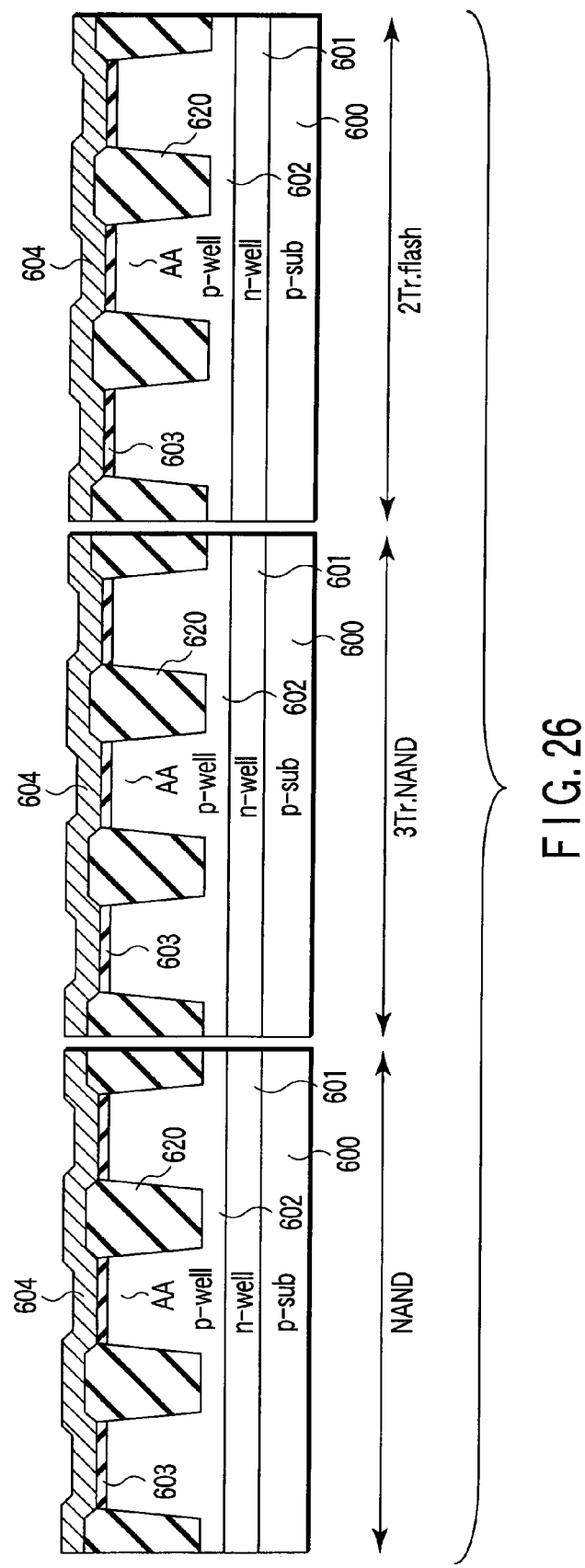

Next, as shown in FIG. 26, a gate insulating film 603 for memory cell transistors MTs and select transistors STs is formed on the p-well region 602. The gate insulating film 603 is, for example, a silicon oxide film formed by thermal oxidation techniques. The thickness of the gate insulating film 603 is, for example, 8 nm. Then, on the gate insulating film 603 and element isolating region 620, an amorphous silicon layer 604 is formed to a thickness of, for example, 60 nm. The amorphous silicon layer 604 functions as the floating gate of the memory cell transistor MT and the select gate of the select transistor ST. The gate insulating film 603 and amorphous silicon layer 604 are formed in the flash memories 100, 200, 300 simultaneously. Therefore, the film thickness of the gate insulating film 603 and amorphous silicon layer 604 are the same in the three flash memories 100, 200, 300.

Figure 27:
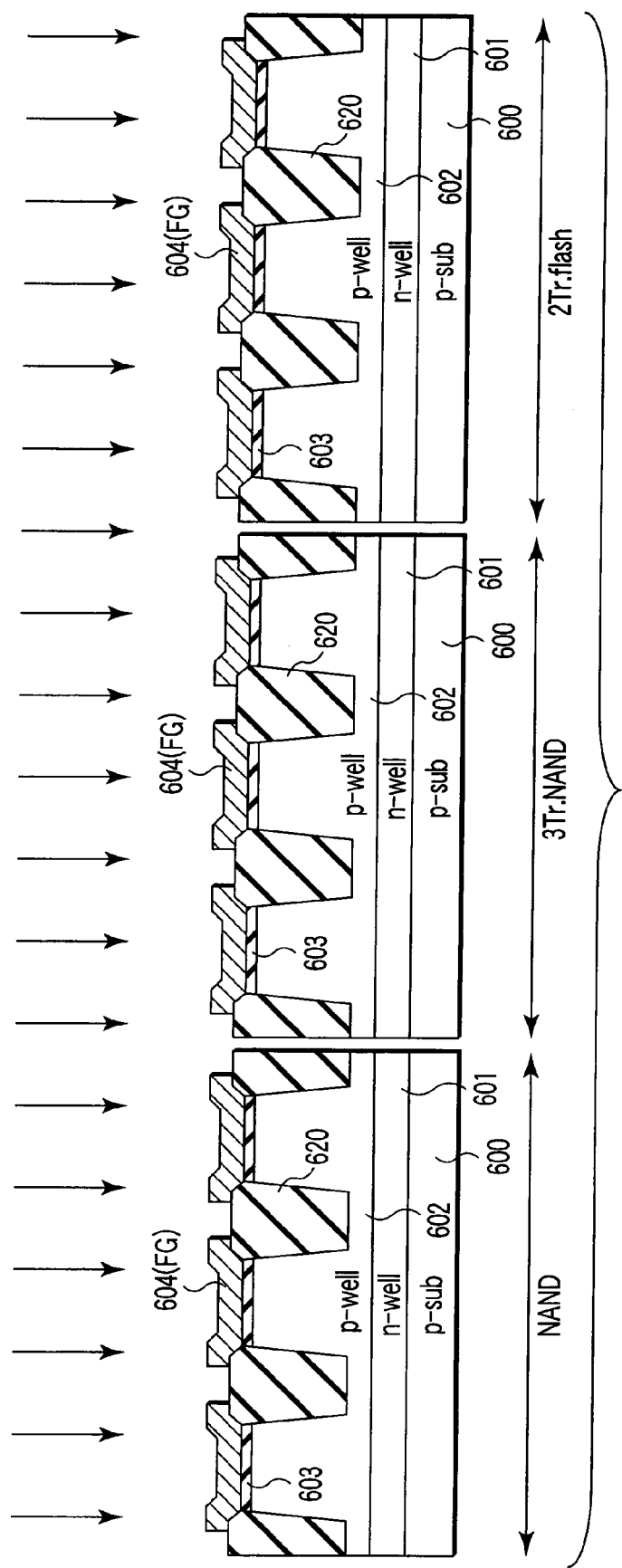

Next, as shown in FIG. 27, the amorphous silicon layer 604 is patterned by photolithographic techniques and anisotropic etching, such as RIE (Reactive Ion Etching). FIG. 27 is a sectional view of the region where word lines are formed. Specifically, in the region where memory cell transistors MTs are formed, the amorphous silicon layer 604 is patterned in such a manner that the floating gates are separated between memory cell transistors adjoining in the word line direction. However, in the region where select transistors ST1, ST2, ST are formed, the amorphous silicon layer 604 is not patterned. The patterning process can be carried out in the three flash memories 100, 200, 300 simultaneously.

Figure 28:
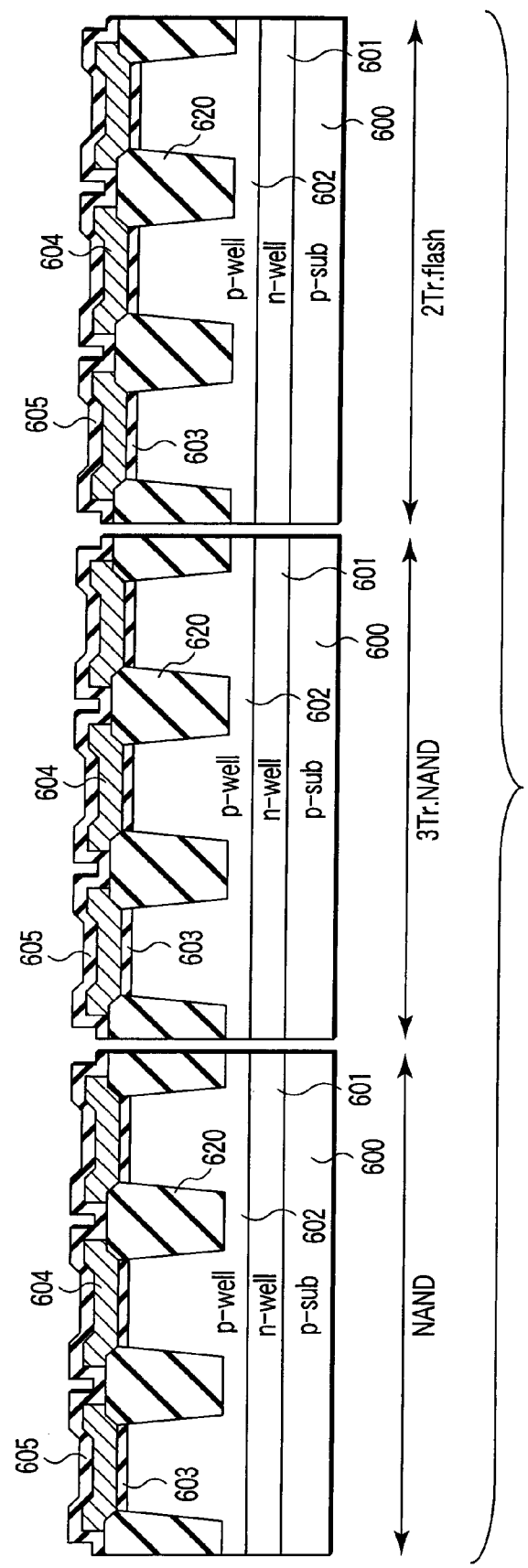

Next, as shown in FIG. 28, an ONO film 605 is formed to a thickness of, for example, 15.5 nm on the amorphous silicon layer 604 by, for example, CVD (Chemical Vapor Deposition) techniques. The ONO film 605, which has a multilayer structure of a silicon oxide film, a silicon nitride film, and a silicon oxide film, functions as an inter-gate insulating film for the memory cell transistor MT and select transistor ST. The ONO film may be replaced with an ON film or NO film, a multilayer film of a silicon oxide film and a silicon nitride film. The inter-gate insulating film 605 is formed in the flash memories 100, 200, 300 simultaneously. Therefore, the film thickness of the inter-gate insulating film 605 is the same in the three flash memories 100, 200, 300.

Next, as shown in FIG. 29, a polysilicon layer 621 is formed to a film thickness of, for example, 40 nm on the inter-gate insulating film 605 by, for example, CVD techniques. The polysilicon layer 621 functions as a part of the word lines and a part of the select gate lines. The polysilicon layer 621 can be formed in the flash memories 100, 200, 300 simultaneously. Therefore, the thickness of the polysilicon layer 621 is the same in the three flash memories 100, 200, 300.

Figure 30:
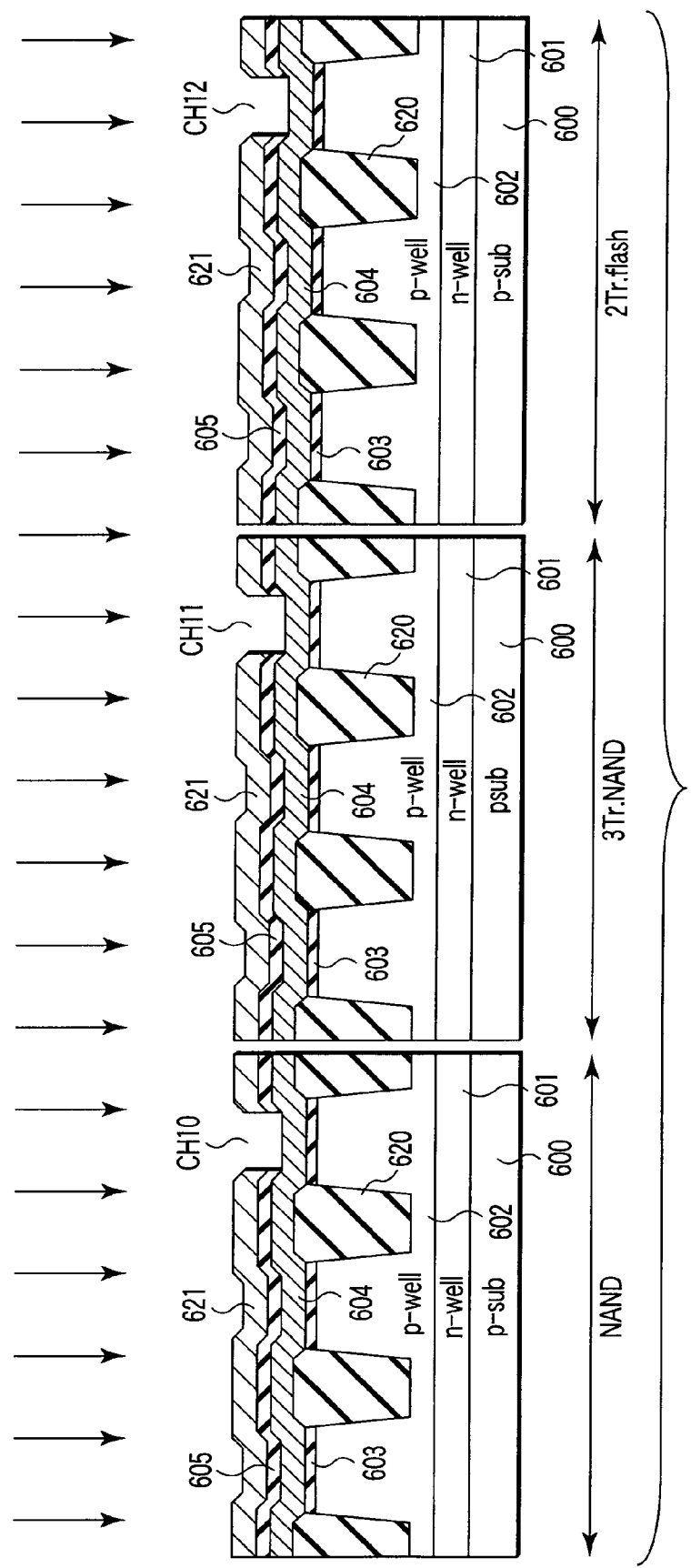

Next, as shown in FIG. 30, a part of the polysilicon layer 621 functioning as a part of the select gate lines and the inter-gate insulating film 605 under the polysilicon layer 621 are removed by photolithographic techniques and RIE. FIG. 30 is a sectional view of a region where select gate lines are formed. As a result, contact holes CH10, CH11, CH12 at whose bottom the amorphous silicon layer 604 is exposed are made in the flash memories 100, 200, 300, respectively. The contact holes CH10 to CH12 are made in the same patterning process simultaneously.

Figure 31:
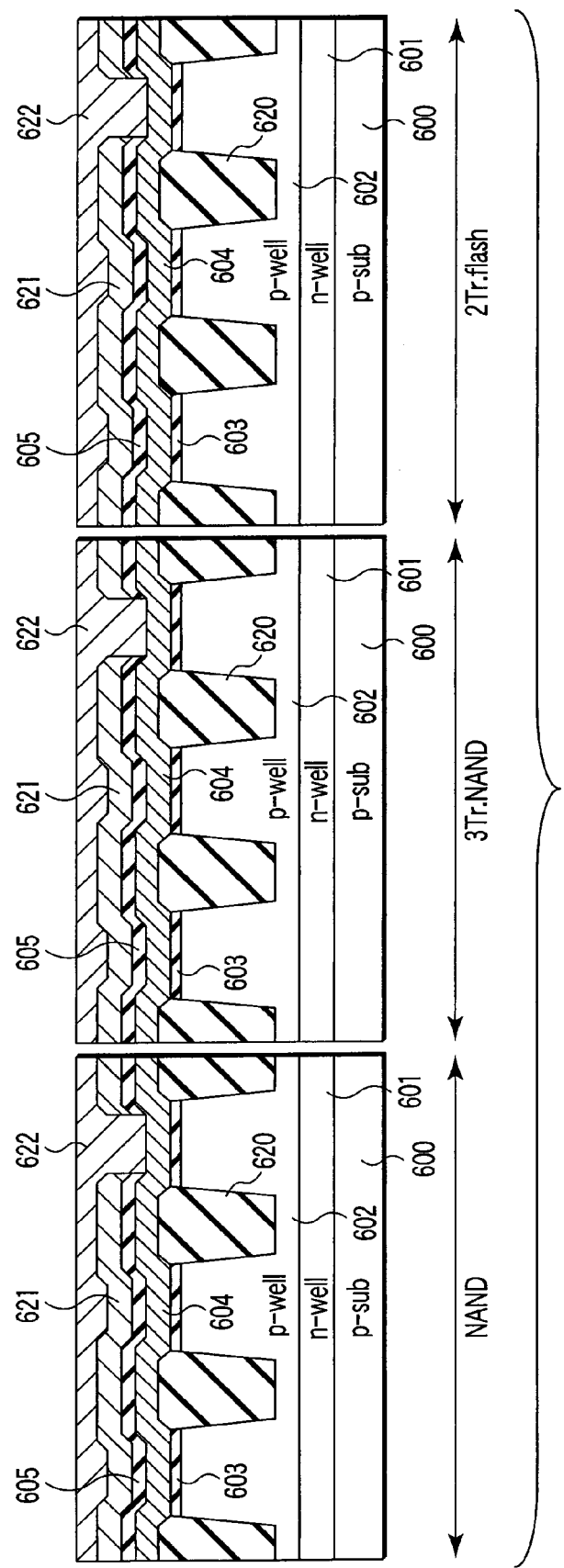

Next, as shown in FIG. 31, a polysilicon layer 622 is formed to a film thickness of, for example, 160 nm on the polysilicon layer 621 by, for example, CVD techniques, thereby filling the contact holes CH10 to CH12. As a result, the polysilicon layer 604 and the polysilicon layers 621, 622 are connected electrically in the select transistors ST1, ST2, ST. The polysilicon layer 622 functions as a part of the word lines and a part of the select gate lines. The polysilicon layer 622 can be formed in the flash memories 100, 200, 300 simultaneously. The polysilicon layers 621, 622 correspond to the polysilicon layer 606 in FIGS. 4, 7, 10, and 14. Therefore, the polysilicon layer 606 is formed in the three flash memories 100, 200, 300 in the same process.

Next, as shown in FIG. 32, the polysilicon layer 606, inter-gate insulating film 605, polysilicon layer 604, and gate insulating film 603 are patterned, thereby forming the gate electrodes of the MOS transistors. The patterning process can be carried out in the three flash memories 100, 200, 300 simultaneously. At this time, photolithography is performed in such a manner that, among the three flash memories, the NAND flash memory 100 has the densest gate pattern. This is because a large number of regular patterns are consecutive in the NAND flash memory 100. In this case, it is desirable that the gate patterns of the 3Tr-NAND flash memory 200 and 2Tr flash memory 300 less regular than that of the NAND flash memory 100 should be patterned with a more margin than that for the NAND flash memory 100. For example, in the NAND flash memory 100, the word line width is 125 nm, the distance between adjacent word lines is 125 nm, and the select gate line width is 225 nm. On the other hand, in the 3Tr-NAND flash memory 200, the word line width, adjacent gate distance, and select gate line width are 250 nm greater than in the NAND flash memory 100. In addition, in the 2Tr flash memory 300, the word line width is 250 nm, the select gate line width is 250 nm, and the distance between a word line and a select gate line adjacent to each other is 250 nm.

Figure 33:
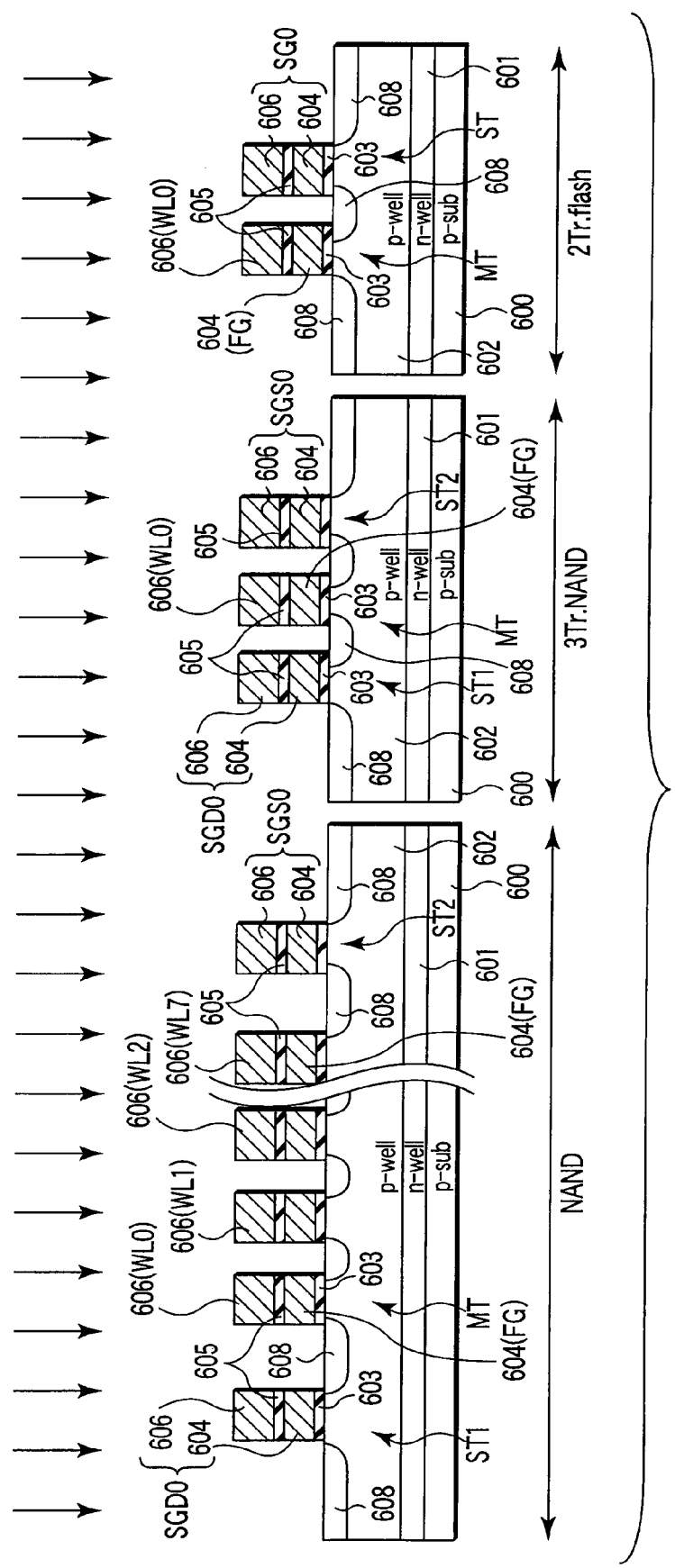

Next, as shown in FIG. 33, with each gate electrode as a mask, n-type impurities are ion-implanted into the surface region of the p-well region 602. The introduced impurities are activated by heat treatment, thereby forming an $n^+$-type impurity diffused layer 608 functioning as the sources or drains of the memory cell transistors MTs and select transistors ST1, ST2. The $n^+$-type impurity diffused layer 608 included in each of the three flash memories 100, 200, 300 can be formed in the same ion implantation process. Therefore, the $n^+$-type impurity diffused layer 608 in each of the flash memories 100, 200, 300 has the same impurity concentration and depth.

Figure 34:
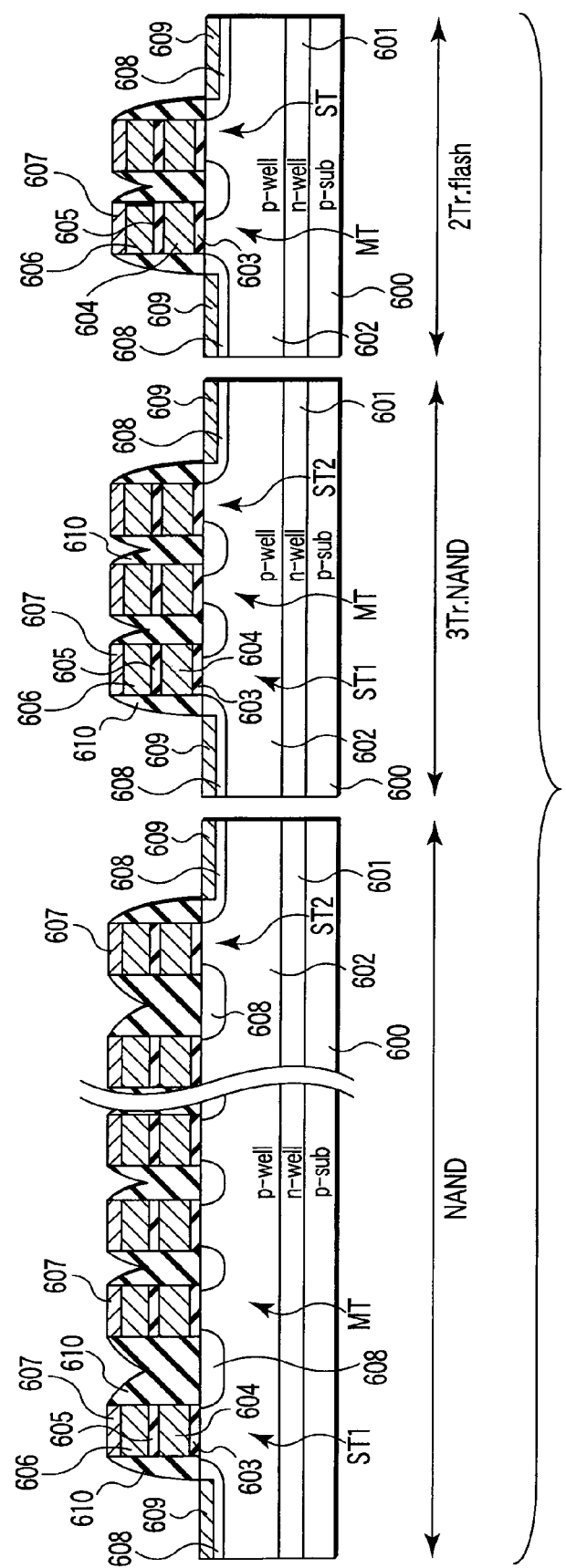

Next, an insulating film 610 is formed on the gates of the memory cell transistors MTs and select transistors STs and on the semiconductor substrate 600. The insulating film 610 is made of, for example, a silicon nitride film. The insulating film 610 fills completely the region between memory cell transistors MTs and the region between the gate of the memory cell transistor MT and the gate of the select transistor ST. Next, the insulating film 610 is etched by RIE techniques or the like. As a result, a sidewall insulating film 610 as shown in FIG. 34 is completed.

Next, a metal layer including a Co layer and a Ti/TiN layer is formed by, for example, sputtering techniques on the gates of the memory cell transistors MTs and select transistors STs, on the sidewall insulating film 610, and on the semiconductor substrate 600 in each of the three flash memories. Then, the metal layer is annealed in an atmosphere of, for example, nitrogen at a temperature of 475° C. As a result, as shown in FIG. 34, a silicide layer ($TiSi_2$, $CoSi_2$) is formed in the silicon layer in contact with the metal layer. That is, the silicide layer 607 is formed at the surface of the polysilicon layer 606 of the gate. The silicide layer 607 is formed at the surfaces of the drain region of the select transistor ST1 and of the source region of the select transistor ST2 in the NAND flash memory 100, at the surfaces of the drain region of the select transistor ST1 and of the source region of the select transistor ST2 in the 3Tr-NAND flash memory 200, and at the surfaces of the drain region of the memory cell transistor MT and of the source region of the select transistor ST in the 2Tr flash memory. Thereafter, the unnecessary metal layer is removed by, for example, wet etching techniques.

As described above, the memory cells in the NAND flash memory 100, 3Tr-NAND flash memory 200, and 2Tr flash memory 300 are completed.

As shown in FIG. 35, on the silicon substrate 600, an interlayer insulating film 611 is formed by, for example, CVD techniques so as to cover the memory cells MCs. The interlayer insulating film 611 is made of, for example, a BPSG (Boron Phosphorous Silicate Glass) film. Then, contact plugs CP1, CP3, CP5, CP7, CP9, CP11 are formed in the interlayer insulating film 611. The contact plugs CP1, CP3 reach the drain region of the select transistor ST1 and the source region of the select transistor ST2 in the NAND flash memory 100. The contact plugs CP5, CP7 reach the drain region of the select transistor ST1 and the source region of the select transistor ST2 in the 3Tr-NAND flash memory 200. The contact plugs CP9, CP11 reach the drain region of the memory cell transistor MT and the source region of the select transistor ST in the 2Tr flash memory 300.

Then, on the interlayer insulating film 611, a metal layer made of, for example, copper or aluminum is formed by CVD techniques or sputtering. Next, the metal layer is patterned into a specific pattern, thereby forming metal wiring layers 611, 612.

Thereafter, an interlayer insulating film, a metal wiring layer, and the like are formed, which completes the system LSI 1 shown in FIGS. 1 to 13.

A semiconductor integrated circuit according to the first embodiment produces the following effects:

(1) It is possible to be embedded a plurality of types of flash memories on a single chip, while suppressing the manufacturing cost.

With the configuration and manufacturing method according to the first embodiment, the memory cell transistors MTs and select transistors ST1, ST2, ST included in the NAND flash memory 100, 3Tr-NAND flash memory 200, and 2Tr flash memory 100 are formed in the same processes. That is, the individual MOS transistors are formed in the same oxidizing process, film-forming process, impurity implanting process, photolithographic etching process. As a result, the gate insulating film 603, inter-gate insulating film 605, the floating gates 604 and control gates of the memory cell transistors MTs, and the select gates 604, 606 of the select transistors are the same in the three flash memories 100, 200, 300. In such a manufacturing method, the memory cell arrays of the three flash memories can be formed by the number of processes required to form a single flash memory. Therefore, the manufacturing cost of a system LSI including three types of semiconductor memories can be reduced.

(2) It is possible to reduce the size of the system LSI, while keeping the processing accuracy of a plurality of types of flash memories.

With the configuration and manufacturing method according to the first embodiment, the patterning (photolithographic) process in forming the gate electrodes is carried out in the three flash memories 100, 200, 300 simultaneously. At this time, the flash memories 100, 200, 300 differ from one another in the pattern of the gate electrode in the memory cell array. Specifically, in the NAND flash memory 100 where a plurality of memory cell transistors MTs are connected in series in a NAND cell, the gate electrodes are repeated in a regular pattern. On the other hand, in the 3Tr-NAND flash memory 200 and 2Tr flash memory 300, the gate electrodes are arranged less regularly than in the NAND flash memory 100. Consequently, the optimum photolithographic condition differs from one flash memory to another. For example, if photolithography has been performed under the optimum condition for the 3Tr-NAND flash memory 200, processing is difficult with the minimum processing dimensions for the flash memories 100, 300 other than the 3Tr-NAND flash memory 200.

In the first embodiment, to overcome this problem, photolithography is performed on the NAND flash memory 100 under the optimum condition. Therefore, in the NAND flash memory 100, for example, the gate length of the memory cell transistor MT is formed with the minimum processing dimensions, which enables miniaturization. As in the first embodiment, when the NAND flash memory 100 is used as a data storage memory, the NAND flash memory 100 takes up a large area in the LSI 1. Therefore, miniaturizing the NAND flash memory 100 enables the chip size of the LSI 1 to be reduced effectively.

When the miniaturization of the NAND flash memory is given priority, photolithography is not necessarily performed on the other flash memories 200, 300 under the optimum condition. Thus, the flash memories 200, 300 have to be designed, taking sufficient misalignment for photolithography into account. For example, it is desirable that the gate length of the memory cell transistor MT in each of the 3Tr-NAND flash memory 200 and 2Tr flash memory 100 should be 1.5 or more times the gate length of the memory cell transistor MT of the NAND flash memory 100. With this configuration, the NAND flash memory 100, 3Tr-NAND flash memory 200, and 2Tr flash memory 300 can be processed with high accuracy. Accordingly, the integration of the 3Tr-NAND flash memory 200 and 2Tr flash memory is lower than that of the NAND flash memory 100. However, the chip size of the LSI is reduced as a whole, because of the percentage of the area they occupy in the entire LSI.

(3) The operation reliability of each flash memory can be improved.

As described above, the way the write inhibit voltage is applied in the NAND flash memory 100 and 3Tr-NAND flash memory 200 differs from that in the 2Tr flash memory 300. In the NAND flash memory 100 and 3Tr-NAND flash memory 200, the channel potential of the memory cell transistor MT is raised to the write inhibit voltage by coupling with the word line. On the other hand, in the 2Tr flash memory 300, the write inhibit voltage is applied from the bit line to the channel of the memory cell transistor MT.

In the case of the NAND flash memory 100, to prevent the channel potential raised by coupling from dropping, leakage current in the select transistor has to be suppressed. This holds true for the 3Tr-NAND flash memory 200. In the 3Tr-NAND flash memory 200, the channel capacity is small because the number of memory cell transistors sandwiched between the select transistors ST1, ST2 is small. Therefore, the amount of charge produced by coupling is smaller than in the NAND flash memory 100. Accordingly, the 3Tr-NAND flash memory 200 is more liable to be affected by leakage current than the NAND flash memory 100.

With the configuration of the first embodiment, the channel width (select gate line width) of each of the select transistors ST1, ST2 of the 3Tr-NAND flash memory 200 is greater than that of the select transistors ST1, ST2 of the NAND flash memory 100. Therefore, leakage current is less liable to flow in the select transistors ST1, ST2 of the 3Tr-NAND flash memory 200, which improves the operation reliability of the 3Tr-NAND flash memory 200.

In addition, since the write inhibit voltage is applied from the bit line in the 2Tr flash memory 300, the 2Tr flash memory 300 is less liable to be affected by leakage current than the NAND flash memory 100 and 3Tr-NAND flash memory 200. However, from the viewpoint of a margin in photolithographic processing, it is desirable that the channel length of the select transistor ST should be about 250 nm.

As described in item (2), the photolithographic processing of word lines is done under the optimum condition in the NAND flash memory 100. Therefore, the channel length of the memory cell transistor MT of the 2Tr flash memory 300 is greater than that of the memory cell transistor of the NAND flash memory. In general, as the channel length becomes greater, the cell current decreases, which results in a decrease in the operating speed.

However, with the configuration of the first embodiment, as shown in FIG. 13, the channel width of the 2Tr flash memory 300 is greater than that of each of the NAND flash memory 100 and 3Tr-NAND flash memory 200. As a result, the cell current flowing through the 2Tr flash memory 300 can be increased. That is, making the channel width greater compensates for an adverse effect on the 2Tr flash memory 300 in miniaturizing the NAND flash memory 100, which improves the operating speed of the 2Tr flash memory.

(4) The performance of the system LSI can be made higher.

The system LSI of the first embodiment has the NAND flash memory 100, 3Tr-NAND flash memory 200, and 2Tr flash memory 300 as described above.

Unlike the NAND flash memory 100 and 3Tr-NAND flash memory 200, the 2Tr flash memory 300 uses a positive voltage (10V) and a negative voltage (−6V) in a write operation and an erase operation. Then, the 2Tr flash memory 300 gives a potential difference of 16V between the control gate and the channel. Therefore, the write inhibit voltage can be set to 0V near the midpoint between the 10V and −6V, which makes it easy to apply the write inhibit voltage from the bit line. Because the positive and negative voltages are used, the potential difference applied to the gate insulating film of the MOS transistors used in the row decoder 330 is 10V or −6V. Therefore, the gate insulating film of the MOS transistors used in the row decoder 330 included in the 2Tr flash memory 300 may be thinner than that of the MOS transistors used in the row decoders 130, 230 included in the NAND flash memory 100 and 3Tr-NAND flash memory 200. Therefore, the row decoder can be made more compact. In addition, the operating speed of the row decoder 330 can be made faster than that of the row decoders 130, 230. Accordingly, coupled with the effect in item (3), the operating speed of the 2Tr flash memory can be improved and the random access can be made faster.

In the first embodiment, the program data for the MCU 400 to operate is stored in the 2Tr flash memory 300. The 2Tr flash memory can operate at high speed as described above. Thus, the data can be read directly from the 2Tr flash memory 300 without the intervention of the MCU 400 or RAM. As a result, a RAM or the like is not needed, which helps simplify the configuration of the system LSI and improve the operating speed.

In addition, the 3Tr-NAND flash memory 200 holds an ID code and a security code. These code data are not so large in the amount of data, but are frequently changed and updated. Thus, the memory to hold the code data is required to operate at some high speed. In this respect, the 3Tr-NAND flash memory 200 has a smaller erase unit than that of the NAND flash memory 100 and can rewrite the data in pages. Therefore, it can be said that the 3Tr-NAND flash memory 200 is the preferable semiconductor memory to hold the code data.

A conventional LSI including a NAND flash memory requires the following controller to prevent rewriting from concentrating on a specific block. The controller converts addresses inputted in ware leveling or logic form into physical addresses or, when a block malfunctions, determines the block to be faulty and performs control to prevent the faulty block from being used. In the first embodiment, however, such a controller is not needed. The reason is that the 2Tr flash memory 300 is caused to hold a firmware program to control the blocks in the NAND flash memory 100 and the MCU 400 is caused to perform such control. The MCU 400 performs the control in an interval of time between its original jobs (such as the process of controlling an external device or the process of computing the data inputted to the NAND flash memory 100). Of course, when the comparison of the capacity of the MCU 400 with the amount of work the MCU 400 has to process has shown that the amount of work has exceeded the capacity, a hardware sequencer or the like may be provided to control the NAND flash memory 100.

Figure 36:
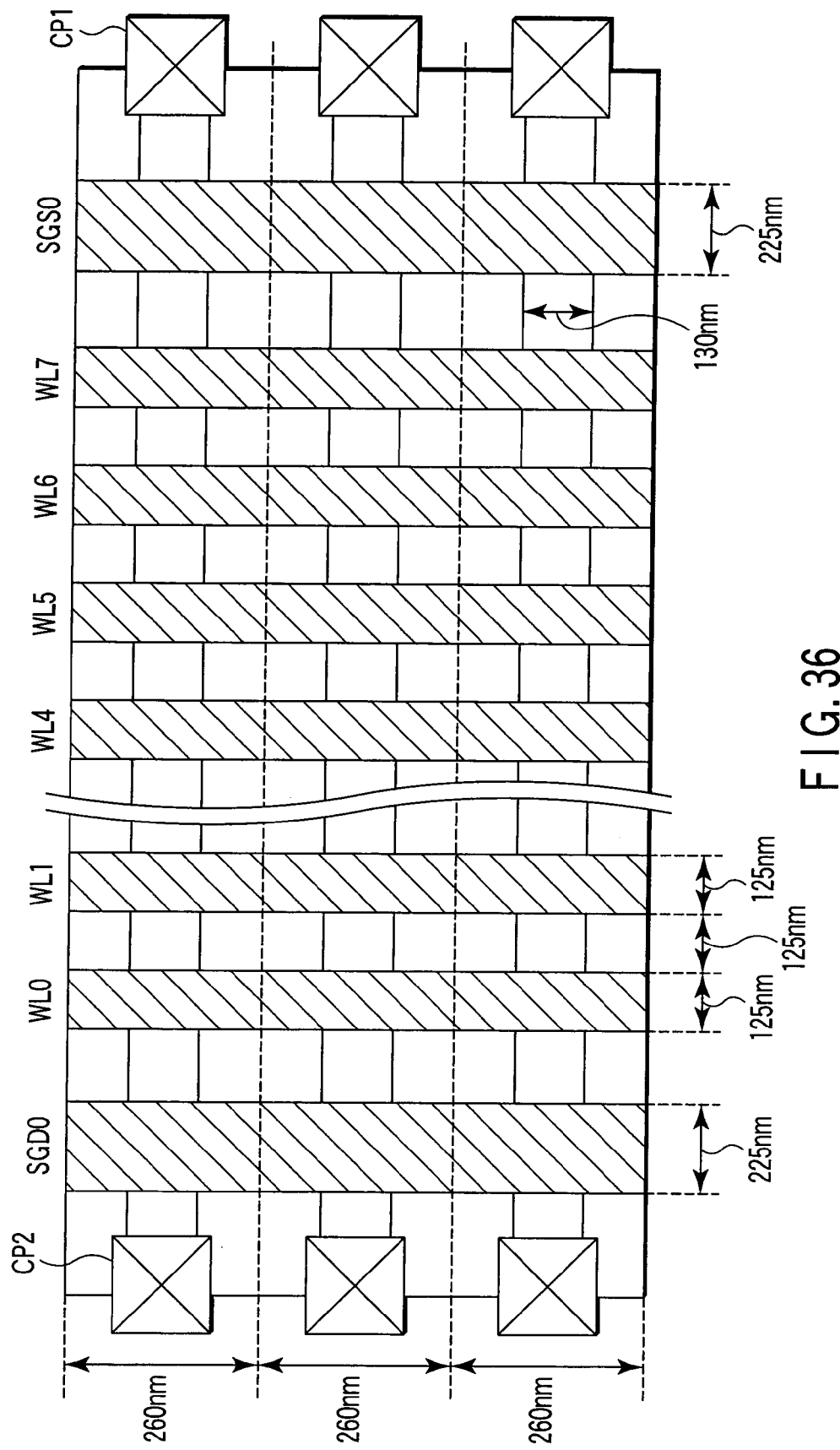
FIG. 36 is a plan view of a memory cell array of a NAND flash memory according to a second embodiment of the present invention.
Figure 37:
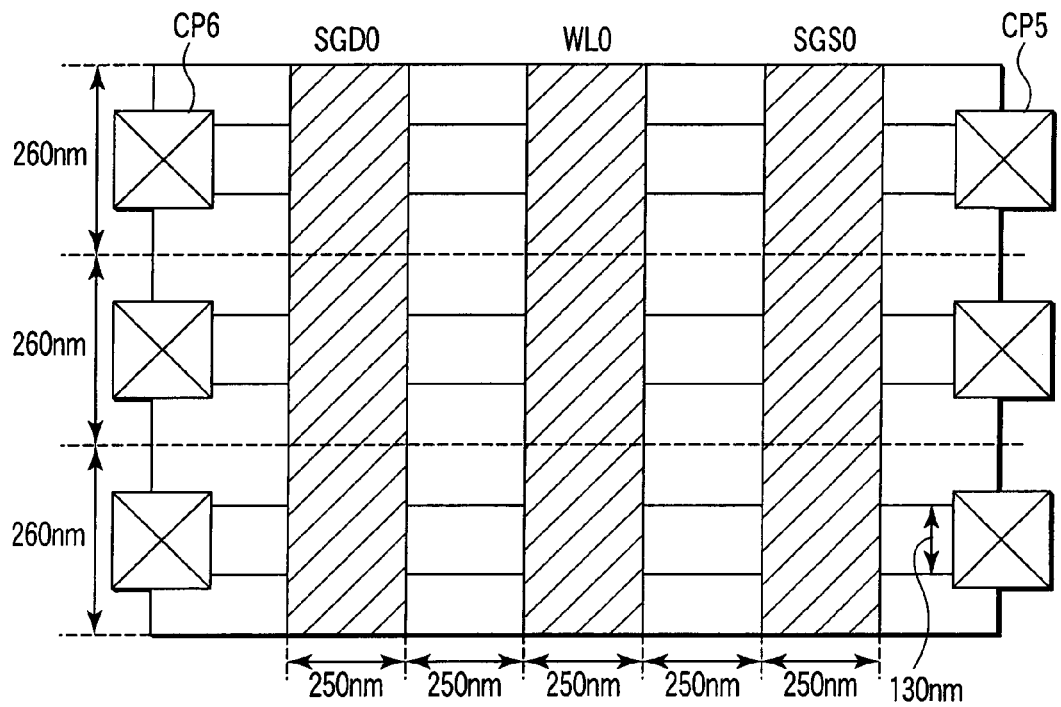
FIG. 37 is a plan view of a memory cell array of a 3Tr-NAND flash memory according to the second embodiment.
Figure 38:
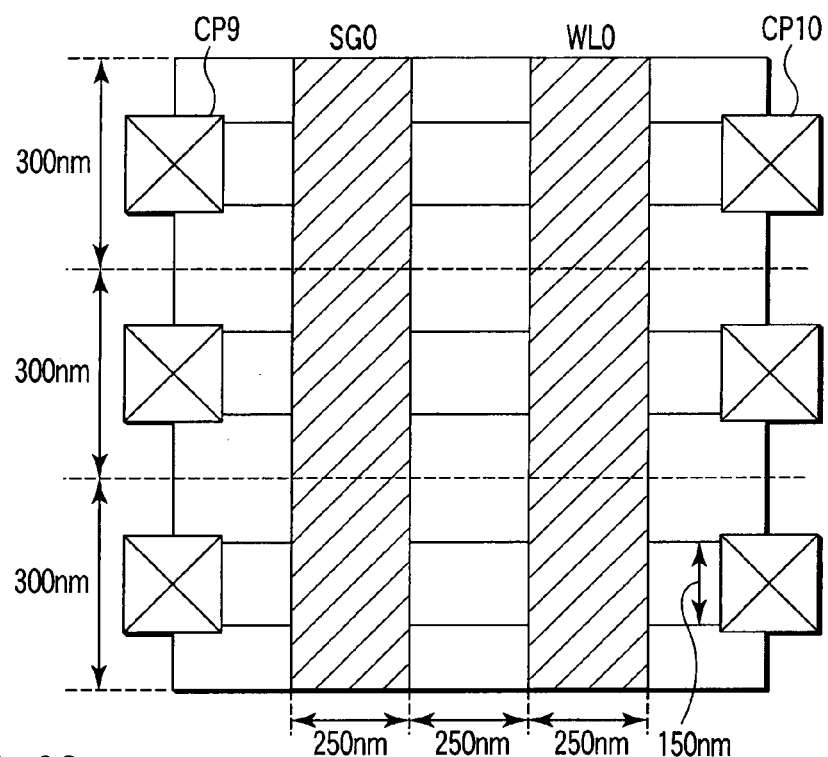
FIG. 38 is a plan view of a memory cell array of a 2Tr flash memory according to the second embodiment.

Next, a semiconductor integrated circuit device according to a second embodiment of the present invention will be explained. The second embodiment is such that the cell width is made greater in the column direction in the memory cell array of the 2Tr flash memory 300 included in a system LSI of the first embodiment. FIGS. 36 to 38 are plan views of part of the memory cell arrays 110, 210, 310 of the NAND flash memory 100, 3Tr-NAND flash memory 200, and 2Tr flash memory 300, included in a system LSI 1 according to the second embodiment.

As shown in the figures, the NAND flash memory 100 and 3Tr-NAND flash memory 200 are as explained in the first embodiment. Specifically, in the NAND flash memory 100, the width of the element region (channel width) is set to, for example, 130 nm, the widths of the select gate lines SGS, SGD (the channel lengths of the select transistors ST1, ST2) are set to, for example, 225 nm, the width of the word line WL (the channel length of the memory cell transistor MT) is 125 nm, and the distance between adjacent word lines WL is set to, for example, 125 nm. The width per NAND cell in the row direction is, for example, 260 nm. Therefore, in a NAND cell, an element region AA with a width of 130 nm is sandwiched between element isolating regions 620 with a width of 65 nm.

The 3Tr-NAND flash memory 200 is the same as in the first embodiment. Specifically, the width of the element region (channel width) is set to, for example, 130 nm, the widths of the select gate lines SGS, SGD (the channel lengths of the select transistors ST1, ST2) are set to, for example, 250 nm, the width of the word line WL (the channel length of the memory cell transistor MT) is 250 nm, and the distance between a select gate line and a word line is set to, for example, 250 nm. The width per memory cell in the row direction is, for example, 260 nm. Therefore, in a memory cell, an element region AA with a width of 130 nm is sandwiched between element isolating regions 620 with a width of 65 nm.

In the 2Tr flash memory 300, the width of the element region (channel width) is set to, for example, 150 nm, the width of the select gate line SG (the channel length of the select transistor ST) is set to, for example, 250 nm, the width of the word line WL (the channel length of the memory cell transistor MT) is 250 nm, and the distance between a select gate line and a word line is set to, for example, 250 nm. The width per memory cell in the column direction is, for example, 300 mm. Therefore, in a memory cell, an element region AA with a width of 150 nm is sandwiched between element isolating regions 620 with a width of 75 nm.

The LSI of the second embodiment produces not only the effects in items (1) to (4) explained in the first embodiment but also the effect in item (5).

(5) The operating performance of the system LSI can be improved.

The channel width of the 2Tr flash memory 300 according to the first and second embodiments is made greater than that in each of the NAND flash memory 100 and 3Tr-NAND flash memory 200. If the 2Tr flash memory 300 has the same cell width as that of each of the NAND flash memory 100 and 3Tr-NAND flash memory 200, the width of the element isolating region becomes narrower. If the channel width is increased too much, this might lead to an insufficient electrical isolation between the element regions or make the formation of element isolating regions difficult.

However, in the 2Tr flash memory 300 of the second embodiment, the width in the row direction is made greater than that in each of the NAND flash memory 100 and 3Tr-NAND flash memory 200. Therefore, the width of the element isolating region can be made greater, which simplifies the processes and enables a reliable electrical isolation between the element regions. In addition, the width of the element region (channel width) can be made greater than in a case where the cell width is the same as that in each of the NAND flash memory 100 and 3Tr-NAND flash memory 200. As a result, the current caused to flow by a memory cell can be increased further, which improves the operating performance of the 2Tr flash memory.

As described above, the 2Tr flash memory 300 holds a program and others needed to operate the MCU 400. Therefore, the capacity of the 2Tr flash memory may be smaller than that of the NAND flash memory 100 used for data storage. For example, if the memory capacity of the NAND flash memory 100 is 128 megabits, the memory capacity of the 2Tr flash memory 300 is about 16 megabits. That is, the area occupied by the 2Tr flash memory 300 in the LSI 1 is much smaller than that occupied by the NAND flash memory 100. Therefore, even if the channel width of the memory cell in the 2Tr flash memory 300 is increased, the increase of the area of the LSI can be kept to a minimum.

Figure 39:
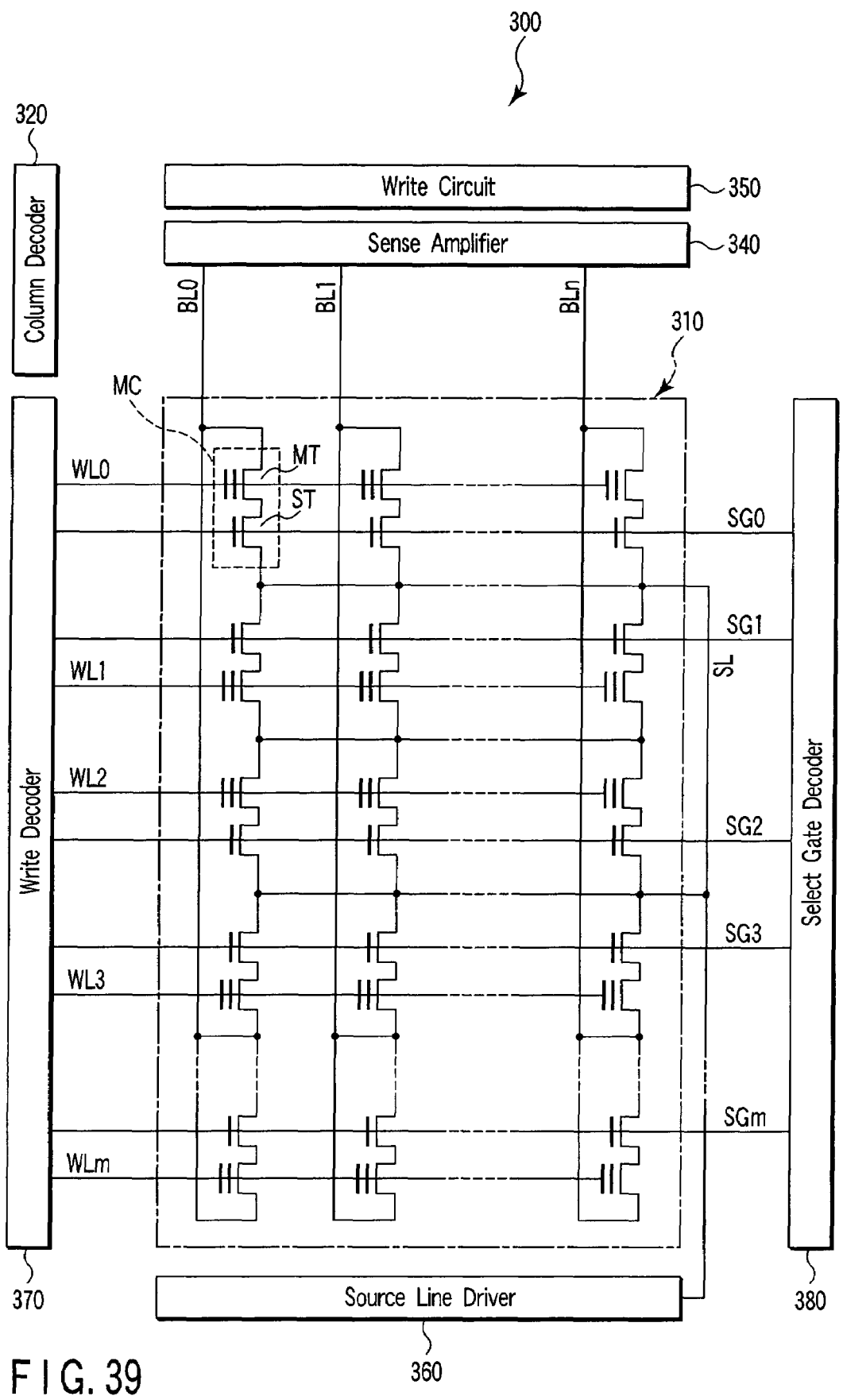
FIG. 39 is a block diagram of a 2Tr flash memory according to a third embodiment of the present invention.

Next, a semiconductor integrated circuit device according to a third embodiment of the present invention will be explained. The third embodiment is such that the row decoder 330 is divided into a write decoder and a read decoder in the 2Tr flash memory 300 explained in the first and second embodiments. FIG. 39 is a block diagram of a 2Tr flash memory 300 included in a system LSI 1 according to the third embodiment.

As shown in FIG. 39, the configuration of the 2Tr flash memory 300 of the third embodiment is such that the row decoder 330 is eliminated and a write decoder 370 and a select gate decoder 380 are added in the configuration of FIG. 8 explained in the first embodiment. In other words, the row decoder 330 includes the write decoder 370 and the select gate decoder 380.

The write decoder 370 selects any one of the word lines WL0 to WLm in a write operation and applies a positive potential of Vpp2 to the selected word line. In an erase operation, the write decoder 370 applies a negative potential of VBB to all of the word lines. In a read operation, the write decoder 370 applies the negative potential VBB to all of the select gate lines SG0 to SGm.

The select gate decoder 380 selects any one of the select gate lines SG0 to SGm in a read operation and applies a positive potential to the selected select gate line.

Next, the write decoder 370 and select gate decoder 380 will be explained by reference to FIG. 40. FIG. 40 is a circuit diagram of the write decoder, select gate decoder, and a part of the memory cell array in the third embodiment.

First, the configuration of the select gate decoder 380 will be explained. The select gate decoder 380 includes a row address decode circuit 730 and a switch element group 720. The row address decode circuit 730, which operates on a power supply voltage of Vcc1 (nearly equal to 3.3V), decodes (i+1)-bit row address signals RA0 to RAi, thereby producing a row address decode signal. The row address decode circuit 730 has NAND circuits 731 and inverters 732 provided for select gate lines SG0 to SGm in a one-to-one correspondence. The NAND circuit 731 NANDs each bit in the row address signals RA0 to RAi. Then, the inverter 732 inverts the result of the NAND operation and outputs the resulting signal as a row address decode signal.

The switch element group 720 has n-channel MOS transistors 721. The n-channel MOS transistors 721 are provided for the select gate lines SG0 to SGm in a one-to-one correspondence. Then, the outputs of the inverters 732 are supplied to the select gate lines SG0 to SGm via the current paths of the n-channel MOS transistors 721 in a one-to-one correspondence. A control signal ZISOG is inputted to the gates of the n-channel MOS transistors 721.

Next, the configuration of the write decoder 370 will be explained. The write decoder 370 includes a row address decode circuit 700 and a switch element group 710. The row address decode circuit 700 decodes (i+1)-bit row address signals RA0 to RAi, thereby producing a row address decode signal. The row address decode signal is supplied to the word lines WL0 to WLm. The row address decode circuit 700 has NAND circuits 701 and inverters 702 provided for word lines WL0 to WLm in a one-to-one correspondence. The NAND circuit 701 and inverter 702 have their positive power supply voltage nodes connected to a power supply voltage node VCGNW and their negative power supply voltage nodes connected to a power supply voltage node VCGPW. They NANDs each bit in the row address signals RA0 to RAi. A positive voltage of Vpp2 and a negative voltage of VBB or 0V generated by a boosting circuit (not shown) are applied to the power supply voltage nodes VCGNW and VCGPW, respectively. Then, the inverter 702 inverts the result of the NAND operation and outputs the resulting signal as a row address decode signal.

The switch element group 710 has inverters 711 and n-channel MOS transistors 712. The inverters 711 and n-channel MOS transistors 712 are provided for the select gate lines SG0 to SGm in a one-to-one correspondence. A control signal PRGH is inputted to the inverter 711. The inverters 711 invert the control signal PRGH. The control signal PRGH is made high in a write operation. Each of the inverter 711 has its positive power supply voltage node connected to a VNW node and its negative power supply voltage to a power supply node VSGPW node. The VNW node is applied with, for example, 0V and the power supply voltage node VSGPW node is applied with the negative voltage VBB. One end of the current path of the n-channel MOS transistor 712 is connected to the output node of the inverter 711. The other end of the current path is connected to the corresponding one of the select gate lines SG0 to SGm. A control signal WSG is inputted to the gate of each of the n-channel MOS transistors 712.

Figure 41:
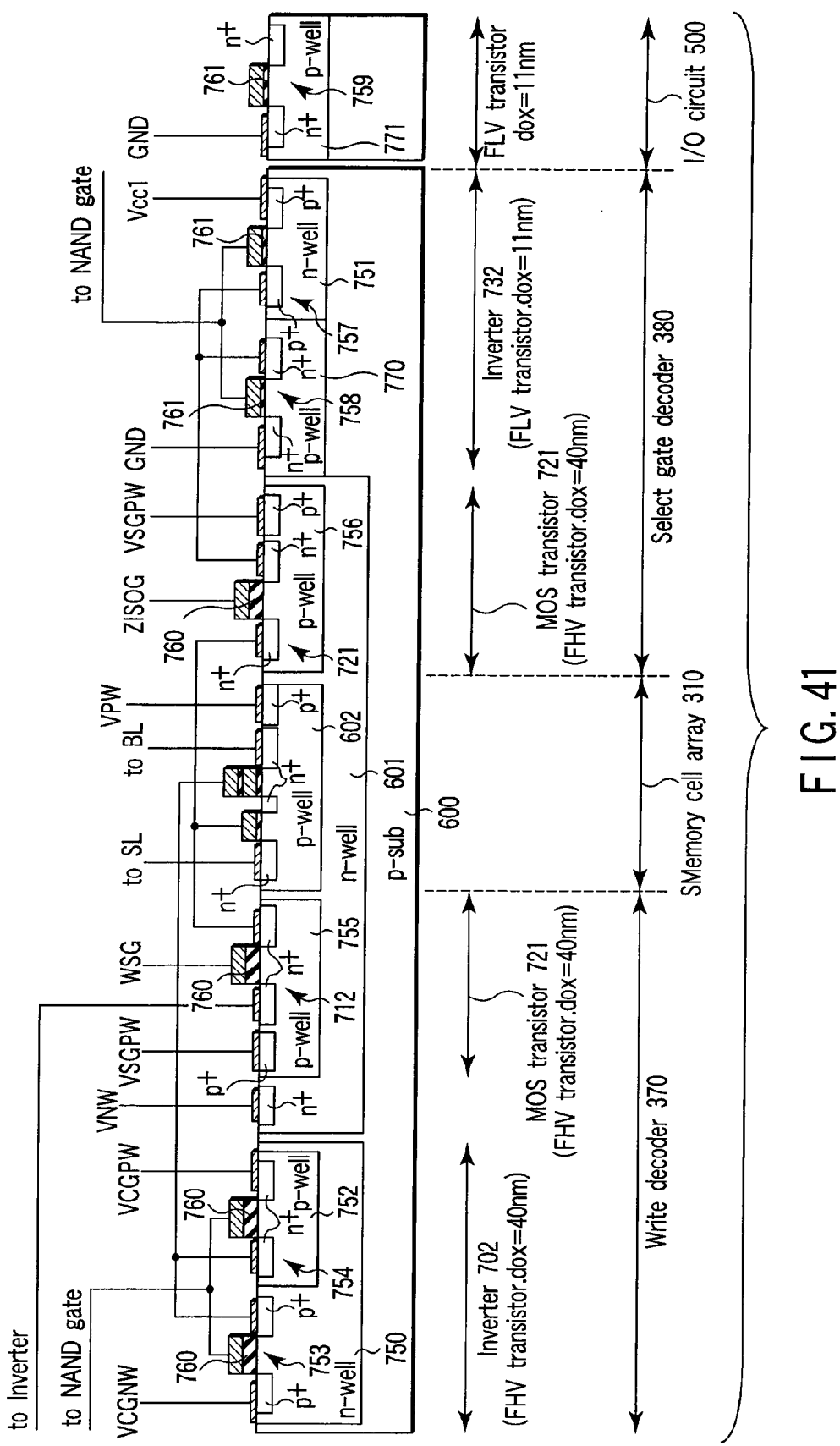
FIG. 41 is a sectional view of a 2Tr flash memory and an I/O circuit according to the third embodiment.

FIG. 41 is a schematic sectional view of a part of the memory cell array 310, select gate decoder 380, and write decoder 370 shown in FIG. 40. FIG. 41 particularly shows a part of the I/O circuit 500 together with one memory cell MC, inverters 702, 732, and MOS transistors 712, 721.

As shown in FIG. 41, at the surface of a semiconductor substrate 600, n-well regions 601, 750, 751 and p-well regions 770, 771 are formed in such a manner that they are isolated from one another. The n-well region 750 is for forming an inverter 702 in the write decoder 370. The n-well region 601 is for forming the n-channel MOS transistor 712 in the write decoder 370, the memory cell MC in the memory cell array 310, and the n-channel MOS transistor 721 in the select gate decoder 380. In addition, the n-well region 751 and p-well region 770 are for forming a part of the inverter 732 in the select gate decoder 380. The p-well region 771 is for forming the MOS transistor in the I/O circuit 500.

A p-well region 752 is further formed in the surface of the n-well region 750. Then, the p-channel MOS transistors 753, 754 included in the inverter 702 are formed on the n-well region 750 and on the p-well region 752, respectively. The n-well region 750 is connected to the VCGNW node and the p-well region 752 is connected to the VCGPW node.

P-well regions 602, 755, 756 are further formed in the surface of the n-well region 601. Then, the memory cell MC, and the MOS transistor 721 in the select gate decoder 380 are formed on the p-well regions 755, 602, 756, the MOS transistor 712 in the write decoder 370, respectively. Although the select transistor ST in the memory cell is shown as a single-layer gate, it may have a stacked gate structure as does the memory cell transistor. The p-well regions 755, 756 are connected to the VSGPW node.

A p-channel MOS transistor 757 in the inverter 732 is formed on the n-well region 751. The n-channel MOS transistor 758 in the inverter 732 is formed on the p-well region 770. Then, the voltage Vcc1 is applied to the n-well region 751. The MOS transistor 759 included in the I/O circuit 500 is formed on the p-well region 771.

The gate insulating film 760 included in each of the MOS transistors 753, 754 in the inverter 702 and in each of the MOS transistors 712, 721 has a film thickness of, for example, 40 mm. The gate insulating film 761 included in the inverter 732 and MOS transistor 759 has a film thickness of, for example, 11 nm (or 6 to 12 mm), thinner than the gate insulating film 760. Hereinafter, a MOS transistor with a gate insulating film thickness of 40 nm is referred to as an FHV transistor and a MOS transistor with a gate insulating film thickness of 11 nm is referred to as an FLV transistor.

In FIG. 41, only one memory cell MC, inverters 702, 703, MOS transistors 712, 721, and a part of the I/O circuit 500 are explained. The row decoder 130 in the NAND flash memory 100, the row decoder 230 in the 3Tr-NAND flash memory 200, and the write decoder 370 and MOS transistor 721 in the 2Tr flash memory 300 are formed of FHV transistors. The regions excluding the MOS transistors 721 in the select gate decoder 380 of the 2Tr flash memory 300 and the I/O circuit 500 are formed of FLV transistors.

Next, the operation of the 2Tr flash memory with the above configuration will be explained by reference to FIG. 40, particularly centering on the write decoder 370 and select gate decoder 380.

<Write Operation>

Before a write operation is started, Vpp2 is applied to the VCGNW node. The potential at the VCGPW node is always at 0V. The negative potential VBB is applied to the VSGPW node.

Then, an address signal is inputted from the outside. Since the output of the NAND gate 701 corresponding to the selected word line is at the low level, the output of the inverter 702 is VCGNW=Vpp2. On the other hand, since the output of the NAND gate 701 corresponding to the unselected word line is at the high level, the output of the inverter 702 is 0V (the potential at the VCGPW node). As a result, the potential of the selected word line is VCGNW=Vpp2 and the potential of the unselected word line is VCGPW=0V.

In addition, the control signal PRGH is set to the high level (Vcc1). Thus, the output of the inverter 711 is at VBB (the potential at the VSGPW node). Then, since the control signal WSG is set to the high level (Vcc1), all of the n-channel MOS transistors 712 are in the on state. As a result, the potentials of all the select gate lines SG0 to SGm are at VBB.

In a write operation, the control signal ZISOG is at the low level (0V) and the n-channel MOS transistor 721 is in the off state. As a result, the select gate decoder 380 is isolated electrically from the select gate lines SG0 to SGm.

The potential VPW of the p-well region 602 in which the memory cell transistor 310 is formed is set at the negative potential VBB.

As described above, Vpp2 is applied to the selected word line WL, 0V is applied to the unselected word lines, VBB is applied to all of the select gate lines SG0 to SGm, and VBB is applied to the well region 602. In this state, 0V or VBB is applied to the bit line BL, with the result that the data is written into the memory cell MC connected to the selected word line WL.

<Erase Operation>

When an erase operation is started, the write decoder 370 sets the potential VPW of the p-well region 602 at Vpp2. In addition, Vcc2 is applied to the VCGNW node and the negative potential VBB is applied to the VCGPW node. The potential of the VSGPW node is always at 0V.

Since the outputs of the NAND gates 701 corresponding to all the word lines WL0 to WLm are at the high level in an erase operation, the output of the inverter 702 is at VBB (the potential at the VCGPW node). As a result, the potentials of the word lines WL0 to WLm are at VBB. Since the control signal WSG is set at the low level (0V), all of the n-channel MOS transistors 712 are turned off. In the erase operation, the control signal ZISOG is also set to the low level (0V) and therefore the n-channel MOS transistors 72 are in the off state. As a result, all of the select gate lines SG0 to SGm are in the floating state.

As described above, VBB is applied to all of the word lines WL0 to WLm, all of the select gate lines SG0 to SGm are made floating, and Vpp2 is applied to the well region 602. As a result, electrons are pulled out of the floating gates of the memory cell transistors MTs, thereby erasing the data.

<Read Operation>

First, a row address signal RA is inputted to the NAND gate 731 of the row address decode circuit 730. The output of the NAND gate 731 corresponding to the selected select gate line is low and the output of the NAND gate 731 corresponding to an unselected select gate line is high. Then, the output of the NAND gate 731 is inverted by the inverter 732. The inverted signal is outputted as a row address decode signal of Vcc1 level.

In a read operation, the control signals ZISOG, WSG are at the high level and at the low level, respectively. Therefore, the MOS transistors 712 are in the off state and the select gate lines SG0 to SGm are separated electrically from the write decoder 370. In addition, the MOS transistors 721 are in the on state. Therefore, the signal of the Vcc1 level supplied from the row address decode circuit 730 is supplied to the select gate lines. That is, Vcc1 is applied to the selected select gate line and 0V is applied to the unselected select gate lines.

All of the word lines are set to 0V.

In this way, the select transistor connected to the selected select gate line is turned on and a voltage is applied to the bit line, thereby reading the data from the memory cell MC.

As described above, in a write operation, the write decoder 370 applies the negative potential VBB to the select gate line SG. In a read operation, the select gate decoder 380 applies the positive potential Vcc1 to the select gate line SG. Therefore, to separate the select gate line SG from the select gate decoder 380 electrically in a write operation, the MOS transistor 721 is provided. To separate the select gate line SG from the write decoder 370 electrically in a read operation, the MOS transistor 712 is provided. For the details of a write operation and an erase operation, refer to the method disclosed in Japanese Patent Application No. 2003-209312.

Next, a method of manufacturing FHV transistors and FLV transistors together with memory cells will be explained. FIGS. 42 to 49 are sectional views showing in sequence the manufacturing processes of a flash memory according to the third embodiment. FIGS. 42 to 49 show in further detail the configuration of the MOS transistor 712 (FHV transistor), memory cell array 310, MOS transistor 721 (FHV transistor), and MOS transistor 758 (FLV transistor) in FIG. 41. The memory cell array 310 is shown along the word line WL.

Figure 42:
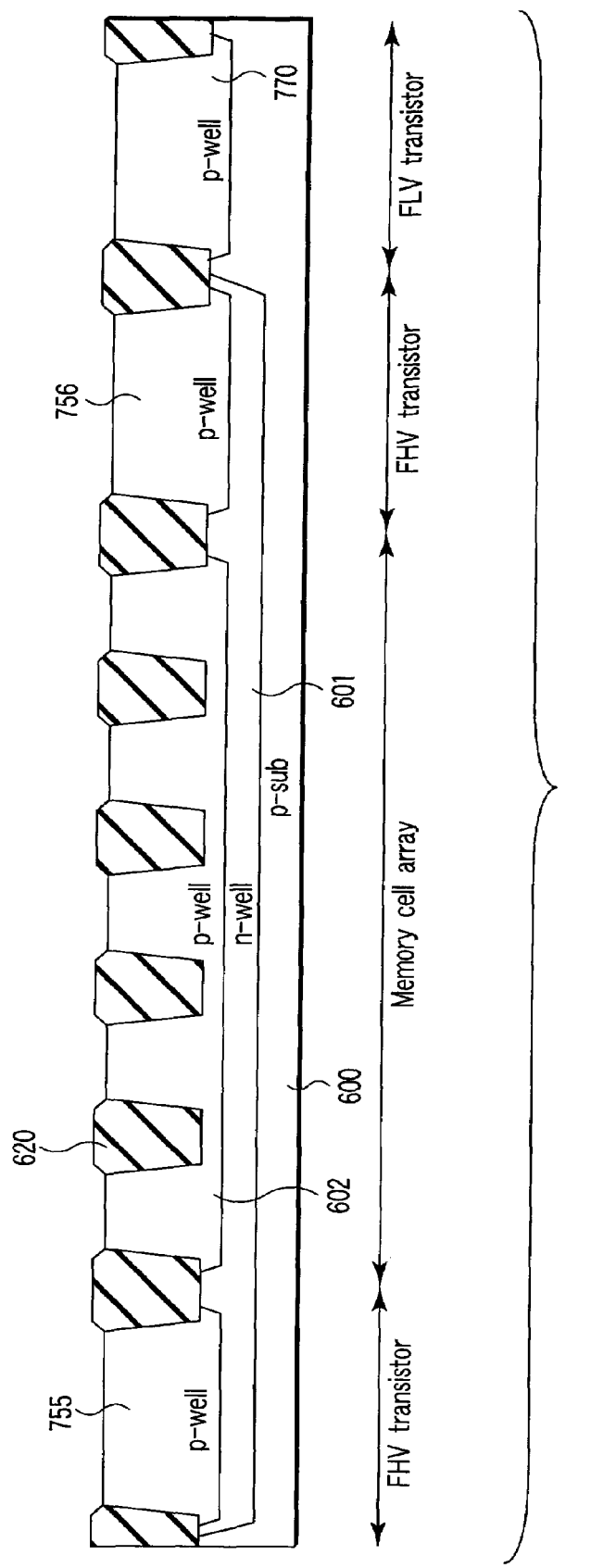

First, as shown in FIG. 42, n-type impurities, such as arsenic or phosphorus, are ion-implanted into the surface region of the silicon substrate 600. Then, p-type impurities, such as gallium or boron, are ion-implanted into the surface region of the silicon substrate 600, followed by a high-temperature heat treatment, which activates the introduced impurities. As a result, the n-well region 601 is formed in the surface region of the silicon substrate 600 and the p-well regions 755, 602, 756 are formed in the surface region of the n-well region 601 as shown in FIG. 42. Then, element isolating regions 620 are formed by STI techniques. A method of forming element isolating regions 620 is as explained in the first embodiment.

Figure 43:
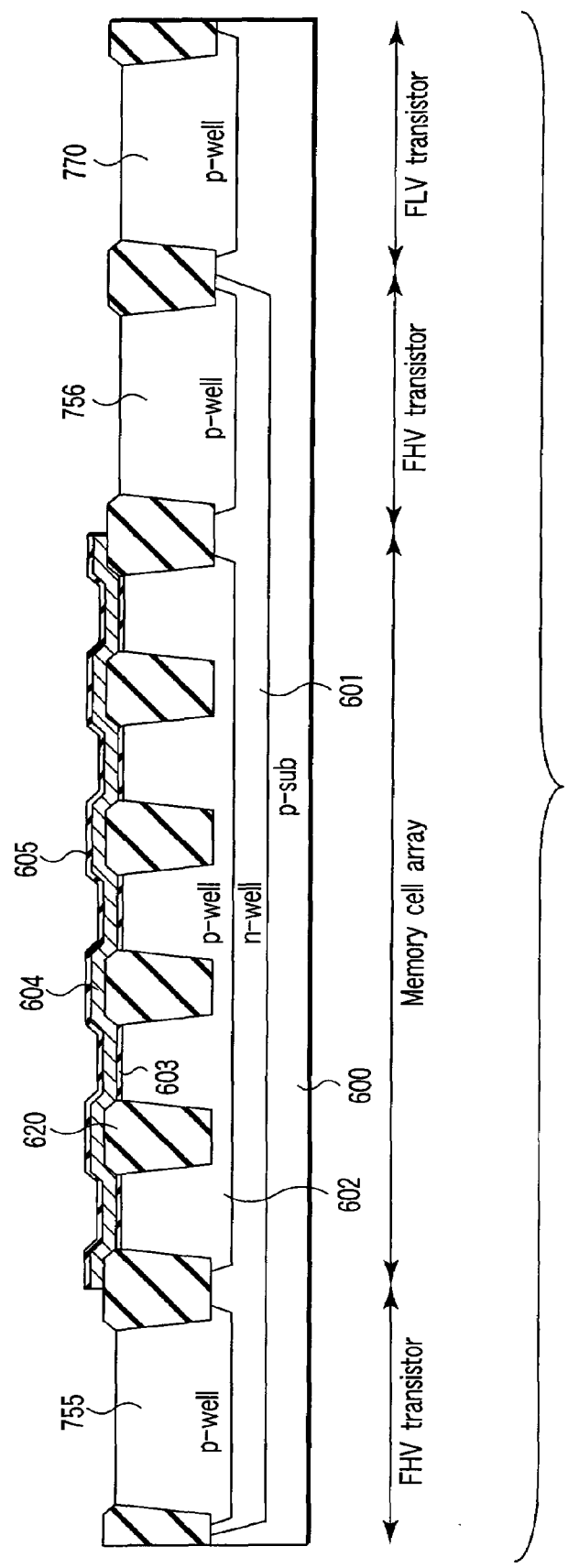

Next, as shown in FIG. 43, the gate insulating film 603 for the memory cell transistor MT and select transistor ST is formed on the silicon substrate 600. The gate insulating film 603 is, for example, a silicon oxide film formed by thermal oxidation techniques. The thickness of the gate insulating film 603 is, for example, 8 nm. Then, on the gate insulating film 166, an amorphous silicon layer 604 is formed to a thickness of, for example, 60 nm. The amorphous silicon layer 604 functions as the floating gate of the memory cell transistor MT and the select gate of the select transistor ST. Thereafter, the amorphous silicon layer 604 is patterned by photolithographic techniques and anisotropic etching, such as RIE. Specifically, in the region where memory cell transistors MT are formed, the amorphous silicon layer 604 is patterned in such a manner that the floating gates are separated between memory cell transistors adjoining in the word line direction. Then, the inter-gate insulating film 605 is formed on the polysilicon layer 604 by, for example, CVD techniques. Thereafter, by photolithographic techniques and etching, the gate insulating film 603, amorphous silicon layer 604, and inter-gate insulating film 605 are removed in the regions excluding the region where the memory cell array 310 is formed, thereby obtaining the structure shown in FIG. 43.

Next, as shown in FIG. 44, with the memory cell array 310 protected by, for example, a nitride film, a silicon oxide film 760 is formed on the silicon substrate 600 to a thickness of, for example, 40 nm by, for example, thermal oxidation techniques. The silicon oxide film 760 is used as a gate insulating films for the FHV transistor. Next, the gate insulating film 760 in the regions excluding the one where the FHV transistor is formed is removed, thereby exposing the silicon substrate 600.

Figure 45:
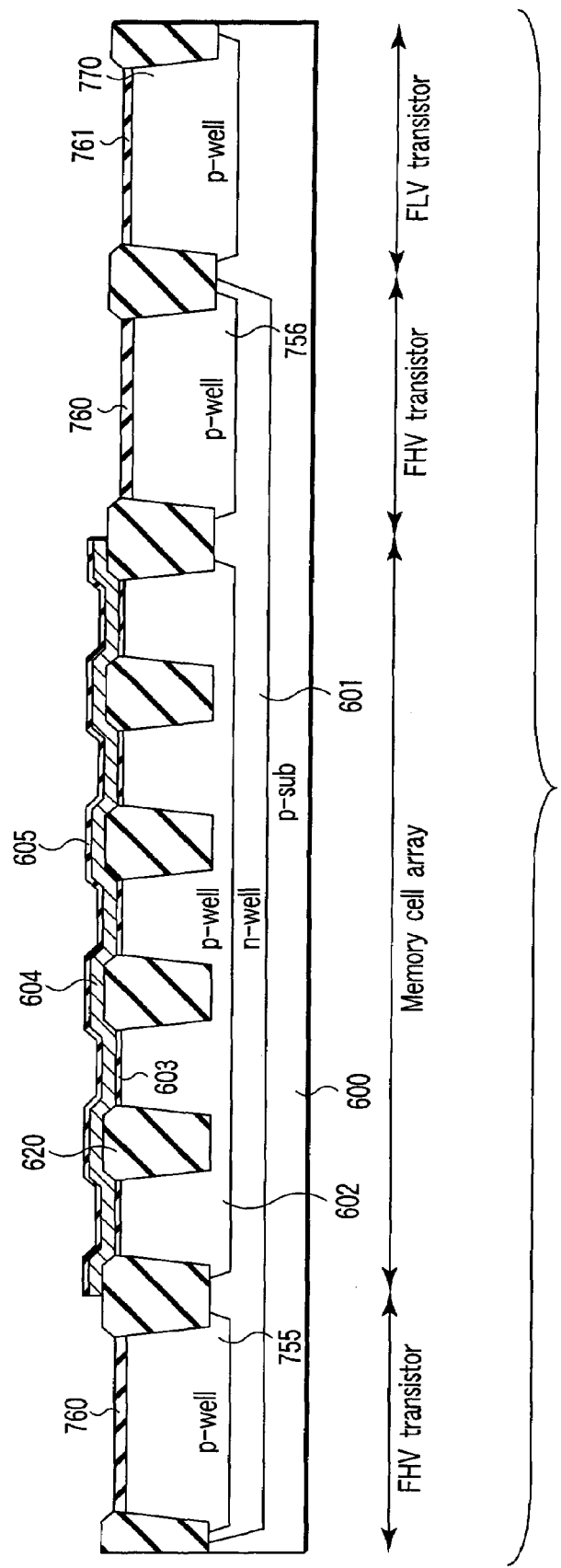
Figure 49:
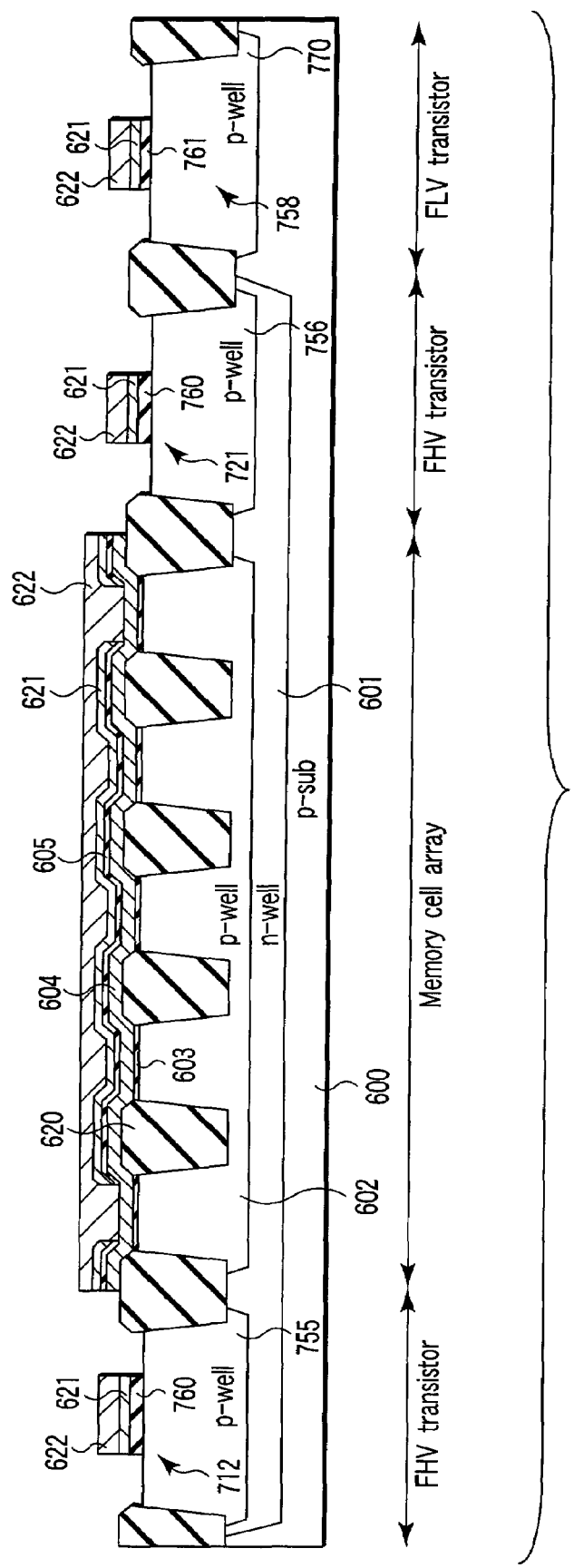

Next, as shown in FIG. 45, with the regions where the memory cell array 310 and FHV transistor are formed being protected by, for example, a nitride film, a silicon oxide film 761 is formed on the silicon substrate 600 to a thickness of, for example, 11 nm by, for example, thermal oxidation techniques. The silicon oxide film 761 is used as a gate insulating film for the FLV transistor. Next, the gate insulating film 761 in the regions excluding the region where the FLV transistor is formed is removed. Then, the nitride film is removed.

Next, as shown in FIG. 46, on the inter-gate insulating film 605 and on the gate insulating films 760, 761, a polysilicon layer 621 is formed to a thickness of 40 nm by CVD techniques or the like. The polysilicon layer 621 is used as the control gate of a memory cell transistor MT, the select gate of a select transistor ST, and the gates of FHV and FLV transistors.

Thereafter, a part of the polysilicon layer 621 functioning as select gate lines and the inter-gate insulating film 605 under the polysilicon layer 621 are removed by photolithographic techniques and RIE, thereby making a contact hole CH12. Then, on the polysilicon layer 621, a polysilicon layer 622 is formed, thereby filling the contact hole CH12. The polysilicon layer 622, together with the polysilicon layer 621, is used as the control gate of a memory cell transistor, the select gate of a select transistor ST, and the gates of FHV and FLV transistors.

Next, the polysilicon layers 621, 622, inter-gate insulating film 605, amorphous silicon layer 604, and gate insulating films 603, 760, 761 are patterned by photolithographic techniques and RIE, thereby forming the gate electrodes of the individual MOS transistors.

Thereafter, with the individual gate electrodes as a mask, n-type impurities are ion-implanted into the p-well regions 755, 602, 756 and into the surface region of the silicon substrate 600. Then, the introduced impurities are activated by heat treatment, thereby forming an $n^+$-type impurity diffused layer functioning as sources or drains, which completes memory cell transistors, select transistors, FHV transistors, and FLV transistor.

Thereafter, an interlayer insulating film and a multilayer metal wiring layer are formed, which completes the LSI 1.

The LSI 1 of the third embodiment produces the effects explained in items (6) to (8) below in addition to the effects in items (1) to (4) explained in the first embodiment and the effect in item (5) explained in the second embodiment.

(6) The processing cost can be reduced.

With the configuration of the third embodiment, the row decoder 330 of the 2Tr flash memory 300 has the write decoder 370 and the select gate decoder 380. The write decoder 370 not only applies a voltage to a word line but also applies the negative voltage VBB to a select gate line in a write operation. The select gate decoder 380 applies the positive voltage Vcc1 to any one of the select gate lines in a read operation.

Specifically, the decoder circuit for applying a voltage to a select gate line includes a write/erase decoder and a read decoder. The write decoder 370 used as a write/erase decoder is formed of a MOS transistor (FHV transistor) with a relatively thick gate insulating film (40 nm thick in the third embodiment) to use the negative voltage VBB. On the other hand, the select gate decoder 380 used as a read decoder can be formed of a MOS transistor (FLV transistor) with a relatively thin gate insulating film (11 nm thick in the third embodiment).

In this respect, the NAND flash memory 100 and 3Tr-NAND flash memory 200 use a high positive voltage of Vpp (e.g., 20V). On the other hand, the logic circuits, including the I/O circuit 500, operate on the positive voltage Vcc1. Therefore, in the third embodiment, the write decoder 370 is formed of MOS transistors (FHV transistors) used in the row decoders 130, 230 of the NAND flash memory 100 and 3Tr-NAND flash memory 200. On the other hand, the select gate decoder 380 is formed of MOS transistors (FLV transistors) used in the I/O circuit 500 or the like.

As described above, the row decoder 330 (write decoder) of the 2Tr flash memory using a different voltage from that of the NAND flash memory 100 and 3Tr-NAND flash memory 200 can be formed of the same MOS transistors as those in the row decoders 130, 230 of the NAND flash memory 100 and 3Tr-NAND flash memory 200. Therefore, the manufacturing processes are simplified, which helps reduce the processing cost.

In addition, providing the MOS transistor 721 causes the select gate decoder 380 to be separated from the select gate line in a write operation. This prevents the negative voltage VBB from being applied to the row address decode circuit 730. Since the negative voltage VBB is applied to the select gate line in a write operation, it is desirable that the MOS transistor 721 should be formed of an FHV transistor.

(7) The operating performance of the system LSI can be improved.

The 2Tr flash memory 300 holds the program needed for the MCU 400 to operate. It is when the MCU 400 reads the program from the 2Tr flash memory 300 or in a data read operation that the 2Tr flash memory 300 is required to operate at high speed. On the other hand, in a write operation and an erase operation, the 2Tr flash memory 300 is not particularly required to operate at high speed. The reason is that it is when a program is written at the time of shipment of products or when the program is rewritten as a result of version upgrade that the 2Tr flash memory 300 is written into or erased from. In this case, the 2Tr flash memory 300 is not required to operate even as fast as the NAND flash memory 100.

In this respect, the 2Tr flash memory 300 of the third embodiment includes the write decoder 370 formed of FHV transistors and the select gate decoder 380 formed of FLV transistors. Therefore, the write/erase operation of the 2Tr flash memory is as fast as that of the NAND flash memory 100 and 3Tr-NAND flash memory 200. However, the read operation of the 2Tr flash memory 300 is much faster than that of the NAND flash memory 100 and 3Tr-NAND flash memory 200.

The 2Tr flash memory 300 uses the positive voltage Vpp2 (=10V) and the negative voltage VBB (=−6V). Therefore, the highest applied voltage to the MOS transistors in the 2Tr flash memory 300 is about 10V. Therefore, MOS transistors with a gate insulating film thickness of 18 to 20 nm can be used. In the third embodiment, however, FHV transistors (with a gate insulating film thickness of 40 nm) used in the NAND flash memory 100 are used as the MOS transistors in the row decoder 330 of the 2Tr flash memory 300. If the row decoder 330 is formed of FHV transistors only, the 2Tr flash memory 300 becomes slower in all of the write, erase, and read operations.

In the third embodiment, to overcome this problem, the row decoder 330 is divided into a write/erase decoder and a read decoder, which enables the read decoder to be formed of FLV transistors. As a result, the reading speed can be made faster. Although the write/erase decoder is formed of FHV transistors with a gate insulating film thickness of 40 nm, there is no problem in terms of operation, since the write/erase decoder is not required to operate even as fast as the NAND flash memory 100 in a write/erase operation as described above. As compared with a case where the row decoder 330 is formed of MOS transistors with a gate insulating film thickness of 18 to 20 nm without using the MOS transistors used in the NAND flash memory 100 and logic circuit, the read operation can be made faster, since the read decoder is formed of FLV transistors.

As described above, the 2Tr flash memory capable of high-speed operations is caused to hold the program for the MCU 400, which improves the operating speed of the system LSI 1.

(8) The occupied area of the 2Tr flash memory can be reduced.

In the row decoder of the 2Tr flash memory 300 is divided into a write/erase decoder and a read decoder, with the result that the write decoder 370 is not required to operate faster. The voltage applied to the FHV transistors included in the write decoder 370 is at 10V, lower than 20V applied to the FHV transistors in the NAND flash memory 100 and 3Tr-NAND flash memory 200. Therefore, the channel length of the FHV transistors in the 2Tr flash memory 300 can be made shorter than that of the FHV transistors in the NAND flash memory 100 and 3Tr-NAND flash memory 200. Since the FLV transistor deals with about 3V, it goes without saying that its dimensions can be made smaller than the FHV transistor.

FIG. 50 is a sectional view of an FHV transistor included in each of the NAND flash memory 100 and 3Tr-NAND flash memory 200, an FHV transistor included in the 2Tr flash memory 300, and an FLV transistor included in the 2Tr flash memory 300.

As shown in FIG. 50, when processing is done with a design rule of 0.13 µm, the channel length of the FHV transistors used in, for example, the row decoders 130, 230 of the NAND flash memory 100 and 3Tr-NAND flash memory 200 is about 1.8 µm. On the other hand, the channel length of the FHV transistors used in the write decoder 370 of the 2Tr flash memory 300 is about 0.7 µm. The channel length of the FLV transistor is shorter than these channel lengths.

As described above, even when the same FHV transistors are used, the 2Tr flash memory 300 deals with a voltage lower than that dealt with by the NAND flash memory 100 and 3Tr-NAND flash memory 200, with the result that the channel length of the FHV transistors in the 2Tr flash memory 300 can be made shorter. In addition, the read decoder 380 is formed of FLV transistors, which enables the area of the row decoder in the 2Tr flash memory 200 to be reduced.

Figure 51:
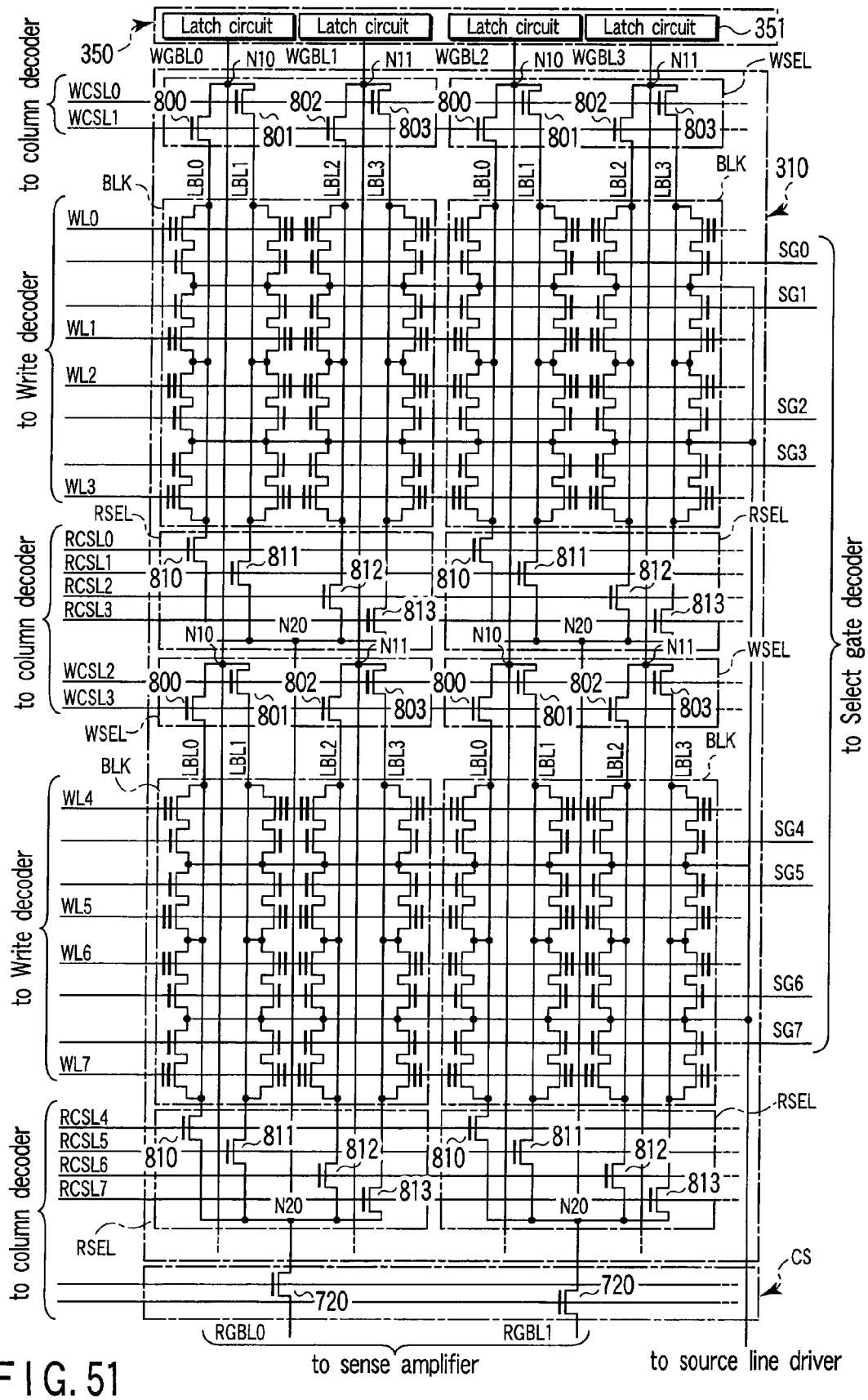
FIG. 51 is a circuit diagram of a memory cell array of a 2Tr flash memory according to a fourth embodiment of the present invention.

Next, a semiconductor integrated circuit according to a fourth embodiment of the present invention will be explained. The fourth embodiment is such that a hierarchical bit line system is applied to the memory cell array 310 of the 2Tr flash memory 300. FIG. 51 is a circuit diagram of the memory cell array 310 of the 2Tr flash memory 300 according to the fourth embodiment and its peripheral circuitry.

As shown in FIG. 51, the memory cell array 310 has ((m+1)×(n+1)) memory cell blocks BLKs (m and n are natural numbers), and write selectors WSELs and read selectors RSELs provided for the memory cell blocks BLKs in a one-to-one correspondence. Although only (2×2) memory cell blocks BLKs are shown in FIG. 51, the number is illustrative and not restrictive.

Each of the memory cell blocks includes a plurality of memory cells MCs. The memory cells MCs are the memory cells MCs in the 2Tr flash memory explained in the first embodiment. Each of the memory cell blocks BLKs includes (4×4) memory cells MCs. Although the number of memory cells MCs arranged in the column direction is four in FIG. 51, this number is illustrative and not restrictive and may be 8 or 16, for example. The memory cells MCs adjoining in the column direction share the source region of their select transistors STs and the drain region of the memory cell transistors MTs. The drain regions of the memory cell transistors MTs of four columns of memory cells in the same memory cell block are connected to four local bit lines LBL0 to LBL3, respectively. One end of each of the local bit lines LBL0 to LBL3 is connected to the write selector WSEL and the other end of each of them is connected to the read selector RSEL.

In the memory cell array 310, the control gates of the memory cell transistors MTs in a same row are connected commonly to any one of word lines WL0 to WL(4m−1). The gates of the select transistors STs in a same row are connected commonly to any one of select gate lines SG0 to SG(4m−1). Each of the local bit lines LBL0 to LBL3 is connected commonly to the memory cell transistors in the corresponding one of the memory cell blocks BLKs, whereas the word lines WLs and select gate lines SGs are connected commonly to the memory cell transistors and select transistors in a same row across the memory cell blocks. The word lines WL0 to WL($4m-1$) are connected to the write decoder 370 and the select gate lines SG0 to SG($4m-1$) are connected to the select gate decoder 380. The source regions of the select transistors STs are connected commonly to a plurality of memory cell blocks BLKs and then are connected to the source line driver 360.

Next, the configuration of the write selector WSEL will be explained. Each of the write selectors WSELs includes four MOS transistors 800 to 803. One end of the current path of each of the MOS transistors 800 to 803 is connected to one end of each of the local bit lines LBL0 to LBL3, respectively. The other ends of the MOS transistors 800 and 801 are connected to each other. The other ends of the MOS transistors 802 and 803 are connected to each other. Hereinafter, the common junction node of the MOS transistors 800 and 801 is referred to as node N10 and the common junction node of the MOS transistors 802 and 803 is referred to as node N11. Each of the gates of the MOS transistors 800 to 803 is connected to any one of the write column select lines WCSL0 to WCSL($2m-1$). The MOS transistors 800, 802 included in the write selector WSEL in the same row are connected to the write column select lines WCSLi (i: 1, 3, 5, ...). The MOS transistors 801, 803 included in the write selector WSEL in the same row are connected to the write column select lines WCSL(i-1). The write column select lines WCSL0 to WCSL($2m-1$) are selected by the column decoder 320 in a write operation.

Each of the nodes N10, N11 in the write selector WSEL is connected to any one of write global bit lines WGGL0 to WGBL($2n-1$). Each of the write global bit lines WGBL0 to WGBL($2n-1$) connects the nodes N10 or N11 of the write selectors SELs in a same column to one another. Then, the write global bit lines WGBL0 to WGBL($2n-1$) are connected to the write circuit 350.

The write circuit 350 includes latch circuits 351 provided for the write global bit lines WGBL0 to WGBL($2n-1$) in a one-to-one correspondence. In a write operation, the write circuit 350 latches the writing data corresponding to each of the write global bit lines WGBL0 to WGBL($2n-1$).

Next, the configuration of the read selector RSEL will be explained. Each of the read selectors RSELs includes four MOS transistors 810 to 813. One end of the current path of each of the MOS transistors 810 to 813 is connected to the other ends of the local bit lines LBL0 to LBL3, respectively. The other ends of the MOS transistors 810 and 813 are connected to one another. Hereinafter, the common junction node of the MOS transistors 810 and 813 is referred to as node N20. The gates of the MOS transistors 810 to 813 are connected to the read column select lines RCSL0 to RCSL($4m-1$) in a one-to-one correspondence. The MOS transistors 810 to 813 included in the read selector RSEL in the same row are connected to the read column select lines RCSL0 to RCSL($4m-1$) in a one-to-one correspondence. The read column select lines RCSL0 to RCSL($4m-1$) are selected by the column decoder 320 in a read operation.

Node N20 in the read selector RSEL is connected to any one of the read global bit lines RGBL0 to RGBL(n-1). Each of the read global bit lines RGBL0 to RGBL(n-1) connects nodes N20 in the read selector RSELs in a same column to one another. The read global bit lines RGBL0 to RGBL(n-1) are connected to the sense amplifier 340 via the column selector CS.

The column selector CS includes MOS transistors 720 provided for the read global bit lines RGBL0 to RGBL(n-1) in a one-to-one correspondence. The gate of each of the MOS transistors 720 is selected by the column decoder 320.

The configuration of the memory cell array 310 according to the fourth embodiment can also be explained as follows. In the memory cell array 310, a plurality of memory cells MCs are arranged in a matrix. The control gates of the memory cell transistors MCs of the memory cells MCs in a same row are connected commonly to a word line. The gates of the select transistors of the memory cells in a same row are connected commonly to a select gate line. The drains of the memory cell transistors MT of four memory cells MCs in a same column are connected commonly to any one of the local bit lines LBL0 to LBL3. That is, a plurality of memory cells MCs in the memory cell array 310 are connected to any one of the local bit lines LBL0 to LBL3 in columns of four memory cells MCs. Then, one end of the local bit line LBL0 and one end of the local bit line LBL1 in the same column are connected via the respective MOS transistors 800, 801 to any one of the write global bit lines WGBL0 to WGBL($2n-1$). In addition, one end of the local bit line LBL2 and one end of the local bit line LBL3 in the same column are connected via the respective MOS transistors 802, 803 to any one of the write global bit lines WGBL0 to WGBL($2n-1$). Then, the other ends of the local bit lines LBL0 to LBL3 in the same column are connected via the respective MOS transistors 810 to 813 to any one of the read global bit lines RGBL0 to WGBL(n-1). The sources of the select transistors STs of the memory cells MCs are connected to one another and then connected to the source line driver. In the memory cell array with the above configuration, four columns of four memory cells MCs connected to the same local bit line forms a single memory cell block BLK. The memory cell blocks in the same column are connected to a common write global bit line and a common read global bit line. On the other hand, memory cell blocks BLKs in different columns are connected to different write global bit lines and different read global bit lines. The number of memory cells in the memory cell block, the number of read global bit lines RGBL, and the number of write global bit lines WGBL are not limited to the numbers in the fourth embodiment.

In the above configuration, the MOS transistors 800 to 803 in the write selector WSEL and the MOS transistors 810 to 813 in the read selector RSEL are formed of FHV transistors. On the other hand, the MOS transistors 720 in the column selector CS are formed of FLV transistors.

Next, a sectional structure of the memory cell array 310 and column selector CS will be explained by reference to FIG. 52. FIG. 52 is a schematic sectional view, taken along the bit line, of a part of the memory cell array 310 and column selector CS.

As shown in FIG. 52, the n-well region 601 and p-well region 772 are formed in the surface of the p-type silicon substrate 600. Then, p-well regions 602, 820, 821 separated from one another are formed in the surface of the n-well region 601. The p-well region 602 is for forming memory cells MCs as explained in the first to third embodiments. On the other hand, p-well regions 820, 821 are for forming write selectors WSELs and read selectors RSELs. The MOS transistors 800 to 803 are formed on the p-well region 820. The MOS transistors 810 to 813 are formed on the p-well region 821. One end of the current path of each of the MOS transistors 800 to 803 is connected to the write global bit lines WGBL0 to WGBL($2n-1$), respectively. The other ends of the current paths are connected to the local bit lines LBL0 to LBL3. In addition, one end of the current path of each of the MOS transistors 810 to 813 is connected to the read global bit lines RGBL0 to RGBL(n−1), respectively. The other ends of the current paths are connected to the local bit lines LBL0 to LBL3.

Furthermore, on the silicon substrate 600, the MOS transistor 720 in the column selector CS is formed in the p-well region 772. The p-well region 772 is isolated electrically from the p-well regions 602, 820, 821 by the n-well region 601. Then, one end of the current path of the MOS transistor 720 is connected to the read global bit lines RGBL0 to RGBL(n−1). The other end of the current path is connected to the sense amplifier.

The gate insulating films 830 included in the MOS transistors 800 to 803 and MOS transistors 810 to 813 have a film thickness of, for example, 40 nm. The gate insulating film 831 of the MOS transistor 720 has a film thickness of, for example, 11 nm Next, the operation of the 2Tr flash memory with the above configuration will be explained.

<Write Operation>

Data is written simultaneously into all of the memory cell blocks in a same row. In each memory cell block, the memory cells written into simultaneously are two memory cells: one is a memory cell connected to either the local bit lines LBL0 or LBL1 and the other is a memory cell connected to either the local bit lines LBL2 or LBL3.

First, writing data is stored in the latch circuit of the write circuit 350. Then, a voltage corresponding to the writing data stored in the latch circuit is applied to each of the write global bit lines WGBLs. The write decoder 30 then selects any one of the word lines and applies not only the positive voltage Vpp2 to the selected word line but also the negative voltage VBB to all of the select gate lines.

Then, the column decoder 320 selects one of the two write column select lines connected to the write selector WSEL corresponding to the memory cell block BLK including the selected word line. As a result, either the MOS transistor 800 or 801 and either the MOS transistor 802 or 803 in the write selector WSEL are turned on. Consequently, the write global bit line WGBL is connected electrically to either the local bit line LBL0 or LBL1 and to either the local bit line LBL2 or LBL3. The local bit lines unconnected to the write global bit lines are applied with a write inhibit voltage (e.g., 0V) from a transistor (not shown). In addition, the write column select lines connected to the write selector WSEL corresponding to the memory cell block BLK not including the selected word line are all made unselected. As a result, the MOS transistors 800 to 803 in the write selector WSEL corresponding to the memory cell block BLK not including the selected word line are turned off. In addition, the column decoder 320 makes unselected all of the read column select lines RCSL0 to RCSL (4m−1). As a result, the MOS transistors 810 to 813 in all of the read selectors RSELs are turned off. Therefore, the read global bit line RGBL is isolated electrically from the local bit lines LBL0 to LBL3.

As a result, a voltage corresponding to "1" data or "0" data is applied from the write global bit line via either the MOS transistor 800 or 801 in the write selector WSEL to either the local bit line LBL0 or LBL1 in the memory cell block BLK including the selected word line. Furthermore, a potential corresponding to "1" data or "0" data is applied from the write global bit line via either the MOS transistor 802 or 803 to either the local bit line LBL2 or LBL3 in the memory cell block BLK including the selected word line.

As a result, the data is written into the memory cell connected to the selected word line and to either the local bit line LBL0 or LBL1 and to either the local bit line LBL2 or LBL3.

<Erase Operation>

Since data is erased in the same manner as explained in the first embodiment, its explanation will be omitted.

<Read Operation>

In the fourth embodiment, data is read from one memory per memory block. When there are a plurality of read global bit lines in each memory cell block, as much data as there are read global bit lines are read.

First, the select gate decoder 380 selects any one of the select gate line SGs (or brings any one of the select gate line into the high level). The write decoder 370 makes all of the word lines WLs unselected (or sets all of the word lines to the low level). In addition, the source line driver 360 sets the potential of the source line to 0V.

Then, the column decoder 320 selects any one of the four read column select lines connected to the read selector RSEL corresponding to the memory cell block BLK including the selected select gate line. This turns on any one of the four MOS transistors 810 to 813 in the read selector RSEL corresponding to the memory cell block BLK including the selected select gate line. As a result, the read global bit line RGBL is connected electrically to any one of the local bit lines LBL0 to LBL3. All of the read column select lines connected to the read selectors RSELs corresponding to the memory cell blocks BLKs not including the selected gate line are made unselected, with the result that the four MOS transistors 810 to 813 in these read selectors RSELs are all turned off. In addition, the column decoder 320 makes unselected all of the write column select lines WCSL0 to WCSL(2m−1). This turns off all of the four MOS transistors 800 to 803 in all of the write column select lines WCSL0 to WCSL(2m−1). As a result, the write global bit line WGBL is isolated electrically from the local bit lines LBL0 to LBL3.

Furthermore, the column decoder 320 turns on at least any one of the MOS transistors 720 in the column selector CS.

As a result, the memory cell connected to any one of the local bit lines LBL0 to LBL3 in each memory cell block is connected to the sense amplifier 340 via any one of the MOS transistors 810 to 813, read global bit line, and MOS transistor 720.

Then, the change of the potential on the read global bit line RGBL is amplified by the sense amplifier 340, thereby reading the data.

The configuration of the fourth embodiment produces the effects in the following items (9) to (11) in addition to the effects in items (1) to (8) explained in the first to third embodiments.

(9) The operating speed of the 2Tr flash memory can be improved.

With the configuration of the fourth embodiment, the bit lines are hierarchized into the local bit lines and the global bit lines (read global bit lines and write global bit lines). That is, a plurality of memory cells are connected to each of a plurality of local bit lines and a plurality of local bit lines are connected to each of a plurality of global bit lines. In the example of FIG. 51, 2(m−1) local bit lines (LBL0 and LBL1 or LBL2 and LBL3) are connected to a single write global bit line WGBL via the write selector WSEL. Then, four memory cells are connected to each of the (m−1) local bit lines LBLs. In addition, 4(m−1) local bit lines (LBL0 to LBL3) are connected to a single read global bit line RGBL via the read selector RSEL. Then, four memory cell are connected to each of the 4(m−1) local bit lines.

In a write operation, only the local bit line LBL connected to the selected memory cell is connected to the write global bit line WGBL. The local bit lines LBLs unconnected to the selected cell are isolated electrically from the write global bit line WGBL by the write selector WSEL. What can be seen from a single write global bit line WGBL is only a single local bit line including the selected memory cell or only four memory cells. All of the unselected memory cells which are in the same column as that of the selected memory cell and are connected to the different bit lines LBLs cannot be seen from the write global bit line WGBL. For example, in FIG. 51, it is assumed that the memory cell array 310 includes eight memory cell blocks BLKs per column. If the bit lines were not hierarchized and all of the local bit lines in the same column were connected to one another and then to a latch circuit, the number of memory cells visible from a local bit line would be four per memory cell block, and therefore, (4×8)=32 in total. However, in the fourth embodiment, only one of the eight memory cell blocks BLKs is connected to the global bit line. That is, the number of memory cells visible from the global bit line is only four, ⅛ of the number described above. Only the four memory cells MCs contribute to a parasitic capacitance in the write global bit line WGBL. The unselected memory cells which are in the same column as that of the selected memory cell and are connected to a different local bit line LBL do not contribute to the parasitic capacitance of the write global bit line. Thus, the parasitic capacitance in the write global bit line can be reduced remarkably.

The same holds true for a read operation. In a read operation, too, only the local bit line LBL connected to the selected memory cell is connected to the read global bit line RGBL. The local bit lines LBLs unconnected to the selected cell are isolated electrically from the read global bit line RGBL by the read selector RSEL. In addition, only one of the four local bit lines LBL0 to LBL3 in a single memory cell block BLK is actually connected to the read global bit line RGBL. Therefore, what can be seen from a single read global bit line RGGL is only four memory cells including the selected memory cell. Accordingly, the parasitic capacitance of the read global bit line can be reduced remarkably.

As described above, since the parasitic capacitance on each of the write global bit line and read global bit line can be reduced, the operating speed of the flash memory can be improved.

(10) The reading speed can be improved.

In the flash memory, relatively high voltages, including Vpp2 and VBB, have to be dealt with in a write operation. To meet this requirement, high-withstand-voltage MOS transistors with a thick gate insulating film (FHV transistors) have to be used. On the other hand, the voltage used in a read operation is lower than in a write operation. Thus, when only a read operation is considered, it is desirable that low-withstand-voltage MOS transistors (FLV transistors) with a thin gate insulating film should be used. From the viewpoint of operating speed, it is desirable to use low-withstand-voltage MOS transistors.

In this respect, with the configuration of the fourth embodiment, the local bit lines are connected to the write global bit line and read global bit line. Then, the memory cells are connected to the write circuit 350 via the write global bit line and to the sense amplifier 340 via the read global bit line. That is, the signal path in a write operation differs from the signal path in a read operation. Thus, in the signal path in a read operation, all of the circuits excluding the read selector RSEL connecting the read global bit line to the local bit lines can be formed of FLV transistors. As a result, the reading speed can be improved.

It is desirable that the p-well region 821 where the read selector RSEL is formed should be separated from the p-well region 602 where the memory cells are formed.

(11) The reliability of the write operation can be improved.

As explained in item (9), the bit lines are hierarchized. When attention is particularly paid to the write path, a plurality of local bit lines are connected to a single write global bit line. Then, in a write operation, only a single local bit line including the selected memory cell is connected electrically to the write global bit line, and the remaining local bit lines are isolated electrically from the write global bit line. Thus, the write circuit 350 does not apply a voltage corresponding to the writing data to the local bit lines unconnected to the selected memory. Therefore, the memory cells connected to the local bit lines are prevented from being written into erroneously, which helps improve the reliability of the write operation.

Next, a semiconductor integrated circuit device according to a fifth embodiment of the present invention will be explained. The fifth embodiment relates to a method of controlling the amount of data dealt with at a time in the system LSI explained in each of the first to fourth embodiments.

In the first embodiment, the explanation has been given about the case where the data stored in the 3Tr-NAND flash memory 200 are ID codes or security codes. The 3Tr-NAND flash memory, however, can further store parameters related to the input and output of data accessed from the outside of the LSI 1. This is shown in FIG. 53. FIG. 53 is a flowchart to help explain the flow of processing when the power supply for the LSI 1 is turned on.

First, the power supply for the LSI 1 is turned on (step S1). At this time, parameters related to a method of accessing the NAND flash memory 100 can be inputted to the LSI 1. The parameters include, for example, the length of a sector defined by the amount of data accessed in one address input, the number of blocks erased simultaneously when the NAND flash memory 100 is erased from, the latency from when a command is inputted until the first data has been read, the number of sectors read consecutively in a read operation, and a set of the timing of an input signal from the outside and the timing of an output signal to the outside. These parameters are inputted and set before the data is accessed. After the parameters are inputted (step S2), they are stored in the 3Tr-NAND flash memory 200 (step S3). Thereafter, according to the inputted parameters, the NAND flash memory 100 is accessed (step S4).

When the parameters have not been inputted from the outside, if the 3Tr-NAND flash memory 200 holds the parameters (step S5), the parameters are read from the 3Tr-NAND flash memory 200 (step S6). Then, according to the read-out parameters, the NAND flash memory 100 is accessed (step S7).

When the parameters are not inputted from the outside and the 3Tr-NAND flash memory 200 holds no parameter, the LSI 1 operates according to a default (step S8). The LSI 1 has default settings for the parameters. When the parameters have not been written in the 3Tr-NAND flash memory 200 (that is, the 3Tr-NAND flash memory is in the erased state), the LSI 1 operates on the basis of the default value.

In a case where the LSI 1 is connected only to external devices with the same settings, when the parameters have been set once, they are stored in the 3Tr-NAND flash memory 200. Therefore, they are held even when the power supply is turned off. When the power supply is turned on again, the operation may be carried out on the basis of the original settings. In addition, in a case where the LSI 1 is connected to the host with different settings, the setting of the interface, including the timing set and latency, the host may be done after setting according to the default values each time the power supply is turned on. The size of an erase block may be used as a parameter. For example, since a file size of image data or video data is large, an access unit may be conformed to an erase block unit.

The LSI according to the fifth embodiment produces the effect in item (12) in addition to the effects in items (1) to (11) explained in the first to fourth embodiments.

(12) The operation performance of the system LSI can be improved.

In the prior art, when sector data was written, since an access unit in a write operation was smaller than an erase block, it was necessary that the different data written in the same logical block address should be moved to another erased block and then the data should be written into the block. For this reason, it was made the effective writing speed slower. However, making the length of a sector equal to or an integral multiple of the length of an erase block prevents such dead time from occurring.

For example, if the number of blocks erased simultaneously is set to one, the size of an erase block is set to 128 kilobytes, and the data (the length of a sector) accessed with one address is set to 128 kilobytes, the data need not be moved inside. Therefore, the writing speed is improved. For example, in a case where rapid sequential shooting is done with a digital camera or where video data is recorded, as the picture quality increases, a great amount of data has to be recorded at higher speed. Thus, the writing speed of the NAND flash memory 100 serving as a recording medium has to be improved. When a single file stores a small amount of data equal to or less than 128 kilobytes, since there are many dead spaces in the 128-kilobyte block, the data storage efficiency is low. However, it is expected that the resolution of image data or video data will be improved and the data size of a single file will be on the order of megabytes. Therefore, one file deals with a plurality of blocks, which helps reduce dead spaces and therefore increase the efficiency. When applications are limited to a large file of data, such as image or video data, the setting is very effective. In addition, when one file size becomes still greater, an erase unit is set to two blocks and the length of a sector is also set accordingly (in this case, to 256 kilobytes). As described above, the setting of an erase unit is made changeable, which enables an erase unit to be set in the best state according to the user's use.

The setting of the erase block size in the fifth embodiment is not limited to a LSI embedded the NAND flash memory 100, 3Tr-NAND flash memory 200, and 2Tr flash memory 300. For example, as shown in FIG. 54, a product with a set of a semiconductor chip including the NAND flash memory 100 and another chip including a controller 900 capable of setting the size of an erase block produces a similar effect. In this case, the setting data is written into, for example, a part of the NAND flash memory 100 beforehand. Then, when the power supply is turned on, the setting data is read into the controller 900, which causes the number of blocks in data erase units in the NAND flash memory 100 to be set in a register 910 of the controller 900. Then, a host reads the value from the register 910, which enables the external host to recognize the number of blocks in erase units at present. According to the number, the host can access the data. Of course, the controller 900 and the NAND flash memory 100 may be formed on the same chip. In this case, the data bus between the NAND flash memory 100 and the controller 900 can be made larger and therefore its wiring capacitance decreases, which results in many advantages, including higher speed and less power consumption.

As described above, a semiconductor integrated circuit device according to each of the first to fifth embodiments includes the NAND flash memory, the 3Tr-NAND flash memory 200, and 2Tr flash memory. These memory cell arrays are formed in the same processes, which helps reduce the manufacturing cost of the system LSI.

In addition, the photolithographic condition has been set so that, of the three flash memories, the one with the largest capacity (in the above embodiments, the NAND flash memory) may be miniaturized most. The photolithographic condition is not optimum for the remaining flash memories. Taking this into account, margins for photolithography are left. Therefore, it is difficult to miniaturize the flash memories excluding the one with the largest capacity to the maximum. However, since each of the remaining flash memories has not a large capacity, they does not increase the chip size significantly. On the contrary, since the flash memory with the largest capacity is miniaturized to the maximum, the size of the LSI is decreased.

Furthermore, in the flash memory where the write inhibit voltage is applied from the bit line, since the effect of leakage current is small, the operating speed can be improved by making the channel width greater.

In addition, the LSI according to the each of the above embodiments uses the NAND flash memory for data storage. Moreover, the LSI stores the code data into the 3Tr-NAND flash memory 200 whose erase unit is smaller than that of the NAND flash memory. Furthermore, the LSI stores firmware into the 2Tr flash memory capable of operating at higher speed than the NAND flash memory and 3Tr-NAND flash memory 200. Sorting the data into the individual flash memories this way makes it possible to draw out the advantage of each flash memory to the maximum and improve the performance of the system LSI. The semiconductor memories for the LSI are provided for flash memories without using the other types of semiconductor memories, such as DRAM, which helps simplify the configuration of the LSI and reduce the manufacturing cost of the LSI.

A method of forming the floating gates and element isolating regions of flash memories may be as shown in FIGS. 55 to 60. First, as shown in FIG. 55, after an n-well region 601 and a p-well region 602 are formed in a silicon substrate 600, a gate insulating film 603 is formed on the silicon substrate 600. Then, an amorphous silicon layer 950 is formed on the gate insulating film 603. A mask material 951 is formed on the amorphous silicon layer 950.

Figure 56:
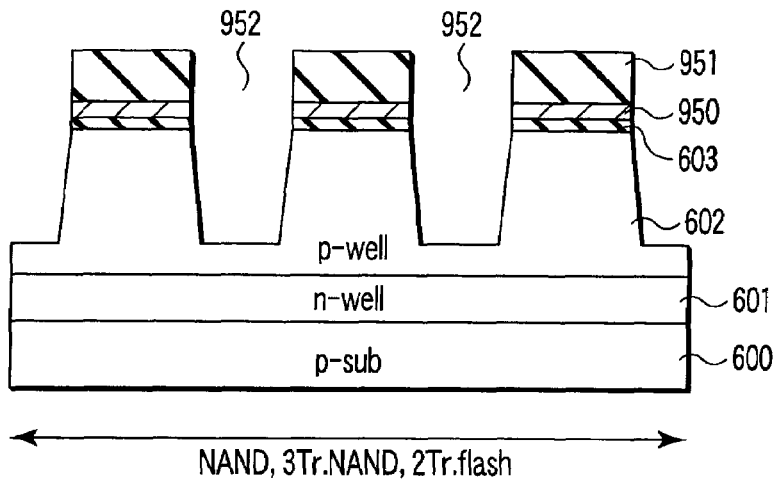

Next, as shown in FIG. 56, by photolithographic techniques and RIE techniques, the mask material 951, amorphous silicon layer 950, gate insulating film 603, and silicon substrate 600 are etched, thereby forming element isolating trenches 952.

Figure 57:
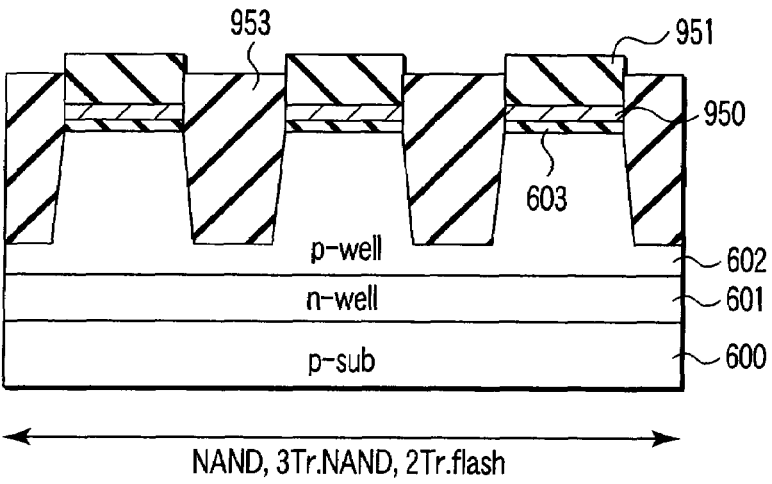

Next, as shown in FIG. 57, the trenches 952 are filled with a silicon oxide film 953. At this time, by wet etching or the like, the silicon oxide film 953 is left only in the trenches 952.

Figure 58:
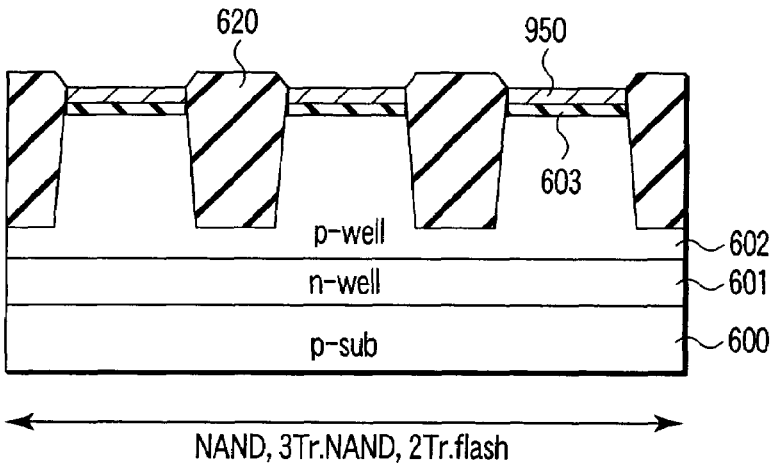

Next, as shown in FIG. 58, by wet etching or the like, the mask member 951 is removed. At this time, a part of the corners of the top face of the silicon oxide film 953 are etched. As a result, element isolating regions 620 are completed as shown in FIG. 58. Next, as shown in FIG. 59, an amorphous silicon layer 954 is formed on the amorphous silicon layer 950 and element isolating region 620.

Then, as shown in FIG. 60, the amorphous silicon layer 954 is patterned. As a result, a floating gate formed of the amorphous silicon layers 950, 954 is completed. Thereafter, the processes in FIG. 28 and later explained in the first embodiment are carried out.

In addition, as for the channel length and channel width of each of the NAND flash memory 100, 3Tr-NAND flash memory 200, and 2Tr flash memory 300 explained in the above embodiments, the values shown are illustrative and not restrictive. Concrete values are determined by the use of each of the flash memories and the performance (including the number of rewrites and the operating speed) required by the use. The values also vary with the generation. However, it is desirable that the relationship in value between the NAND flash memory tending to have a large capacity for data storage and the 2Tr flash memory giving importance to a high-speed operation should be as explained in the above embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
 a first memory cell array which includes memory cells arranged in a matrix, each memory cell including a first and a second select transistor and a plurality of first memory cell transistors which current paths are connected in series between the first and second select transistors, each of the first memory cell transistors having a first stacked gate including a first floating gate formed on a semiconductor substrate with a first gate insulating film interposed therebetween and a first control gate formed on the first floating gate with a first inter-gate insulating film interposed therebetween;
 a first row decoder which includes a first MOS transistor and which applies a positive voltage to the gate of the first memory cell transistor in a write operation and applies 0V to the gate of the first memory cell transistor in an erase operation;
 a second memory cell array which includes memory cells arranged in a matrix, each memory cell including a third select transistor and a second memory cell transistor which has a current path connected to a current path of the third transistor in series, each of the second memory cell transistors having a second stacked gate including a second floating gate formed on the semiconductor substrate with a second gate insulating film interposed therebetween and a second control gate formed on the second floating gate with a second inter-gate insulating film interposed therebetween; and
 a second row decoder which includes a second MOS transistor and which applies a positive voltage to the gate of the second memory cell transistor and a negative voltage to the gate of the third select transistor in the write operation and applies a negative voltage to the gate of the second memory cell transistor in the erase operation, each of the first and second MOS transistors having a gate insulating film of the same film thickness.

2. The semiconductor integrated circuit device according to claim 1, further comprising a third memory cell array which includes memory cells arranged in a matrix, each memory cell including a fourth and a fifth select transistor and a third memory cell transistor which has a current path connected between the fourth and fifth select transistors, and
 a third row decoder which includes a third MOS transistor and which applies a positive voltage to the gate of the third memory cell transistor in the write operation and applies 0V to the gate of the third memory cell transistor in the erase operation,
 wherein each of the third memory cell transistors has a third stacked gate including a third floating gate formed on the semiconductor substrate with a third gate insulating film interposed therebetween and a third control gate formed on the third floating gate with a third inter-gate insulating film interposed therebetween, and
 each of the first to third MOS transistors has a gate insulating film of the same film thickness.

3. The semiconductor integrated circuit device according to claim 1, wherein the gate length of the second MOS transistor is smaller than the gate length of the first MOS transistor.

4. The semiconductor integrated circuit device according to claim 2, wherein the gate length of the second MOS transistor is smaller than the gate length of at least one of the first and third MOS transistors.

5. The semiconductor integrated circuit device according to claim 2, wherein the channel width of the second memory cell transistor is greater than the channel width of the first memory cell transistor.

6. The semiconductor integrated circuit device according to claim 2, wherein the channel width of the second select transistor is greater than the channel width of the first select transistor.

7. The semiconductor integrated circuit device according to claim 2, further comprising a fourth row decoder which includes a fourth MOS transistor and which applies a positive voltage to the gate of the third select transistor in a read operation,
 wherein the gate of the third select transistor is connected to the third row decoder and isolated electrically from the fourth row decoder in a write operation, and
 the gate of the third select transistor is connected to the fourth row decoder and
 isolated electrically from the third row decoder in a read operation, and
 the fourth MOS transistor has a thinner gate insulating film than that of the third MOS transistor.

8. The semiconductor integrated circuit device according to claim 2, further comprising a microcontroller unit which is formed on the semiconductor substrate and which reads data directly from the second memory cell array.

9. The semiconductor integrated circuit device according to claim 8, wherein the first memory cell array holds at least either image data or video data, and
 the second memory cell array holds a program including an instruction to operate the microcontroller unit.

10. A semiconductor integrated circuit device comprising:
 a first memory cell array which includes memory cells, the memory cells including a first and a second select transistor and a plurality of first memory cell transistors which current paths are connected in series between the first and second select transistors, the first memory cell transistors having a first stacked gate including a first floating gate formed on a semiconductor substrate with a first gate insulating film interposed therebetween and a first control gate formed on the first floating gate with a first inter-gate insulating film interposed therebetween;
 a first row decoder which includes a first MOS transistor and which is capable of applying a positive voltage to the gate of the first memory cell transistor;
 a second memory cell array which includes memory cells, the memory cells including a third select transistor and a second memory cell transistor which has a current path connected to a current path of the third select transistor in series, each of the second memory cell transistors having a second stacked gate including a second floating gate formed on the semiconductor substrate with a second gate insulating film interposed therebetween and a second control gate formed on the second floating gate with a second inter-gate insulating film interposed therebetween; and a second row decoder which includes a second MOS transistor and which is capable of applying a positive voltage to the gate of the second memory cell transistor, the first and the second MOS transistors having a gate insulating film of the same film thickness, wherein the gate length of the second MOS transistor is smaller than the gate length of the first MOS transistor.

11. The semiconductor integrated circuit device according to claim 10, further comprising a third memory cell array which includes memory cells, the memory cells including a fourth and a fifth select transistor and a third memory cell transistor which has a current path connected between the fourth and fifth select transistors, and a third row decoder which includes a third MOS transistor and which is capable of applying a positive voltage to the gate of the third memory cell transistor, wherein the third memory cell transistors have a third stacked gate including a third floating gate formed on the semiconductor substrate with a third gate insulating film interposed therebetween and a third control gate formed on the third floating gate with a third inter-gate insulating film interposed therebetween, and the first to the third MOS transistors have a gate insulating film of the same film thickness.

12. The semiconductor integrated circuit device according to claim 11, wherein the gate length of the second MOS transistor is smaller than the gate length of the third MOS transistor.

13. The semiconductor integrated circuit device according to claim 11, wherein the channel width of the second memory cell transistor is greater than the channel width of the first memory cell transistor.

14. The semiconductor integrated circuit device according to claim 11, wherein the channel width of the second select transistor is greater than the channel width of the first select transistor.

15. The semiconductor integrated circuit device according to claim 11, further comprising a fourth row decoder which includes a fourth MOS transistor and which is capable of applying a positive voltage to the gate of the third select transistor, wherein the gate of the third select transistor is connected to the third row decoder and isolated electrically from the fourth row decoder in a write operation, and the gate of the third select transistor is connected to the fourth row decoder and isolated electrically from the third row decoder in a read operation, and the fourth MOS transistor has a thinner gate insulating film than that of the third MOS transistor.

16. The semiconductor integrated circuit device according to claim 11, further comprising a microcontroller unit which is formed on the semiconductor substrate and which reads data directly from the second memory cell array.

17. The semiconductor integrated circuit device according to claim 16, wherein the first memory cell array holds at least either image data or video data, and the second memory cell array holds a program including an instruction to operate the microcontroller unit.

* * * * *